(12) United States Patent
Wang et al.

(10) Patent No.: US 9,978,939 B2
(45) Date of Patent: May 22, 2018

(54) RESISTIVE RANDOM-ACCESS MEMORY WITH IMPLANTED AND RADIATED CHANNELS

(71) Applicants: Shih-Yuan Wang, Palo Alto, CA (US); Shih-Ping Wang, Pala Alto, CA (US)

(72) Inventors: Shih-Yuan Wang, Palo Alto, CA (US); Shih-Ping Wang, Pala Alto, CA (US)

( * ) Notice: Subject to any disclaimer, the term of this patent is extended or adjusted under 35 U.S.C. 154(b) by 91 days.

(21) Appl. No.: 15/446,626

(22) Filed: Mar. 1, 2017

(65) Prior Publication Data
US 2017/0244028 A1    Aug. 24, 2017

Related U.S. Application Data

(60) Continuation-in-part of application No. PCT/US2014/039990, filed on May 29, 2014, which is a division of application No. 14/829,327, filed on Aug. 18, 2015, now Pat. No. 9,515,262, and a division of application No. 15/010,450, filed on Jan. 29, 2016, now Pat. No. 9,647,036.

(60) Provisional application No. 61/828,667, filed on May 29, 2013, provisional application No. 61/859,764, filed on Jul. 29, 2013.

(51) Int. Cl.
   *H01L 45/00* (2006.01)
   *H01L 27/24* (2006.01)

(52) U.S. Cl.
   CPC .......... *H01L 45/08* (2013.01); *H01L 27/2481* (2013.01); *H01L 45/1233* (2013.01)

(58) Field of Classification Search
   CPC .. H01L 45/1641; H01L 45/165; H01L 45/145
   See application file for complete search history.

(56) References Cited

U.S. PATENT DOCUMENTS

| | | | |
|---|---|---|---|
| 8,052,918 B2 | 11/2011 | Magario et al. |
| 8,062,918 B2 | 11/2011 | Miller et al. |
| 8,420,478 B2 | 4/2013 | Chiang et al. |
| 8,465,996 B2 | 6/2013 | Miller et al. |
| 8,525,247 B2 | 9/2013 | Park et al. |
| 8,809,159 B2 | 8/2014 | Wang et al. |
| 8,872,151 B2 | 10/2014 | Miller et al. |
| 2004/0160812 A1 | 8/2004 | Rinerson et al. |
| 2006/0050598 A1 | 3/2006 | Rinerson et al. |
| 2008/0106925 A1 | 5/2008 | Paz De Araujo et al. |
| 2008/0185572 A1 | 8/2008 | Chiang et al. |
| 2008/0296550 A1 | 12/2008 | Lee et al. |
| 2009/0225582 A1 | 9/2009 | Schloss |
| 2009/0272961 A1 | 11/2009 | Miller et al. |

(Continued)

OTHER PUBLICATIONS

Raghavan et al., "Variability model for forming process in oxygen vacancy modulated high-j based resistive switching memory devices," Microelectronics Reliability 54 (2014) 2266-2271.

(Continued)

*Primary Examiner* — Allison P Bernstein
(74) *Attorney, Agent, or Firm* — Cooper & Dunham LLP

(57) ABSTRACT

Resistive RAM (RRAM) devices having increased uniformity and related manufacturing methods are described. Greater uniformity of performance across an entire chip that includes larger numbers of RRAM cells can be achieved by uniformly creating enhanced channels in the switching layers through the use of radiation damage. The radiation, according to various described embodiments, can be in the form of ions, electromagnetic photons, neutral particles, electrons, and ultrasound.

22 Claims, 72 Drawing Sheets

(56) References Cited

U.S. PATENT DOCUMENTS

| | | |
|---|---|---|
| 2010/0243983 A1 | 9/2010 | Chiang et al. |
| 2011/0193044 A1 | 8/2011 | Sandhu et al. |
| 2012/0032132 A1 | 2/2012 | Lee et al. |
| 2012/0037879 A1 | 2/2012 | Schloss et al. |
| 2012/0176831 A1 | 7/2012 | Xiao et al. |
| 2012/0252194 A1 | 10/2012 | Ninomiya et al. |
| 2012/0261638 A1 | 10/2012 | Sills et al. |
| 2012/0295398 A1 | 11/2012 | Kurunczi et al. |
| 2013/0292632 A1 | 11/2013 | Phatak et al. |
| 2015/0090948 A1 | 4/2015 | Son |
| 2015/0357566 A1 | 12/2015 | Wang |

OTHER PUBLICATIONS

Sangheon Lee et al, "A Two-Step Set Operation for Highly Uniform Resistive Switching ReRAM by Controllable Filament," ESSDERC 2013 in Romania, Sep. 18, 2013.

Nature Nanotechnology, vol. 8, Jan. 2013 www.nature.com/naturenanotechnology, Memristive devices for computing.

"Progress on RRAM as a Future Non Volatile Memory" (NVM), P.D. Kirsh, Oct. 28, 2011, Sematech.

Chen et al., "Understanding of the Endurance Failure in Scaled HfO2-based 1T1R RRAM through Vacancy Mobility Degradation" IEDM12-482, 2012.

J. S. Williams, Materials Science and Engineering A253 (Aug. 15, 1998)) Ion Implantation of Semiconductors.

Kinoshita et al., Japanese Journal of Applied Physics 50 (2011) 01BE01, Structural and Magnetic Properties of Fe and Au Ion-Implanted $Al_2O_3$ Single Crystals.

MRS Bulletin • vol. 39 • Aug. 2014 • www.mrs.org/bulletin, Phase change materials and phase change memory.

Back et al., Realization of Vertical Resistive Memory (VRRAM) using cost effective 3D Process, IEDM11-737 (2011).

Syu et al. "Redox Reaction Switching Mechanism in RRAM Device With Pt/CoSiOTiN Structure," IEEE Electron Device Letters, vol. 32, No. 4, Apr. 2011 (hereinafter "Syu 2011").

Park et al., A Non-Linear ReRAM Cell with sub-1µA Ultralow Operating Current for High Density Vertical Resistive Memory (VRRAM), IEDM12-501, (2012).

R.G. Elliman et al, "Application of Ion-Implantation for Improved Non-Volatile Resistive Random Access Memory (ReRAM)," Nuclear Instruments and Methods in Physics Research, 98-101, 2013.

Sungjun Kim et al, "Dopant Concentration Dependent Resistive Switching Characteristics in $Cu/Sin_\chi/Si$ Structure," Journal of Alloys and Compounds, vol. 686, pp. 479-483, 2016.

Blanka Magyari-Köpe et al, "Doping Technology for RRAM—Opportunities and Challenges," Department of Electrical Engineering, Stanford University.

Hee-Dong Kim et al, "Forming-Free Resistive Switching Characteristics and Improved Reliability in Sub-Stoichiometric $Nbn_\chi$ Films," Phys. Status Solidi RRL 9, No. 4, 264-268, 2015.

Qi Liu et al, "Improvement of Resistive Switching Properties in Zro2-Based Reram With Implanted Ti Ions" Ieee Electron Device Letters, vol. 30, No. 12, 2009.

M. He et al, "Metal—Dielectric Diffusion Processes: Fundamentals," Metal-Dielectric Interfaces in Gigascale Electronics, Springer Series in Materials Science, 157.

H.-S. Philip Wong et al, "Metal—Oxide RRAM," Proceedings of The IEEEV, vol. 100, No. 6, 2012.

James A. Dawson et al, "Nature of Cu Interstitials in Al2O3 and the Implications for Filament Formation in Conductive Bridge Random Access Memory Devices," J. Phys. Chem. C, Just Accepted Manuscript, Publication Date (Web) Jun. 2016.

R. Gunawan et al, "Optimal Control of Rapid Thermal Annealing in a Semiconductor Process," Journal of Process Control 14, 423-430, 2004.

Ligang Gao et al, The Effect of Ti and O Implantation on the Resistive Switching in $PT/TiO_{2-x}/Pt$ Devices, Appl. Phys. A, 120: 1599-1603, 2015.

John Paul Strachan et al, "The Switching Location of a Bipolar Memristor: Chemical, Thermal and Structural Mapping," Nanotechnology 22, 254015 (6pp), 2011.

J. B. Lasky, "Wafer Bonding for Silicon-On-Insulator Technologies," Applied Physics Letters 48, 78, 1986.

International Search Report dated Dec. 23, 2014 in PCT/US2014/039990.

International Search Report dated Jan. 11, 2016 in PCT/US2015/045731.

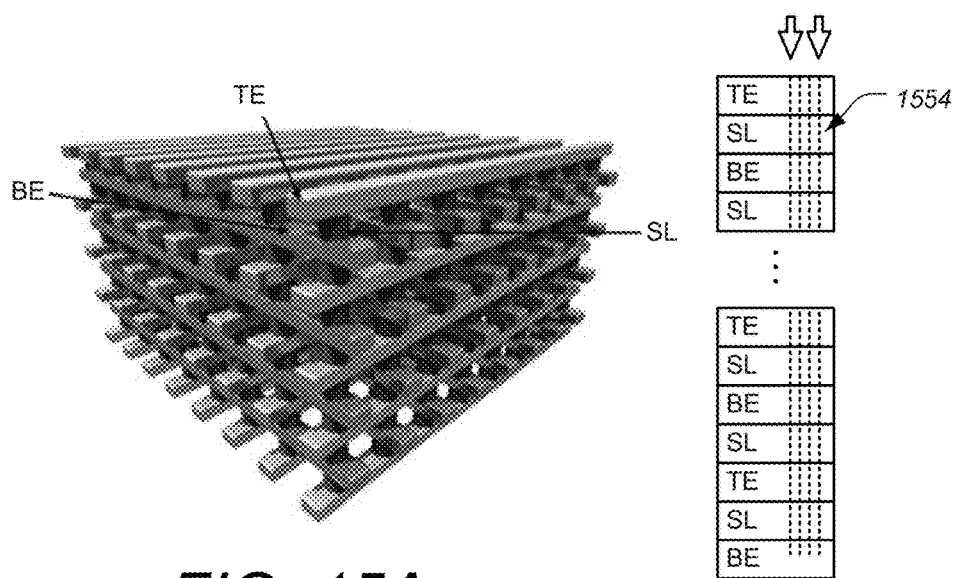
FIG. 15A
FIG. 15B
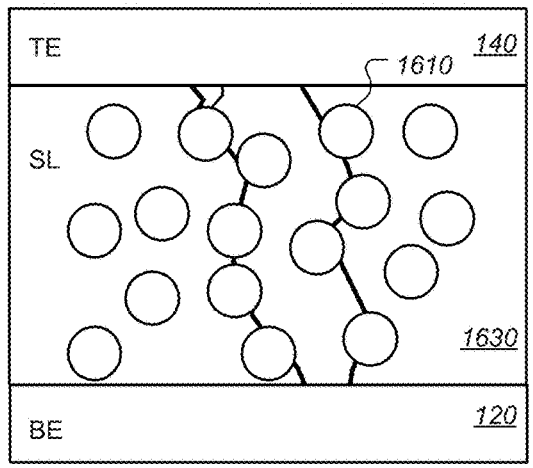
FIG. 16

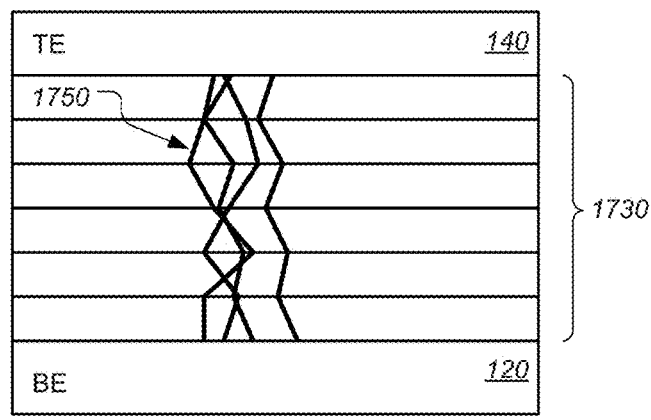
FIG. 17
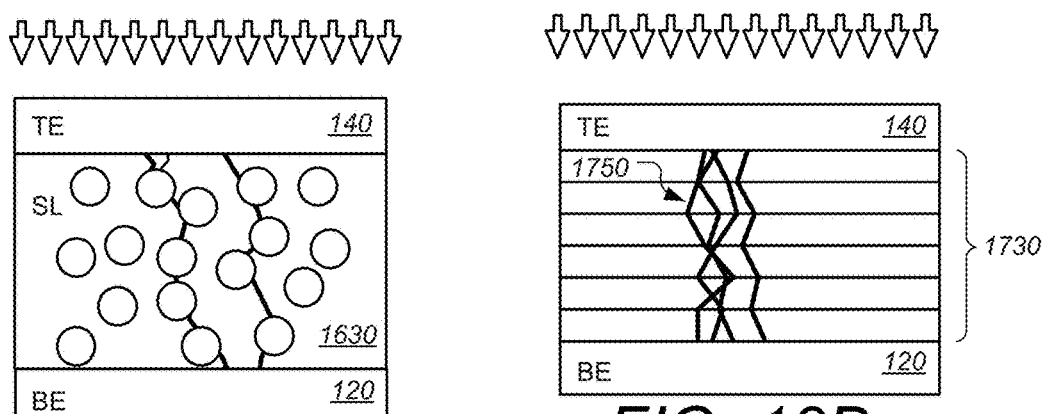
FIG. 18A
FIG. 18B

| TE | 2240 |
|---|---|
| TM 2 | 2202 |
| TM 1 | 2200 |
| BE | 2220 |
| Substrate | 110 |

| TE | 2240 |
|---|---|
| TMO 2 | 2232 |
| TMO 1 | 2230 |
| BE | 2220 |
| Substrate | 110 |

| TE |  |
|---|---|
| Si | 2304 |
| TM 2 | 2302 |
| TM 1 | 2300 |
| BE |  |
| Substrate |  |

2350

| TE |  |
|---|---|
| SiOx | 2334 |
| TMO 2 | 2332 |
| TMO 1 | 2330 |
| BE |  |
| Substrate |  |

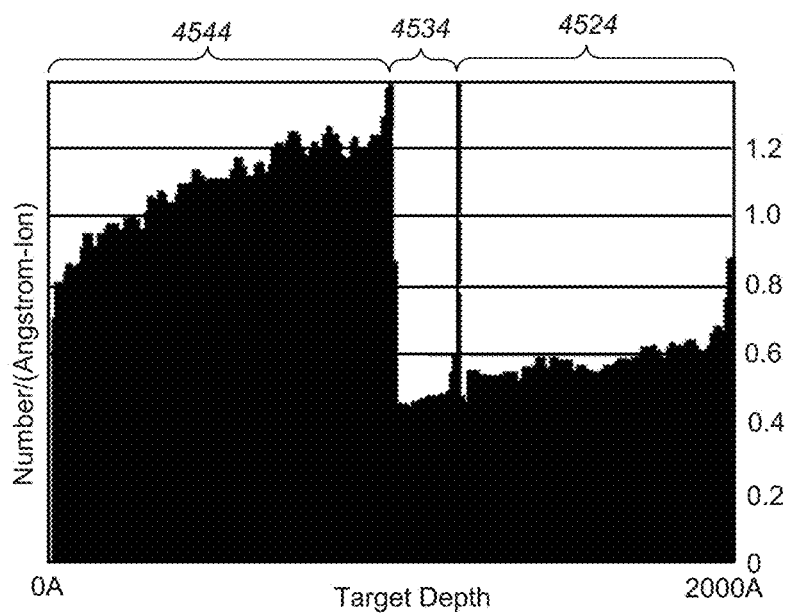
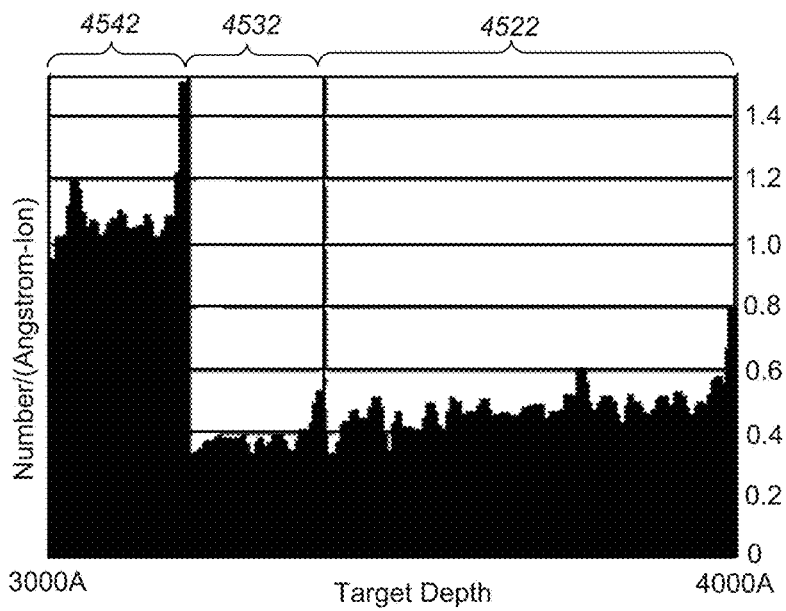

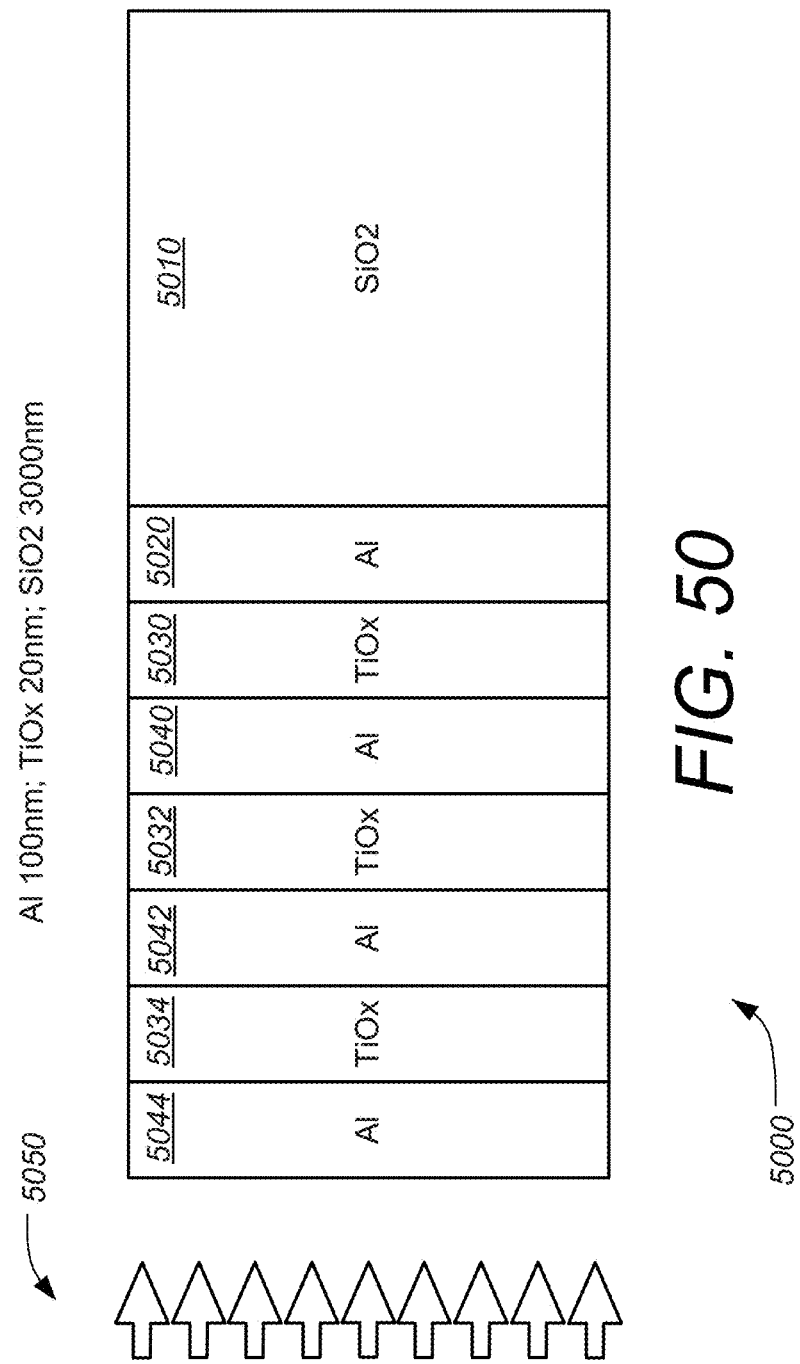

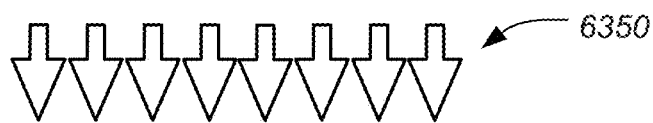

RESISTIVE RANDOM-ACCESS MEMORY WITH IMPLANTED AND RADIATED CHANNELS

CROSS-REFERENCE TO RELATED APPLICATIONS

This patent application is a divisional of parent application Ser. No. 15/010,450, filed Jan. 29, 2016, now U.S. Pat. No. 9,647,036 issued on May 9, 2017, which is a divisional of Ser. No. 14/829,327 filed Aug. 18, 2015, now U.S. Pat. No. 9,515,262 issued on Dec. 6, 2016, which is a continuation-in-part of International Patent Application Ser. No. PCT/US14/039990 filed May 29, 2014 and claims priority of and incorporates by reference each of the following provisional patent applications:

U.S. Prov. Ser. No. 62/100,028 filed Jan. 5, 2015;
U.S. Prov. Ser. No. 62/112,159 filed Feb. 4, 2015;
U.S. Prov. Ser. No. 62/132,507 filed Mar. 13, 2015;
U.S. Prov. Ser. No. 62/137,282 filed Mar. 24, 2015;
U.S. Prov. Ser. No. 62/144,328 filed Apr. 7, 2015;
U.S. Prov. Ser. No. 62/145,450 filed Apr. 9, 2015;
U.S. Prov. Ser. No. 62/151,394 filed Apr. 22, 2015;
U.S. Prov. Ser. No. 62/171,209 filed Jun. 4, 2015; and
U.S. Prov. Ser. No. 62/172,110 filed Jun. 7, 2015.

Additionally, this patent application is related to and incorporates by reference each of the following applications:

U.S. Prov. Ser. No. 61/828,667 filed May 29, 2013; and
U.S. Prov. Ser. No. 61/859,764 filed Jul. 29, 2013.

FIELD

The present invention generally relates mainly to resistive random-access memory devices. More particularly, some embodiments relate to resistive random-access memory formed with pathway structures such as implanted and/or radiated channels for enhancing mobility of charged species, without the need for a forming voltage.

BACKGROUND

In the manufacture of a resistive random-access memory (RRAM, ReRAM or memristor) device a switching layer, typically a transition metal oxide is positioned between a top electrode and bottom electrode. The bulk switching layer is initially non-conducting. However, by applying a sufficiently large voltage (a "forming voltage") across the top and bottom electrodes, haphazard conduction path(s) can be formed within the bulk switching layer. The forming voltage which generally depends on material quality and thickness of the switching layer(s) can equal the breakdown voltage and can range from a few volts to tens of volts. Once the conduction paths are formed, they may be reset (broken, resulting in high resistance) or set (re-formed, resulting in lower resistance) by an appropriately applied voltage (the "switching voltage"). The forming process and the haphazard nature of the path for the charged species to migrate under an applied electric field are not desirable features for large-scale memory/computing arrays for system applications.

Since the path taken by the charged ions/vacancies/electrons under an applied electric field tends to be haphazard, significant variations are often observed in current and voltage characteristics of the RRAM. Such variations include both variations in switching voltage and variations in the resistivity of the states (high resistance state (HRS) and low resistance state (LRS). Further, the variations are often exhibited both in repeatability of the same RRAM device as well as between different RRAM devices within the same chip. The variations are highly undesirable from a system point of view, as an algorithm and possibly equipment need to be developed to interrogate each memory to determine its operating point dynamically for a single memory element. Factoring in several billion to a few trillion memory elements, these variations can substantially slow down the performance of the entire data storage and retrieval process.

The subject matter claimed herein is not limited to embodiments that solve any specific disadvantages or that operate only in environments such as those described above. Rather, this background is only provided to illustrate one exemplary technology area where some embodiments described herein may be practiced.

SUMMARY

According to some embodiments,

Some of the disclosed embodiments comprise a resistive random-access memory device that has a first electrode, a second electrode, and a switching region that is between the first and second electrodes and comprises one or more enhanced mobility pathway structures that extend at respective locations in the switching region and are configured to provide enhanced mobility of charged species and have respective electrical resistances that vary with a switching voltage applied between the first and second electrodes, wherein said enhanced mobility pathway structures comprise damage in the switching region caused by ion implantation that includes ions deposited outside the switching region after passing therethrough.

In some embodiments, the enhanced mobility pathway structures are formed by the ion implantation rather than an application of a voltage across to the switching region equal to or greater than a breakdown voltage.

In some embodiments, the resistive memory device includes a substrate, wherein the first electrode is a bottom electrode disposed above the substrate and below the switching region and the second electrode is a top electrode disposed above the switching region.

In some embodiments, the majority of ions used in the ion implantation are deposited below the switching region.

In some embodiments, a majority of ions used in the ion implantation are deposited below the bottom electrode.

In some embodiments, at least some of the damage in the switching region is due to collision events caused by the ion implantation, and the majority of the collision events occur below the switching region.

In some embodiments, a predominant peak in a distribution profile of ions used in the implantation are implanted in said ion implantation is below the switching region.

In some embodiments, the ion implantation causes substantial collision events throughout a thickness of the switching region.

In some embodiments, the resistive memory device includes a barrier layer between the switching layer and the first electrode, which barrier layer is functionally disrupted by the ion implantation.

In some embodiments, the resistive memory device includes a barrier layer between the switching region and the second electrode, which barrier layer is functionally disrupted by the ion implantation.

In some embodiments, the ion implantation is through the first and second electrodes.

In some embodiments, the second electrode is above the switching region and comprises a first portion through which said ion implantation takes place and a thickening portion formed subsequently.

In some embodiments, the resistive memory device includes an underlying substrate having a primary planar upper surface, wherein a first planar interface between the first electrode and the switching region and a second planar interface between the switching region and the second electrode are non-parallel with the primary planar upper surface of the underlying substrate.

In some embodiments, the first and second planar interfaces are approximately normal to the primary planar upper surface of the underlying substrate.

In some embodiments, in the ion implantation the ions are implanted primarily in a direction that is normal to the primary planar upper surface of the underlying substrate.

In some embodiments, the resistive memory device comprises defects in the switching region caused by the ion implantation, which defects are approximately uniformly distributed across a plane normal to the first and second planar interfaces.

In some embodiments, the ion implantation is primarily in a direction that is at an acute angle to the primary planar upper surface of the underlying substrate.

In some embodiments, the resistive memory device includes at least one of (i) a barrier layer formed between the switching region and the first electrode and functionally disrupted by said ion implantation and (ii) a barrier layer formed between the switching region and the second electrode and functionally disrupted by said ion implantation.

In some embodiments, the switching region is formed of a transition metal oxide material.

In some embodiments, the implanted ions are selected from a group consisting of: Ag, Ti, Ta, Hf, O, N, Au, Fe, Ni, Ti, Ta, V, Pb, Bi, W, H, Ar, C, Si, B, P, Ga, As, Te, Al, Zn, In, and Sn.

In some embodiments, the switching region is formed in situ by said ion implantation.

In some embodiments, the implantation includes implanting oxygen ions into the switching region, wherein the switching region is initially formed of one or more transition metal materials.

In some embodiments, the switching region has a built-in stress and the ion implantation increases the stress in the switching region and facilitates creation of said enhanced mobility pathway structures.

In some embodiments, the switching region comprises at least one of large atomic mass atoms and mismatched material layers causing said built-in stress.

In some embodiments, the enhanced mobility pathway structures in the switching region are formed at least in part by collision events in said ion implantation, which collision events are distributed substantially uniformly throughout the switching region.

Some embodiments include a method of fabricating a resistive random-access memory device comprising forming a first electrode, forming a switching layer, forming a second electrode such that the switching layer is between the first and second electrodes, and carrying out ion implantation in which a portion of the ions both enter and exit the switching layer and thereby facilitate forming one or more enhanced mobility pathways structures that provide enhanced mobility of charged species such that resistance between said first and second electrodes through the switching layer can be increased and decreased by applying a switching voltage between the first and second electrodes.

In some embodiments of the method, the forming of one or more enhanced mobility pathway structures is due to the ion implantation rather than an application of a voltage to the switching layer equal to or greater than a breakdown voltage for the switching layer.

In some embodiments of the method, the first electrode is a bottom electrode that is above a substrate and below the switching layer and said second electrode is a top electrode that is above the switching layer.

In some embodiments of the method, a majority of the ions entering the switching layer in the ion implantation exit the switching layer.

In some embodiments of the method, the ion implantation causes collision events and the majority of the collision events occurs in locations below the switching layer.

In some embodiments of the method, the ion implantation functionally disrupts at least one of a barrier layer formed between the switching layer and the first electrode and a barrier layer formed between the switching layer and the second electrode.

In some embodiments of the method, a first planar interface between the first electrode and the switching layer and a second planar interface between the switching layer and the second electrode are approximately normal with a primary planar upper surface of an underlying substrate.

In some embodiments of the method, the implanting of ions is primarily in a direction that is normal to the primary planar upper surface of the underlying substrate.

In some embodiments of the method, the implanting of ions functionally disrupts at least one of a barrier layer formed between the switching layer and the first electrode and a barrier layer formed between the switching layer and the second electrode.

Some embodiments pertain to a resistive random-access memory device comprising a first electrode, a second electrode, and a switching region that is between the first and second electrodes and comprises one or more enhanced mobility pathway structures that extend at respective locations in the switching region and are configured to provide enhanced mobility of charged species and have respective electrical resistances that vary with a switching voltage applied between the first and second electrodes across the one or more pathway structures, wherein said enhanced mobility pathway structures comprise substantially uniform damage in the switching region caused by electromagnetic irradiation directed into the switching region.

In some embodiments of the aforementioned device, the electromagnetic irradiation includes radiation of a type selected from a group consisting of: x-rays, gamma rays, UV light, visible light, and IR light.

In some embodiments of the aforementioned device, the electromagnetic irradiation includes Gamma or X-rays having energy ranging from about 3 KeV to about 100 KeV.

In some embodiments of the aforementioned device, the electromagnetic irradiation includes X-rays having energy ranging from about 20 KeV to about 30 KeV.

In some embodiments of the aforementioned device, the electromagnetic irradiation includes X-rays having energy ranging from about 25 KeV to about 27 KeV.

In some embodiments of the aforementioned device, the damage is caused in situ by the irradiation after passage thereof through at least one of the first and second electrodes and the switching layer.

In some embodiments of the aforementioned device, the device further comprises a plurality of switching layers and electrodes formed in a stack above said second electrode prior to the electromagnetic irradiation.

In some embodiments of the aforementioned device, the damage is formed in at least three switching layers electromagnetically irradiated simultaneously.

In some embodiments of the aforementioned device, the device further comprises a radiation barrier layer formed below the first electrode, which radiation barrier layer is configured to protect regions below said barrier layer from exposure to the electromagnetic irradiation.

In some embodiments of the aforementioned device, the radiation barrier layer is made of a material selected from a group consisting of W, Ta, Bi, Au and Pb.

In some embodiments of the aforementioned device, the device includes at least one of (i) a barrier layer formed between the switching region and the first electrode and functionally disrupted by said electromagnetic irradiation and (ii) a barrier layer formed between the switching region and the second electrode and functionally disrupted by said electromagnetic irradiation.

In some embodiments of the aforementioned device, the device includes an underlying substrate having a primary planar surface, wherein a first planar interface between the first electrode and switching region and a second planar interface between the switching region and the second electrode are approximately normal to the primary planar upper surface of the underlying substrate.

Some embodiments pertain to a method of fabricating a resistive random-access memory device comprising forming a first electrode, forming a switching region, forming a second electrode such that the switching region is positioned between the first and second electrodes, and damaging the switching region by directing energy into the switching region thereby facilitating forming one or more enhanced mobility pathways structures that provide enhanced mobility of charged species such that resistance between said first and second electrodes through the switching layer can be increased and decreased by applying a switching voltage between the first and second electrodes.

In some embodiments of the aforementioned method, the damaging causes collision events and the majority of the collision events occurs in locations other than the switching region.

In some embodiments of the aforementioned device, the directed energy is in the form of one or more of ions, electrons, X-rays, gamma rays, light including UV and IR light, and ultrasound.

In some embodiments of the aforementioned device, the directed energy passes through at least a portion of the first and a portion of the second electrodes.

In some embodiments of the aforementioned device, the directed energy functionally disrupts at least one of a barrier layer formed between the switching region and the first electrode and a barrier layer formed between the switching region and the second electrode.

Some embodiments pertain to a resistive random-access memory device comprising a first electrode, a second electrode, and a switching region that is between the first and second electrodes and comprises a multiplicity of enhanced mobility pathway structures that extend at respective locations in the switching region and are configured to provide enhanced mobility of charged species and have respective electrical resistances that vary with a switching voltage applied between the first and second electrodes across the pathway structures, wherein said enhanced mobility pathway structures comprise damage in the switching region caused by directed energy beamed into, passing through, and extending beyond the switching region.

In some embodiments of the aforementioned device, the enhanced mobility pathway structures comprise damage in the switching region caused by directed energy in the form of one or more of ions, electrons, X-rays, gamma rays, light including UV and IR light, and ultrasound.

In some embodiments of the aforementioned device, the enhanced mobility pathway structures comprise damage in the switching region caused by ion implantation into the switching region.

In some embodiments of the aforementioned device, the enhanced mobility pathway structures comprise damage in the switching region caused by directed energy in the form of at least one of X-rays, gamma rays, and electrons.

In some embodiments of the aforementioned device, the enhanced mobility pathway structures comprise damage in the switching region caused by directed energy in the form of radiation having wavelengths longer than of X-rays.

Some embodiments pertain to a resistive random-access memory device comprising a first electrode, a second electrode, and a switching region that is between the first and second electrodes and comprises one or more enhanced mobility pathway structures that extend at respective locations in the switching region and are configured to provide enhanced mobility of charged species and have respective electrical resistances that vary with a switching voltage applied between the first and second electrodes across the one or more pathway structures, wherein the enhanced mobility pathway structures comprise substantially uniform damage in the switching region caused by electromagnetic irradiation having energy ranging from about 3 KeV to about 100 KeV directed into the switching region.

Some embodiments pertain to a resistive random-access memory device comprising, a stack of first electrodes, a stack of second electrodes, and a stack of switching regions each of which is between a respective pair of one of the first electrodes and one of the second electrodes, wherein each of the switching regions comprises one or more enhanced mobility pathway structures configured to provide enhanced mobility of charged species and having respective electrical resistances that vary with a switching voltage applied across the pathway structures, and wherein said enhanced mobility pathway structures comprise damage in the switching regions caused by directed energy concurrently beamed into and through the switching regions in the stack thereof.

In some embodiments of the aforementioned device, the damage to the switching regions in the stack caused by the directed energy is caused by directed energy in the form of ion implantation.

In some embodiments of the aforementioned device, the damage to the switching regions in the stack caused by the directed energy is caused by directed energy in the form of radiation in the energy range of 1-100 KeV.

In some embodiments of the aforementioned device, the stack of switching region comprises 2-20 switching regions.

Some embodiments of the aforementioned device include an array of laterally spaced stacks each comprising first and second electrodes and switching regions, wherein the laterally spaced stacks are interconnected by electrical lines and form an integrated memory structure.

BRIEF DESCRIPTION OF THE DRAWINGS

To further clarify the above and other advantages and features of the subject matter of this patent specification, specific examples of embodiments thereof are illustrated in the appended drawings. It should be appreciated that these drawings depict only illustrative embodiments and are therefore not to be considered limiting of the scope of this patent specification or the appended claims. The drawings illustrating devices are not to scale and show in straight lines surfaces and interfaces that in actual devices would not be as linear or planar. The subject matter hereof will be described and explained with additional specificity and detail through the use of the accompanying drawings in which:

FIGS. 15A and 15B are diagrams showing ion implanting with greater numbers of stacked devices, according to some embodiments;

FIG. 16 is a diagram illustrating a switching layer incorporated with large atomic mass atoms that create material stress, according to some embodiments;

FIG. 17 is a diagram illustrating stress defects caused by mismatched material layers, according to some embodiments;

FIGS. 18A and 18B are diagrams illustrating subjecting switching layers that have built-in stress to ion implantation and/or radiation, according to some embodiments;

FIGS. 48A-48C are expanded plots illustrating simulation results of Ar ions implanted into a structure as shown in FIG. 45 at 1600 KeV, according to some embodiments;

FIG. 50 is a diagram showing a structure of multi-layer of RRAM devices according to some embodiments;

FIGS. 63A-63D are diagrams showing a simplified sequence of processes for manufacturing a portion of RRAM devices, according to some embodiments;

DETAILED DESCRIPTION

Figure 1:
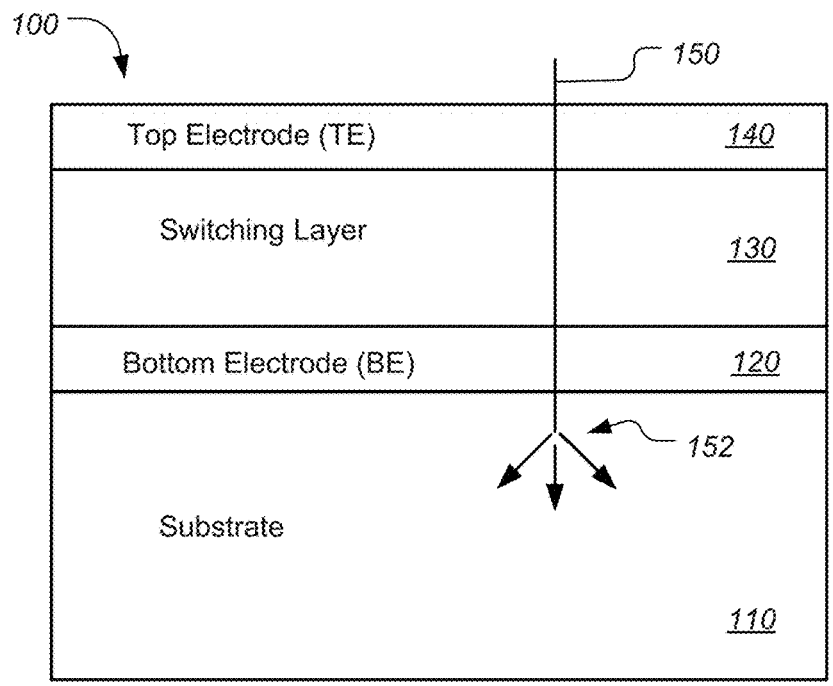
FIG. 1 is a cross section diagram showing basic parts of a resistive random access memory RRAM device, according to some embodiments.

A detailed description of examples of preferred embodiments is provided below. While several embodiments are described, it should be understood that the new subject matter described in this patent specification is not limited to any one embodiment or combination of embodiments described herein, but instead encompasses numerous alternatives, modifications, and equivalents. In addition, while numerous specific details are set forth in the following description in order to provide a thorough understanding, some embodiments can be practiced without some or all of these details. Moreover, for the purpose of clarity, certain technical material that is known in the related art has not been described in detail in order to avoid unnecessarily obscuring the new subject matter described herein. It should be clear that individual features of one or several of the specific embodiments described herein can be used in combination with features or other described embodiments. Further, like reference numbers and designations in the various drawings indicate like elements.

According to some embodiments, enhanced ion/vacancy mobility channels are provided for the resistive random access memory, memristor, and phase change memory (electron and hole paths) for a more definitive conduction path rather than more random conductive paths resulting from applied forming voltages.

According to some embodiments, a path or paths are provided for the formation of filaments and/or ionic movements and hopping of the defects and ions. According to some embodiments, ions are accelerated and implanted into the switching layer and through the switching layer.

Examples of known memrestive devices are discussed in: US2008/0090337A1 (top and bottom electrode sandwiching a multiple layered switching layer and a crossbar array memory architecture); US2004/0160812A1 (two terminal resistive memory device); US2008/0185572A1 (memristive or resistive random access memory (RRAM) two terminal device and a crossbar architecture); and US2008/0296550A1 (multilevel stacked crossbar architecture using the two terminal RRAM). Memristive memory and RRAM are similar. In the known techniques, the initiating of the filaments relies predominantly on a forming process where a relatively high voltage (significantly higher than the operating voltage) is used to cause a "breakdown" and/or create a defect path in the switching layer. This forming voltage approaches the breakdown voltage and is dependent on switching layer thickness and quality. Typically, the breakdown field of oxides ranges between $5\times10^6$ V/cm and $8\times10^6$ V/cm. After the forming process, a high resistive state (HRS) and a low resistive state (LRS) are then observed in the memristor/RRAM devices. In some cases, memristor/RRAM multiple HRS and LRS states are possible where the IV (current voltage) characteristics are highly non-linear and/or there are multiple bi-stable states. In some cases where HRS/LRS are observed without a forming process, there may exist a defect path where ions, vacancies (also called species) can traverse to form filaments for switching characteristics, for example; however these are observed rarely and not reproducible which is not conducive to high volume manufacturing. In addition, within the same process run, some memory devices may require a forming process and some may not.

To remove the non-reproducibility and thereby increase uniformity, according to some embodiments, a path is introduced for the formation of filaments and/or ion/vacancies/pint defect diffusion/drift/hopping such that the forming process using high voltage need not be relied upon. The path or channel is formed by ion implantation where the passage of the accelerated ions such as Au, Pt, Pb, Fe, Bi, U, Ar, O, N, Si, B, P, H, Ti, Ta, C, Zr, Zn, Ga, In, Se, through the switching layer(s) causes defects, including crystallographic defects such as vacancies, interstitial defects, point defects, and lattice defects to form in the crystalline or non-crystalline switching layer. In addition, the ions can be implanted into the switching layer(s) to form a conducting channel of ions such as Au, Pt, C, Bi, Zr, In, Ga to name a few, and/or the damage to the crystal or micro-crystal (in the case of amorphous switching layer(s)) forming crystallographic defects that can also assist in the formation of filaments resulting in a HRS and LRS memory device.

Advantages of ion implantation include that it is a manufacturable process, and that it generates nearly one-dimensional defect paths that are approximately the shortest distance between the top and bottom electrodes. (The terms top and bottom are used for convenience, and should be understood to mean one side and the other side in any orientation.) Single or multiple paths can be generated that are approximately collinear where, together with an applied electric field, ions and vacancies can diffuse, drift, hop to form a "filament" that exhibits bi-stable and/or multi-stable states that represent a HRS and a LRS and/or multiple HRS's and LRS's. Filaments can be single wire-like or tree-like with multiple paths feeding to a main trunk or trunks. Single or multiple filaments can thus be approximately one-dimensional and/or three-dimensional.

Known RRAMs use forming processes that rely on applying a forming voltage, which is comparable to the breakdown voltage and/or approximately ten times greater than the operating voltage, to the switching layer and/or impurities at the interfaces of the switching layer(s) and the electrodes. The use of such forming voltages is necessary for known RRAM devices to exhibit bi-stable and/or multi-stable HRS and LRS states. According to some embodiments, the application of high forming voltages can be avoided. Instead, an initiation voltage can be applied that may be higher than the operating voltage in order to initiate the bi-stable and/or multi-stable HRS and LRS states. In some examples the initiation voltage may be a few tenth of a volt to a few volts higher than the operating voltage, which is less than the breakdown voltage. Silicon dioxide has a breakdown field of $6\times10^6$ V/cm and hafnium oxide has a breakdown field of approximately $5\times10^6$ V/cm. Therefore, for a 10 nm thick HfOx switching layer the breakdown voltage is 5 V; for a 40 nm thick HfOx switching layer, the breakdown voltage is 20V. Additionally, according to some embodiments, RRAM devices are provided that have significantly increased uniformity of characteristics, which is highly desirable for large-scale memory/computing applications. According to some embodiments, greater uniformity of performance across an entire RRAM chip can be achieved by uniformly creating enhanced channels in the switching layers through the use of radiation damage. The radiation, according to various described embodiments, can be in the form of ions, electromagnetic photons, neutral particles, electrons, and ultrasound.

FIG. 1 is a cross section diagram showing basic parts of a resistive random access memory RRAM device, according to some embodiments. RRAM device 100 includes top electrode (TE) 140, switching layer(s) 130 and bottom electrode (BE) 120. Paths of crystallographic defects can be created using ion implantation beam of ions 150 with energies that penetrate the entire structure of RRAM 100 and at least some come to a rest in the substrate 110. Defects created by the ion beam 150 include vacancies, interstitials, point defects, line defects, plane defects, Frenkel defects, antisite defects, impurity, amorphous, topological defects, dislocations, F-centers, to name a few. These crystallographic defects create a channeling path that can be conducive for ions/electrons and/or vacancies to migrate more easily under an electric field bias. Ions used in beam 150 can include one or more of Au, Pb, U, Er, Yt, Zn, O, Pt, Fe, Bi, H, He, Ga, Hf, N, C, V, Ti, Ta.

Figure 2:
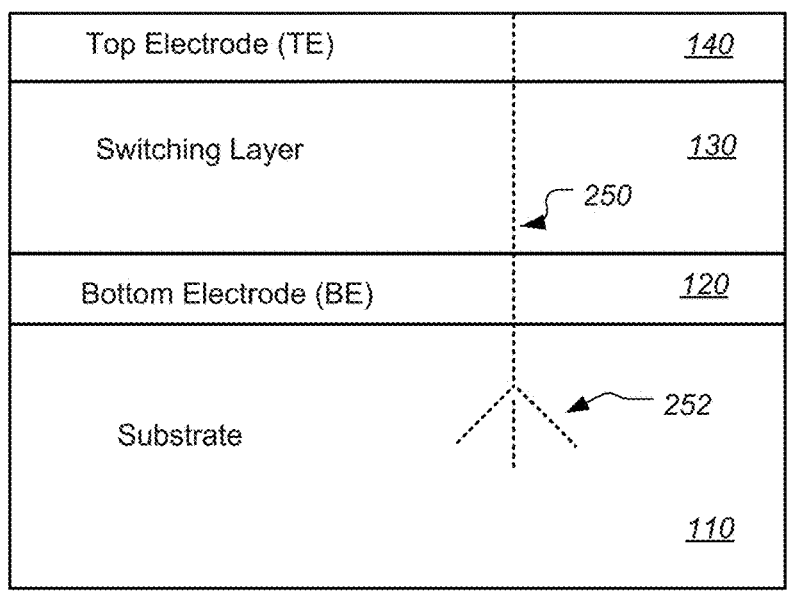
FIG. 2 is a cross section diagram showing paths of implanted ions in a RRAM device, according to some embodiments.

FIG. 2 is a cross section diagram showing paths of implanted ions in a RRAM device, according to some embodiments. The path 250 of the implanted ions creates crystallographic defects in crystalline and/or non-crystalline switching layers 130. Such defects can be vacancies, point defects, and/or interstitial defects. Depending on the acceleration voltage the accelerated ions are implanted at or to a certain depth with a certain spatial distribution. To generate crystal defects for the purpose of creating a path for ionic/vacancies movements, the ions can be implanted into one or more of the switching layer 130, electrodes 140 and 120, and the substrate 110. For minimal spatial spread in the defects generated (as one dimensional as possible, for example) the implanted ions shown in FIG. 2 are implanted such that they come to rest in region 252 of substrate 110. Accelerated ions in ion implantation, as they collide with the material, will scatter and there will be a distribution of scattered ions spatially. However, based on the acceleration voltage, the ions will propagate generally in their ballistic path with the maximum scattering occurring when the accelerated ions are coming to rest in the material. Dose is another factor that can determine scatter. Dose can range from $1.0\times10^6/\text{cm}^2$ to $1.0\times10^{16}/\text{cm}^2$ or higher depending on the implant depth which is dependent on the acceleration energy, ion mass, and the mass of the material that is being implanted into. Thus, dose, acceleration voltages, mass of the ions, target material are all considerations in achieving suitable defect paths/channels and to assist in the formation of suitable filament(s). Acceleration energies can range from less than 1 Kev (kilo electron volt) to 3200 KeV or more depending on the depth of implantation and mass of the ions and target density. The Au ions can be ion implanted with an accelerating energy of approximately 4.8 kilo-electron volt (KeV) per nm (nanometer) of depth in a crystalline material such as $Al_2O_3$. See, Kinoshita et al., Japanese Journal of Applied Physics 50 (2011) 01BE01, Structural and Magnetic Properties of Fe and Au Ion-Implanted $Al_2O_3$ Single Crystals, incorporated by reference herein. For typical RRAM/memristor structures of 4-20 nm switching layer thickness, accelerating energies of approximately 20 to 100 KeV are used for an ion such as Au (only about 0.4 of the accelerating energy for Au is needed for Fe to achieve the same depth for example) to penetrate the switching layer entirely with a few nanometer top electrode for example. A dose of greater than $1 \times 10^{14}$ ions/cm$^2$ at 50 KeV for Au will result in a concentration of Au of approximately $1 \times 10^{20}$ Au ions/cm$^3$. Dose can be adjusted to achieve the optimal concentration of defects for desired IV characteristics for a particular application. For example, doses as high as $5 \times 10^{16}$ ions/cm$^2$ or higher to create a region of very highly concentrated defects, resulting in extremely low switching voltages. With less defect concentration (at a lower implantation dose of Au ions for example), the switching voltage may be higher.

Figure 3:
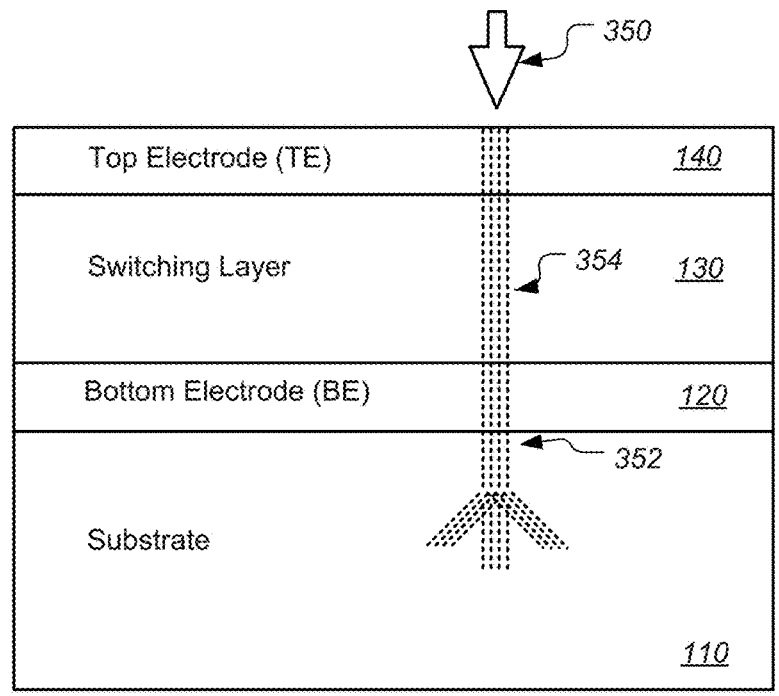
FIG. 3 is a diagram showing how a focused ion beam can be used to selective area ion implant (SAII) in a RRAM device, according to some embodiments.

FIG. 3 is a diagram showing how a focused ion beam can be used to selective area ion implant (SAII) in a RRAM device, according to some embodiments. In this example, a focused ion beam 350 is used to form a narrow defect path/channel 354 in the switching layer 130. Note that switching layer 130 can be crystalline, or it can be non-crystalline such as amorphous while still having microcrystalline structures for example. Defect path/channel 354 facilitates the movement of the ions, vacancies, and/or point defects, for example, so as to form filaments that can result in RRAM uniform switching characteristics without the use of a high forming voltage. The ion beam can penetrate the TE 140 into the switching layer 130 and into the BE 120 and into the substrate 110.

Figure 4:
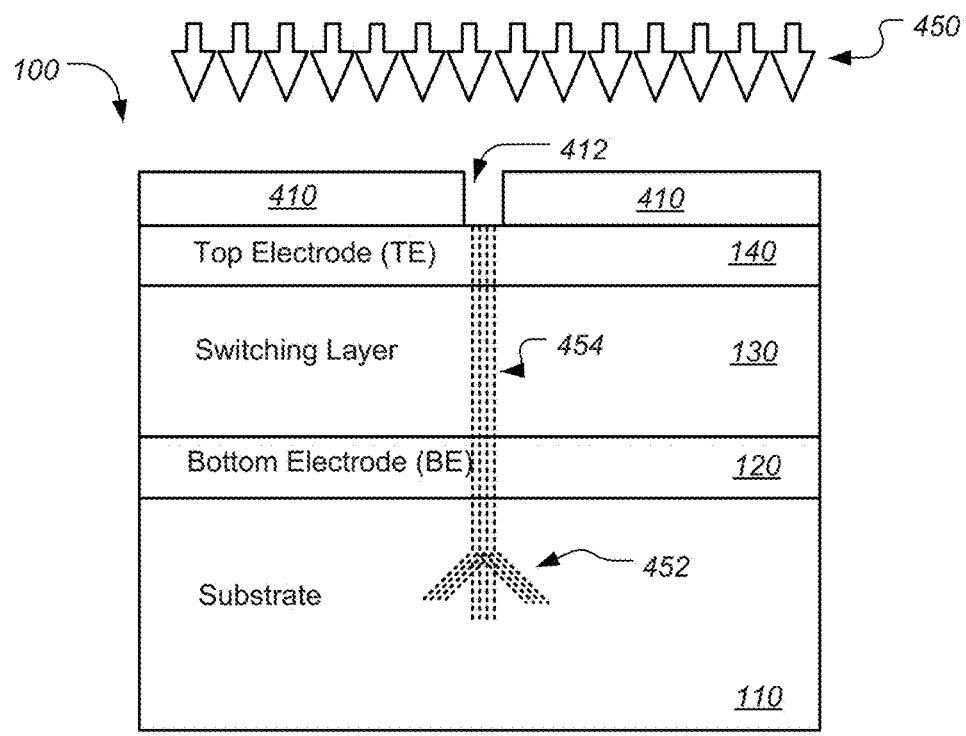
FIG. 4 is a diagram showing blank ion implantation in combination with an implant mask, for an RRAM device, according to some embodiments.

FIG. 4 is a diagram showing blank ion implantation in combination with an implant mask, for an RRAM device, according to some embodiments. Blanket ion implantation is generally more manufacturable than using a focused ion beam. The implant mask 410 can be Au, polymer, SiOx for example. In general, any material whose thickness is enough to contain most of the implanted ions is suitable. Typically, a dense material, high atomic number, such as Au will require a thinner layer than a less dense material, low atomic number, to stop most of the implanted ions. An opening 412 in the mask 410 allow the ions to pass through and implant into the desired regions of the RRAM device 100 depending on the accelerating energy. The accelerating energy or energy imparted to the ion is given by E=ZeV where E is the energy imparted to the ion, or accelerating energy, Z is the ion charge number (singly, doubly, triply ionized) e is the electron charge and V is the accelerating voltage. The amount of ions implanted is the dose. In FIG. 4, ions are implanted into the substrate 110, with their paths going through the top electrode 140 and the switching layer 130 and generating defects 454. The defects assist the diffusion/hopping/drift of ions and vacancies in the formation of filaments such that switching can occur uniformly without the use of a forming voltage. This pre-existence of the defect paths/channels reduces the randomness of the formation of the filament that would otherwise require a forming or breakdown voltage.

Figure 5:
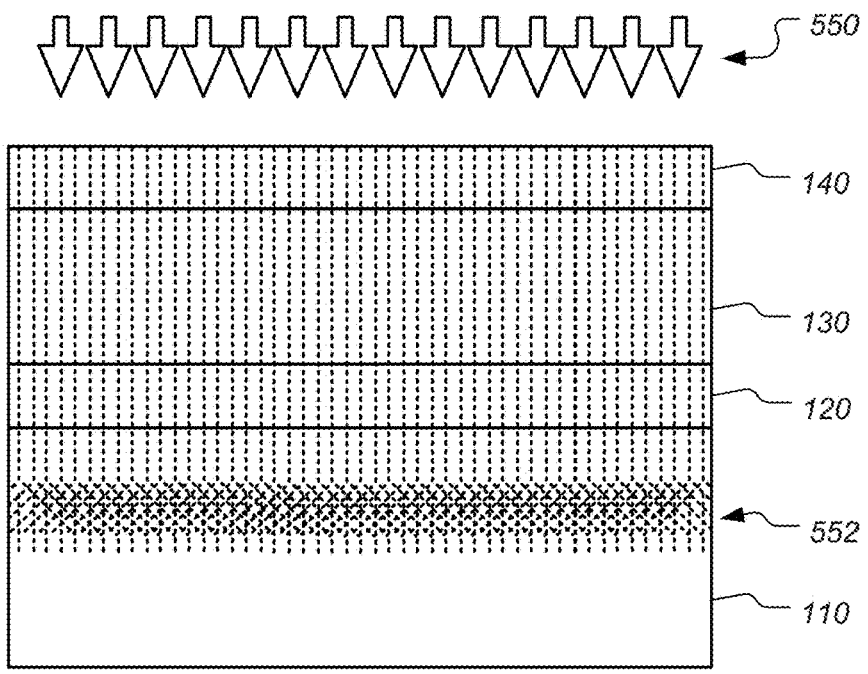
FIG. 5 is a diagram showing basic parts of a RRAM device under a blanket ion implant without any mask to define a selected area for implantation, according to some embodiments.

FIG. 5 is a diagram showing basic parts of a RRAM device under a blanket ion implant without any mask to define a selected area for implantation, according to some embodiments. Approximately parallel paths/channels are created which lead to more uniform formation of filaments without relying on a forming voltage to initially form filaments and/or establish switching current-voltage (IV) characteristics. As shown in FIG. 5, the ions are implanted into the region 552 of substrate 110 for example. Implanting the ions partially or completely within any of the layers comprising the RRAM device (TE, Switching layer, BE, substrate) are also possible, for example. Note that ion beam 550 can be normal to the surface of top electrode 140 or it can be at an angle, according to some embodiments.

Figure 6:
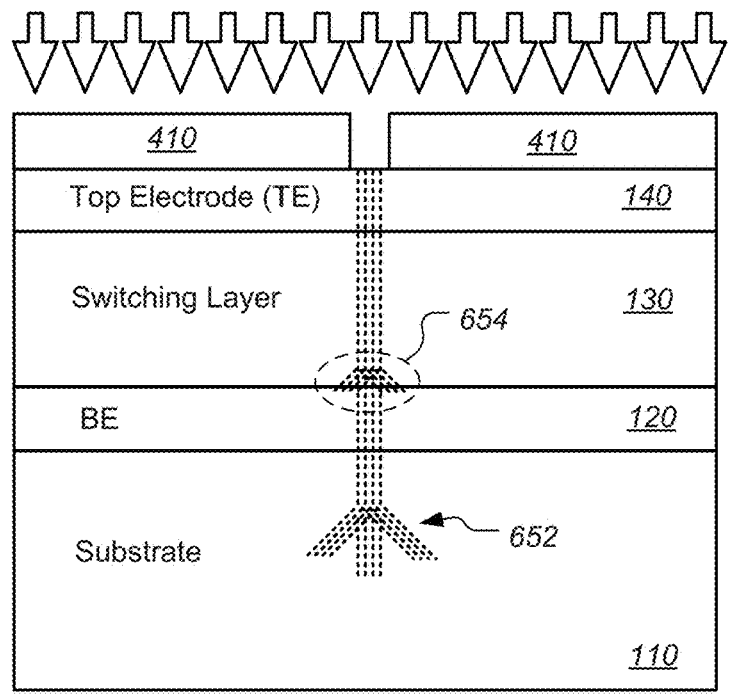
FIG. 6 is a diagram showing a memory device with multiple ion implantations through an implant mask, according to some embodiments.

FIG. 6 is a diagram showing a memory device with multiple ion implantations through an implant mask, according to some embodiments. According to some embodiments, a blanket implant without an implant mask 410 can also be used. Ions are implanted into region 652 of the substrate 110 for creation of a defect path in the crystalline, non-crystalline, or amorphous (microcrystalline and/or nanocrystalline) structure of the switching layer 130. The defect paths in layer 130 assist in the movement of ions, vacancies, oxidation and reduction, under an applied electric field for the formation of a filament, filaments and/or filament-like structures that exhibit uniform switching characteristics without application of forming voltages. A process still may be used for initiating memory characteristics, but at a voltage that is much less than the forming voltages of known resistive memory devices. According to some embodiments, the implant process used to create the defect paths in the switching layer can include multiple implants of different ions. Examples of different ions include Au, Pt, Pb, H, O, N, C, Ar, Ti, Ta, Ga, and In. According to some embodiments, ion implants of O, N, Ti, Ta can be implanted partially or entirely within the switching layer 130 for example in region 654, to provide ions for switching/oxidation and reduction in a TiOx switching layer resistive memory device. The order of the implantation for generating defects and for implanting ions to assist in the switching process may be interchanged. Ion implantation can be through the top electrode 140 and into the switching layer 130 and into the bottom electrode 120 and to the substrate 110.

Figure 7:
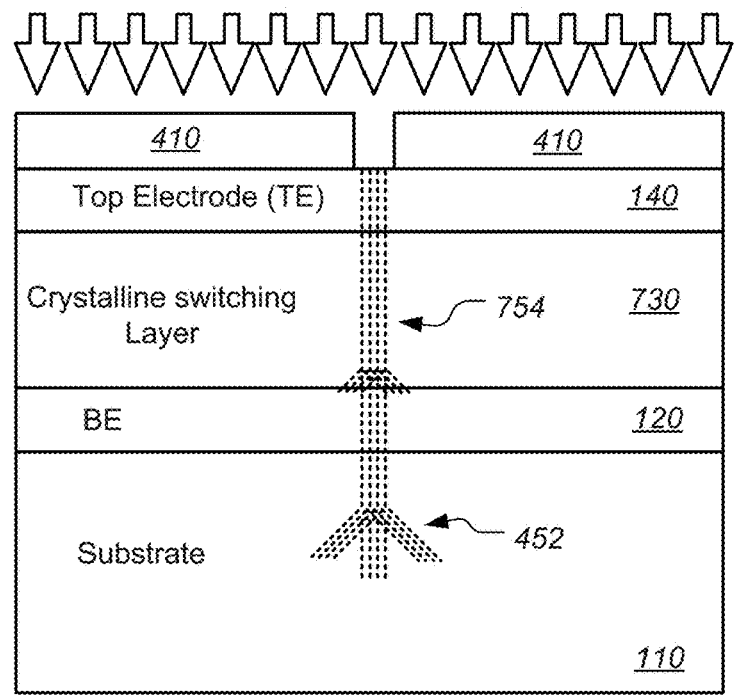
FIG. 7 is a diagram showing a resistive memory device with crystalline and/or almost crystalline and/or polycrystalline switching layer with an implant mask for selective area ion implantation, according to some embodiments.

FIG. 7 is a diagram showing a resistive memory device with crystalline and/or almost crystalline and/or polycrystalline switching layer with an implant mask for selective area ion implantation, according to some embodiments. Ions of sufficient energy are implanted through the structure and into the substrate 110 and/or bottom electrode 120 with sufficient dose to cause defect paths that are mostly normal to the surface. The resulting defect paths can be considered as amorphous due to the damage caused by the implanted ions traversing a crystalline and or almost crystalline switching layer(s) 730. In certain cases this is advantageous, since ions/vacancies/point defects/defects/oxidation-reduction, and electrochemical processes can more easily redox/drift/diffuse/hop under an applied electric field in the damaged region 754 rather than in the undamaged regions of layer 730 that are crystalline/poly-crystalline and/or almost crystalline or regions where it is stoichiometric and the damaged region together with or without added implants of ions that participate in the filament process, such as O, H, Ti in a TiOx switching layer which are less stoichiometric. For example, the crystalline switching layer 730 can be TiO$_2$ stoichiometric and the implant damaged region 754, with or without O or Ti ions, are TiOx are non-stoichiometric. The non-stoichiometric region 754 can facilitate formation of filaments and bi-stable/multi-stable states of HRS and LRS.

In addition, the stoichiometric regions may be less susceptible to dielectric breakdown at the high field regions occurring at the edge of the electrodes which improve reliability of the RRAM. Switching activity will take place away from the edge and mostly at the regions where the ion implant ions caused defect and crystal damages, such as break in lattice, vacancies, point defects, interstitial, to name a few.

Figure 8:
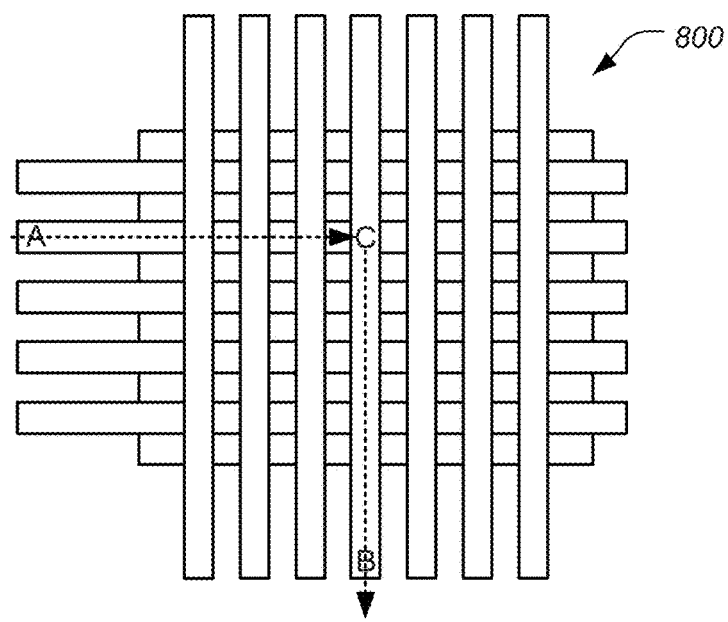
FIG. 8 is a diagram showing a crossbar resistive memory architecture, according to some embodiments.

FIG. 8 is a diagram showing a crossbar resistive memory architecture, according to some embodiments. Each intersection point of the horizontal and vertical electrodes represent a resistive memory device. According to some embodiments, the crossbar memory architecture 800 is fabricated and the ion implantation and or radiation can be a blanket implant without an implant mask and/or it can have an implant mask for selective area ion implantation and or radiation. In addition, the switching layer can be implanted where only the BE and TE are formed. If the BE is Ti, O ions can be implanted partially into the BE to form a TiOx switching layer, for example. TiN can be the BE, and Hf and O can be implanted partially into TiN to form HfOx where the top electrode can be Mo, Pt, Au, Ti, to name a few. In addition the BE can be TiN and Hf oxide grown by atomic layer deposition (ALD), for example, followed by a top electrode of Mo. Selective area ion implantation at regions away from the edge of the device, where high fields are concentrated due to electrode edges, can increase the reliability of the resistive memory devices. Using selective area ion implantation with an implant mask, regions away from the device edges can be implanted with paths/channels for filament formation and with implant of O, H, Hf, Ti ions for example. The implantation assists in filament formation via defects such as vacancies hopping and/or drift under an applied electric field, and assists oxidation-reduction processes. Vacancies can also be formed in non-transition metal oxide materials such as N, C, F in SiNx, SiCx, florides, that are based on nitride, TiN, AlN, SiN, for example, carbide, SiC, WC, NbC, TiC for example, fluorides, CaFx, MgFx, WFx for example other than oxides or in any combinations of oxides such as nitrides, fluorides, carbides, to name a few.

Figure 9:
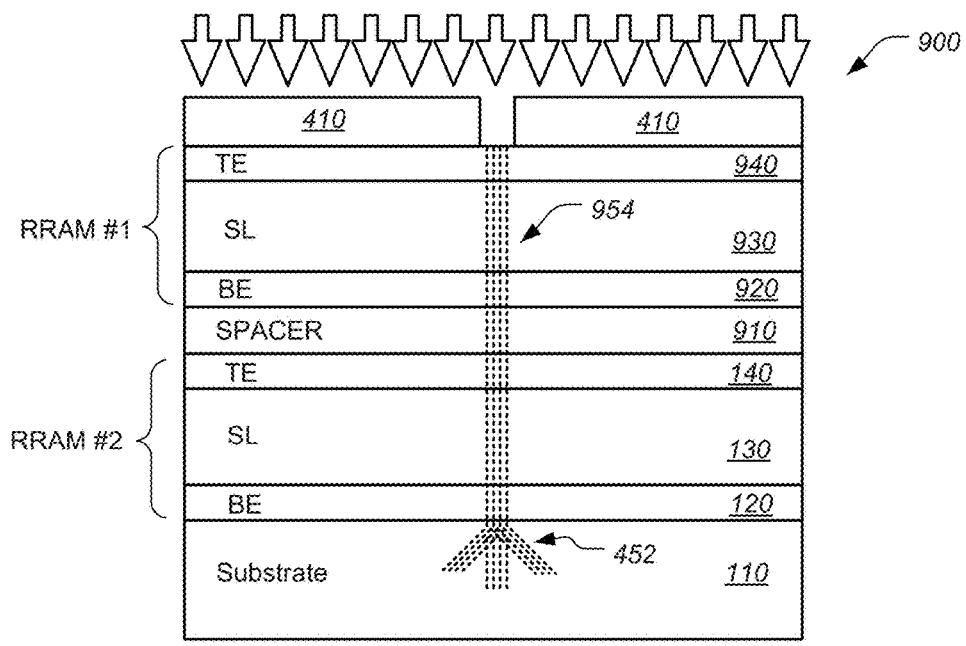
FIG. 9 is a diagram showing stacked RRAM devices having ion implanted paths, according to some embodiments.

FIG. 9 is a diagram showing stacked RRAM devices having ion implanted paths, according to some embodiments. The stacked device architecture 900 can, for example, be implemented using crossbar resistive memory devices. Selective area ion implantation or non-selective area ion implantation can be used simply by increasing the acceleration energy of the ions to be implanted to penetrate to the desired depth, for example as shown, the defect path channel 954 is generated by ions that are implanted to the substrate 110, penetrating both switching layers 930 and 130. Note that more than two switching layers can also be penetrated by the implanted ions by adjusting the acceleration energy. Typical commercial ion implant equipment can accelerate at 600 kilovolts (KV) and by using higher ionization number such as doubly ionized or triply ionized ions, the acceleration energy of the ions can be doubled or tripled. By adjusting the acceleration energy, ions can be implanted entirely and/or partially in RRAM#1 (made of TE 940, SL 930 and BE 920) and RRAM#2 (made of TE 140, SL 130 and BE 120). Radiation can also be used in place of or together with ion implantation, Since ion implantation is statistical distribution in nature, ions are distributed in depth and width in a targeted material. The peak distribution of the implanted ions can be in the substrate for example and still have some straggling ions in the switching layers and the TE and BE, for example.

Note that following conventional ion implantation procedures, an anneal at high temperature is often performed to remove crystallographic defects and damage due to the ion implantation process (see, Ion implantation of semiconductors, J. S. Williams, Materials Science and Engineering A253 (1998) 8-15). However, according to some embodiments, such defects are desirable to facilitate electrochemical migration of ions and vacancies under an applied electric field which can result in a LRS and a HRS. It should be noted that as used herein, the term "crystalline" also can include "stoichiometric", such that wherever a crystalline region is mentioned it can refer to a stoichiometric region.

During ion implantation the damage may or may not be orderly. This is also true for any other methods of damaging the crystalline, non-crystalline, stoichiometric and/or non-stoichiometric material such as proton implantation, electron beam, any particle beam, x-ray, gamma ray, optical beam, to name a few. For example, in FIGS. 1-7 and 9, the damage paths are shown schematically as straight lines for simplicity. In practice, the damage can be a network of intersecting damaged regions.

Figure 10:
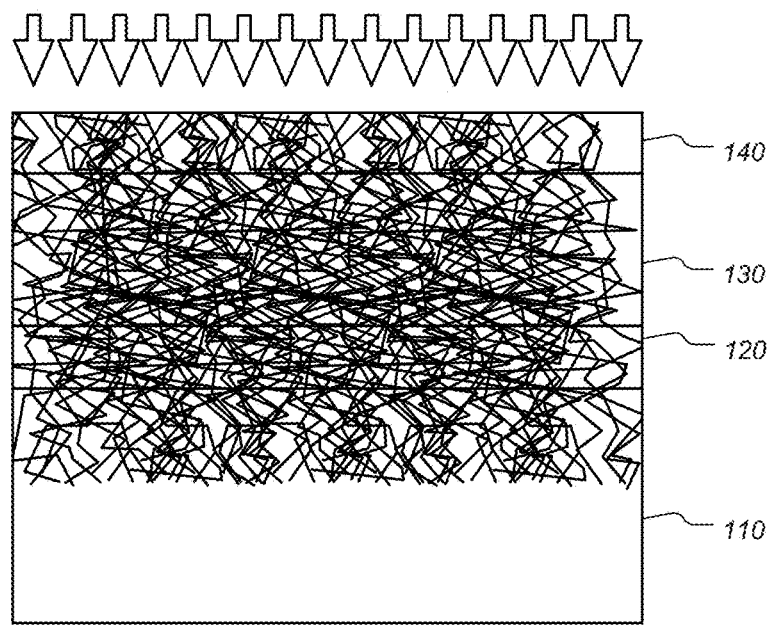
FIG. 10 is diagram that represents a creation of a mesh network of damage pathways, according to some embodiments.

FIG. 10 is diagram that represents a creation of a mesh network of damage pathways, according to some embodiments. Collisions of implanted particles with the material into which the particle is implanted can create a dense mesh network of intersecting paths as shown. The particles or energy can be ions, protons, electrons, X-ray, gamma ray, light from deep ultraviolet (UV) to infrared (IR), to name a few. The switching layer can consist of multiple layers for switching and for nonlinear electrical conduction such as a diode and other resistive and semiconducting layers for optimum memory and/or logic operations. Even though the damage is a mesh, a shortest path within the switching layers can be found to form conduction channels for the filaments or channels for filament formation that eliminate the necessity of forming process also known as breakdown process. Such forming/breakdown processes often exceed 5-20 volts and can reach 30 volts or more depending on the thickness of the switching layer. Breakdown field of oxides are typically $5 \times 10^6$ V/cm to $6 \times 10^6$ V/cm. Breakdown voltage also depends on the quality of the oxide. Oxides with higher concentrations of defects and/or grains have effectively less thickness of high-quality oxide and therefore have lower breakdown voltages. Since shortest path can always be found, electrically and/or electrochemically, the IV characteristics have less variations.

Figure 11:
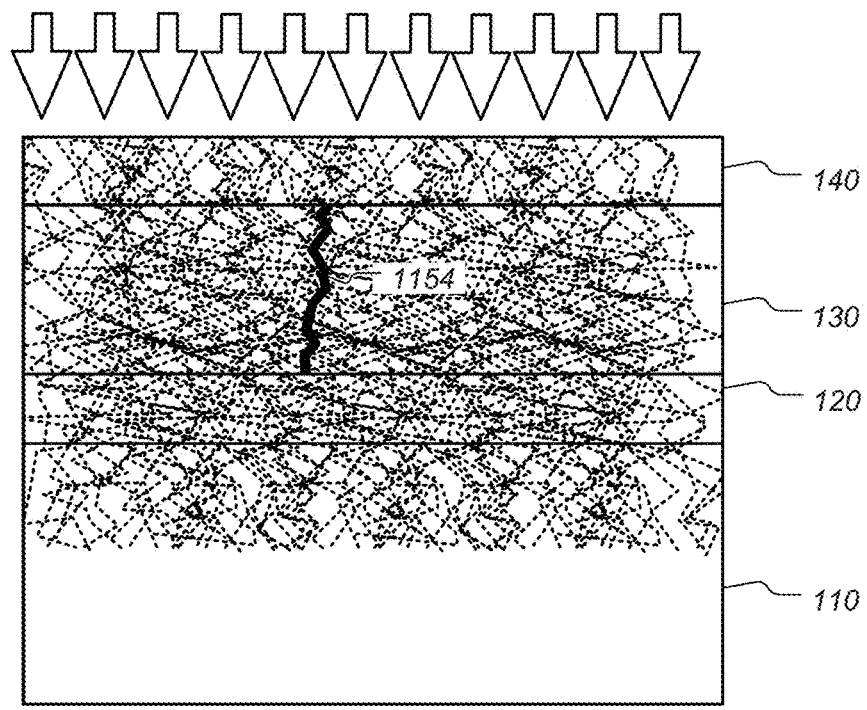
FIG. 11 is a diagram showing that the conducting channel formed in a mesh network of damage, according to some embodiments.

FIG. 11 is a diagram showing a conducting channel formed in a mesh network of damage, according to some embodiments. As shown, a conducting channel 1154 can be formed along a short path along the damage area that may not be a perfectly straight line. However, this is intentional damage and not a breakdown process, such as the forming process in known RRAM designs. Since the intentionally damaged volume is a dense mesh network, the shortest path through the switching layer(s) can be approximated by a straight line, as shown by the pathway 1154 that basically connects the shortest or nearly shortest distance of pathways shown in dotted lines. The transit time of the species such as oxygen ions, vacancies, electrons (for transition metal oxide switching layers, other species for other types of switching layers such as nitrides, carbides also applies.) is the shortest since the path through the switching layer is the shortest. Accordingly, the intentionally damaged RRAM is faster than known RRAM devices that depend on a forming process which result in a conducting path and/or damaged path that may not be shorter than the intentionally damaged path.

Figure 12:
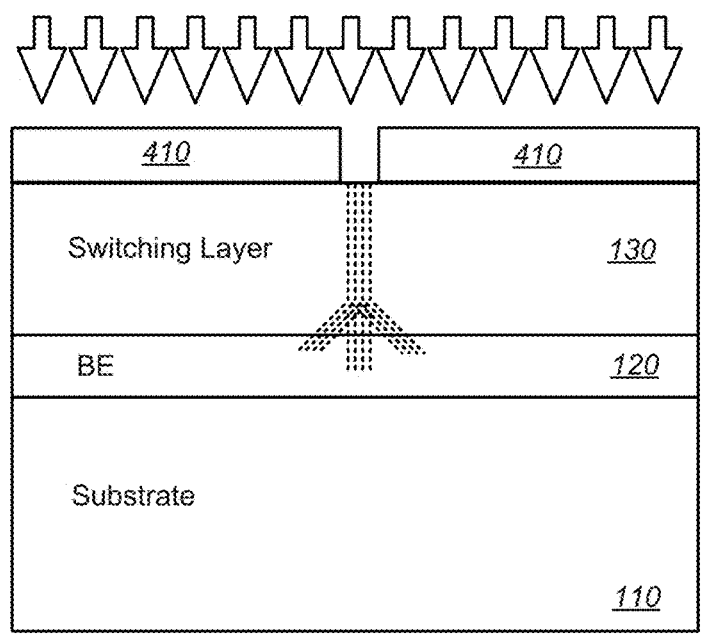
FIG. 12 is a diagram showing a switching layer that includes multiple layers, according to some embodiments.

FIG. 12 is a diagram showing a switching layer that includes multiple layers, according to some embodiments. Switching layer 130 can include multiple layers that can be stoichiometric and/or non-stoichiometric, crystalline, non-crystalline and/or micro-crystalline. Switching layer 130 can also include layers that are not involved in switching. For example, for transition metal oxide switching layer(s), non-switching layers can include nitride layers, semiconducting layers such as amorphous silicon, carbide layers, chloride and fluoride layers to name a few. These layers can be implanted first to create intentional damage such that conduction channels can be formed along a shortest path without breakdown voltages. Species such as oxygen ions, nitrogen, H, Ar, C, Cl, F, Ne, He, Xe ions, electrons, metal ions such as Au, Pt, Ag, Fe, Ni, In, Ga, Zr, Ta, Ti, Zn, Sn, Sb, Hf, Er, Yb, Gd, Pb, Bi, W, Zr, Os, can be implanted into the switching layer(s) and/or into the electrodes and substrates. Ions can be either for doping purposes, for example to create an oxygen rich reservoir and or vacancies for electro-chemical reactions in the case of transition metal oxide switching layer(s), and ions can be used to damage the material intentionally to create paths for the formation of filaments. Ions can also be used to change materials, for example, in the case of transition metal electrodes such as Ti, Ta, Mo, W, V, Zr, Ni, Fe, oxygen ions can be implanted partially and/or completely into the electrode to convert the transition metal electrode to transition metal oxide for switch layer(s). This in situ formation of the switching layer(s) avoids contamination as may occur in the case when the switching layer is formed separately and is exposed to atmosphere before the top or subsequent electrodes are formed to complete the RRAM device. Thermal treatment may or may not be desirable or necessary to optimize the in situ switching layer.

Figure 13:
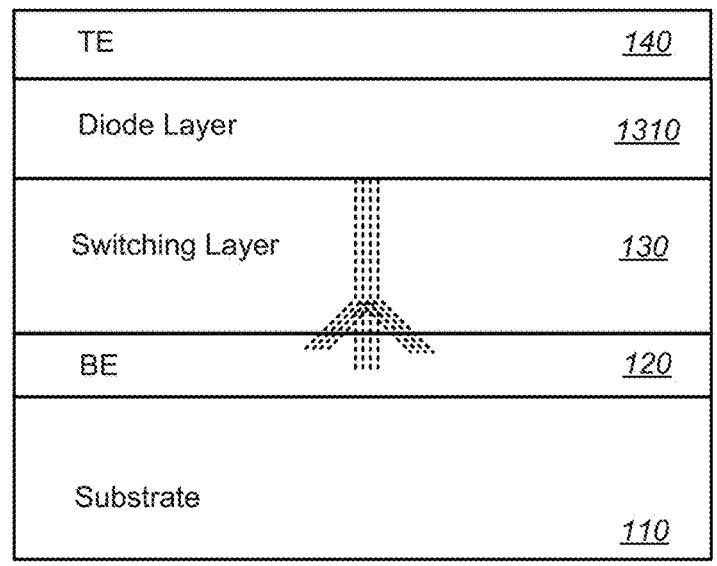
FIG. 13 is a diagram showing a diode layer that is formed on a switching layer after implantation, according to some embodiments.

FIG. 13 is a diagram showing a diode layer that is formed on a switching layer after implantation, according to some embodiments. The switching layer 130 is implanted with ions, particles, protons, electrons, rays such as x-rays, gamma rays, light waves such as ultraviolet, blue, green, red, infrared wavelengths to cause damage by stress, heat, uneven thermal expansion, or radiation. According to some embodiments, damage can be caused by insertion of large atomic mass atoms in the material by co-sputtering or co-deposition. Following such damage formation, a diode layer or layers 1310 and any non-switching layers to control current flow such as resistive layers, can be grown on top of the intentionally damaged layer to have good diode and/or resistive characteristics. A top electrode completes this simplified RRAM. Further ion implantation and or radiation processing can be used to alleviate any unintentional barrier layers between the top electrode 140 and the diode layer 1310 and/or the diode layer 1310 and the switching layer 130.

Figure 14:
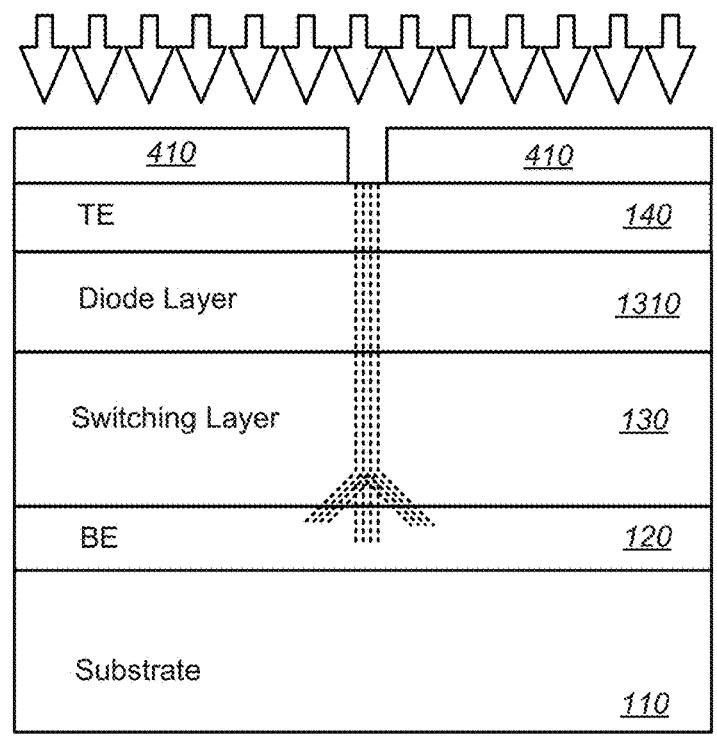
FIG. 14 is a diagram showing an intentionally damaging implant or radiation occurring on a completed RRAM device, according to some embodiments.

FIG. 14 is a diagram showing an intentionally damaging implant or radiation occurring on a completed RRAM device, according to some embodiments. In this case, all necessary diode and resistive layers 1310, switching layers 130 and top electrode 140 are formed. The device is then exposed to an ion, proton, electron implantation, radiation from UV to IR, in sufficient energies from less than KeV to MeV in singular or any multiples of energies to tailor the damage in depth and in singular or multiple dose of singular of ions, particles, radiation. For example the diode layer 1310 can be amorphous silicon and does not participate in the transition metal oxide switching process where the switching layer(s) can be composed of transition metal oxide(s). This greatly simplifies manufacturing since the crossbar can be first made and the intentional damage introduced after by exposure to ions, particles, protons and/or radiation singularly or in any combinations of species, energies, dose and methods.

FIGS. 15A and 15B are diagrams showing ion implanting with greater numbers of stacked devices, according to some embodiments. In order to increase memory density the crossbar architecture such as shown in FIG. 15A can be stacked from two to over twenty crossbars on top of each. FIG. 15B shows a stack of devices with a single ion implant path 1554. The average thickness of each crossbar is between about 0.1 to 2 microns. Stacking twenty or more crossbars will result in a thickness ranging approximately from 2 to 40 microns. Ions and electrons can be accelerated from about KeV (kilo electron volt) to MeV (mega electron volt) to penetrate the stack of RRAM devices. Approximately 1-10 MeV protons can penetrate more than tens of microns of material depending on the material. For silicon, for example, penetration can be approximately 25 to 250 microns using 1 MeV and 10 MeV respectively. For gold, penetration is approximately 5-7 times less.

According to some other embodiments, ion implantation is performed layer by layer as the layers are deposited and patterned. In this case only about 0.1-1200 KeV acceleration energies are necessary for ion/particle implantation and/or exposure to radiations such as x-ray, gamma ray, UV to IR.

FIG. 16 is a diagram illustrating a switching layer incorporated with large atomic mass atoms that create material stress, according to some embodiments. Switching layer(s) 1630 can be engineered by including atoms, such as atom 1610, with large atomic mass within the switching layer(s) 1630 that causes local strain in the material resulting in defects. The large atoms can be incorporated by any of several methods. In one method, while depositing the switching layer(s), large atomic mass atoms such as Au, Pb, Bi, Ga, are co-deposited simultaneously with depositing the other material of layer 1630. The large atomic mass atoms can be in atomic form or in cluster form such as when deposited by sputtering. An example is co-sputtering both TiOx and Pt or Au, such that Au or Pt atoms and/or clusters are embedded in the TiOx switching layer(s). This can cause defects within the switching layer(s) resulting in a network of paths for conducting channels for oxygen ions, vacancies, and electrons to propagate. The channels form filaments, including through oxidation and reduction, where vacancies and ions can cause transition metal oxides to be more or less conducting, depending on the amount of oxygen ions and vacancies. For example, TiOx with high oxygen ions and low vacancies are less conducting than TiOx with less oxygen ions and more vacancies. Other switching layer(s) such as HfOx, VOx, TaOx, WOx and GaOx or PbOx can be co-deposited or sequentially deposited by ALD and/or PECVD.

Ion implantation can also be used to introduce ions into the switching material thereby causing stress and strain resulting in a network of defects. The resulting channels through which charged ions and vacancies propagate form filaments whose resistivity can be changed by the concentration of ions and vacancies. Implanted ions can include O, H, He, Ar, Ne, Xe, Au, Pt, Mn, W, Mo, Zn, Pb, Bi, Ti, Ta. In addition, for the implanted ions to reside partially in the switching layer(s) they can also reside predominantly outside the switching layer(s) where the ions by transiting the switching layer(s) can cause defects to the materials in the switching layers and other layers that the ions transited.

FIG. 17 is a diagram illustrating stress defects caused by mismatched material layers, according to some embodiments. Material layers 1730 can be formed by growing epitaxially or non-epitaxially such that they are mismatched in lattice, thermal expansion, or deposition parameters such as temperature, pressure, stoichiometric, or material composition. For example, layers 1730 can be a superlattice with material layer thicknesses ranging from 0.1 to 3 nm where material A and material B are formed using different deposition methods. Different methods include different deposition parameters, such as temperature, rate, pressure, and/or material composition that result in a stress between material A and material B. In some cases there can be more than two materials interlaced in a repeating or non-repeating pattern.

For example, the switching layer(s) can be material AB, ABABABAB or ABCDBDAC, or ABCDEFG to name a few, where each letter represents a material layer different from other material letter in properties due to different deposition parameters, deposition methods, and/or composition of material to name a few. The resulting stress can result in defect networks that can form conducting channels 1750 for ions, vacancies, electrons to form the filaments necessary for memory effects in RRAM.

FIGS. 18A and 18B are diagrams illustrating subjecting switching layers that have built-in stress to ion implantation and/or radiation, according to some embodiments. In FIG. 18A, switching layer 1630 has large atoms embedded and in FIG. 18B, switching layer 1730 has a superlattice or layered structures with layers that are different in properties that result in stress such as due to different material composition and/or deposition methods and/or other parameters that result in stress. In both cases the structures can be subjected to ion implantation, radiation by UV to IR to further exacerbate the stress and assist in creating defects in the material so that a network of defective paths can form channels for filament formation in the operation of a RRAM without a need to use a breakdown voltage.

Figure 19:
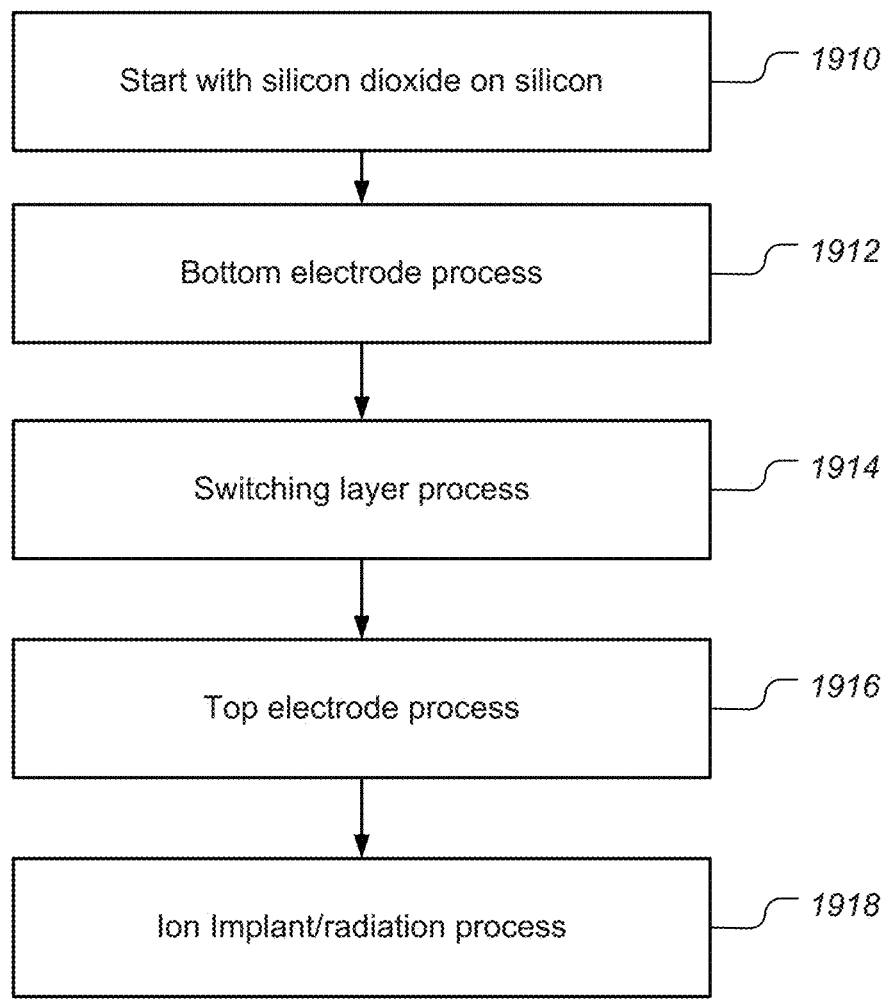
FIG. 19 is a flow chart illustrating basic processing blocks for a basic RRAM, according to some embodiments.

FIG. 19 is a flow chart illustrating basic processing blocks for a basic RRAM, according to some embodiments. In block 1910, the process starts with a substrate. According to some embodiments, the substrate includes a layer or layers such as silicon dioxide to insulate the RRAM from the substrate electrically. The substrate can also contain CMOS circuits that can be connected to the RRAM electrically. In block 1912, the bottom electrode is defined and deposited. This can involve metal deposition, such as evaporation of metals or sputtering of metals, photolithography, wet and/or dry etching such as reactive ion etch, ion milling. According to some embodiments, nanoimprinting is used to define the electrodes. Metals such as Ti, Mo, W, Ni, Pt, Al, Zr, Ta, V and/or metal nitride such as TiN, TaN, GaN, AlN, InN, WN, and silicide such as NiSi, PtSi, WSi can be used. In Block 1914, the switching layer(s) is deposited along with any other layers, such as diode layers and/or resistive layers, for current control. As mentioned earlier, ion implant and/or radiation can also be performed in this process block. The switching layer(s), such as TiOx, TaOx, VOx, HfOx, ZnOx, GaOx, InOx, PbOx, FeOx, CrOx, NiOx, to name a few can be stoichiometric and/or non-stoichiometric. The switching layer(s) can be deposited in several methods such as atomic layer deposition (ALD), plasma enhanced chemical vapor deposition (PECVD), sputtering, evaporation, molecular beam epitaxy (MBE). Block 1916 is similar to block 1912. In this case the top electrode is deposited and defined photolithographically and/or by nanoimprinting. The electrodes can be evaporated, sputtered, PECVD, ALD, to name a few. Metals such as Ti, Mo, W, Ni, Pt, Al, Zr, Ta, V and/or metal nitride such as TiN, TaN, GaN, AlN, InN, WN, and or silicide NiSi, PtSi, WSi can be used. In block 1918, ion implantation and/or radiation such as Xray, gamma ray, optical rays from UV to IR are used to intentionally generate defects in the switching layer(s). When the switching layers are stoichiometric, dopant ions such as oxygen can be implanted to provide excess oxygen ions to affect the resistivity of the filaments. H ions can also be implanted to generate vacancies that can affect the resistivity of the filament. According to some embodiments, defects are generated using heavy ions that are implanted through the switching layers and/or ions to generate defects. The heavy ions pass through the switching layer(s) and many or most are embedded outside the switching layer(s). Particles implanted can include electrons, ions such as H (proton), O, Ti, Ta, N, F, Cl, C, Li, Na, K, He, Ne, Xe, Ar, Au, Be, Mg, Mn, Si, B, Ge, Ga, Ni, V, Au, Pt, Fe, Pb, Bi, In, W, Mo, Hf, Ag, Cr. Implant energies can be from less than about 1 KeV to greater than 10s MeV, and in certain cases to GeV. Doses can range from $1 \times 10^4/cm^2$ to $1 \times 10^{17}/cm^2$ or more. According to some embodiments, multiple ions species, energies and doses are used. According to some embodiments, block 1918 includes radiation by X-rays, gamma rays and/or optical rays from UV to IR. According to some embodiments, an electron beam is used to modify and create defects in materials.

In the case of stacked RRAM crossbars, the ion implant/radiation process block 1918 can be performed last and/or it can be performed after a certain number of stacks, for example at every 5 stacks. In some cases, block 1918 is performed at every RRAM layer and/or sublayer (where the switching layer(s) are deposited). Note that block 1918 can also include electrons with energies in the sub KeV to hundreds of KeV and MeV and variable doses can range from $1 \times 10^4/cm^2$ to $1 \times 10^{17}/cm^2$ or more.

Figure 20A:
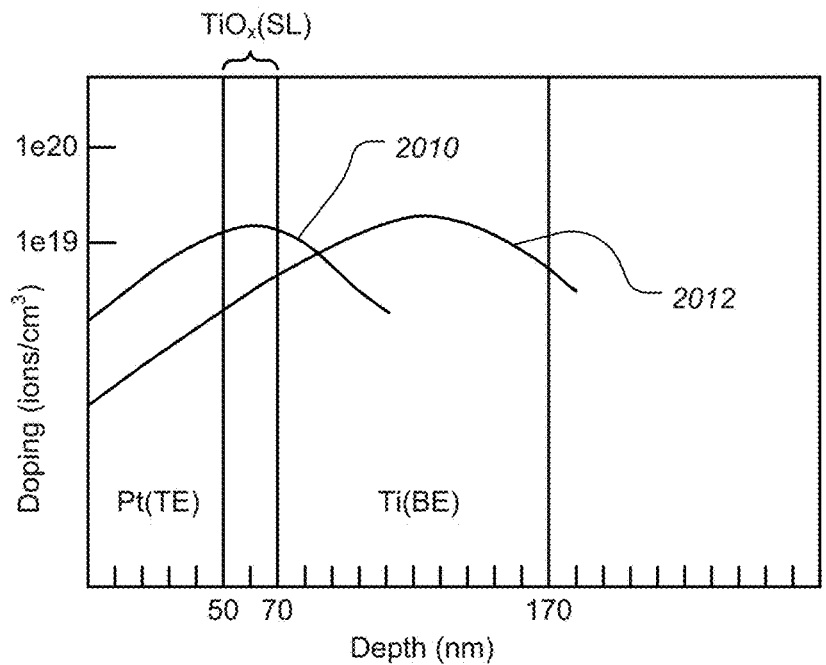
FIGS. 20A and 20B are schematic diagrams showing ion implantation doping vs. depth profile for to RRAM devices, according to some embodiments.
Figure 20B:
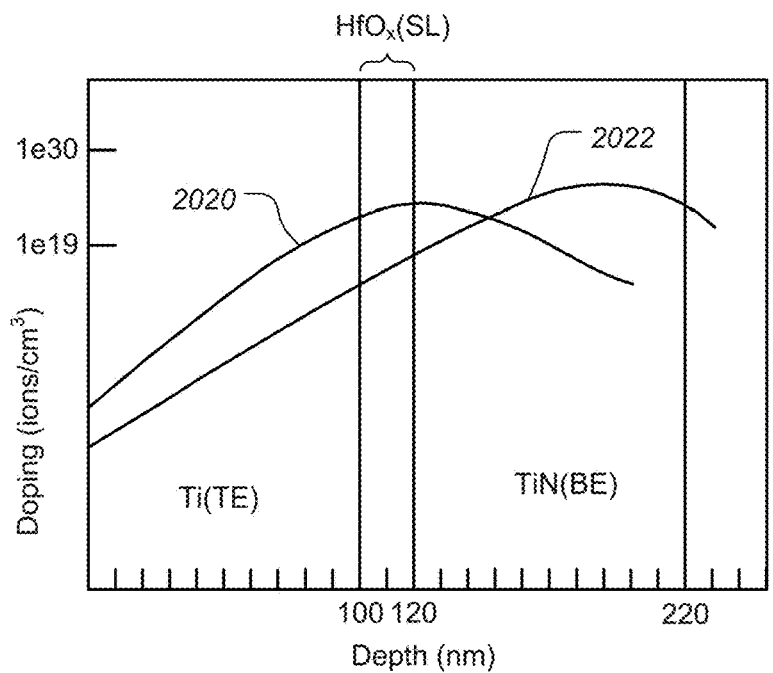

FIGS. 20A and 20B are schematic diagrams showing ion implantation doping vs. depth profile for two RRAM devices, according to some embodiments. In FIG. 20A, curve 2010 is the ion implant profile for O ions in the switching layer, and curve 2012 is the ion implant profile for B or P ions embedded mostly in the bottom electrode of a Ti/TiOx/Pt structure. In FIG. 20B, curve 2020 is the ion implant profile for O ions in the switching layer, and curve 2022 is the ion implant profile for Ar or In ions embedded mostly in the bottom electrode of a TiN/HfOx/Ti structure. These are just an example of two RRAM structures with possible implant ions and profiles.

Figure 21A:
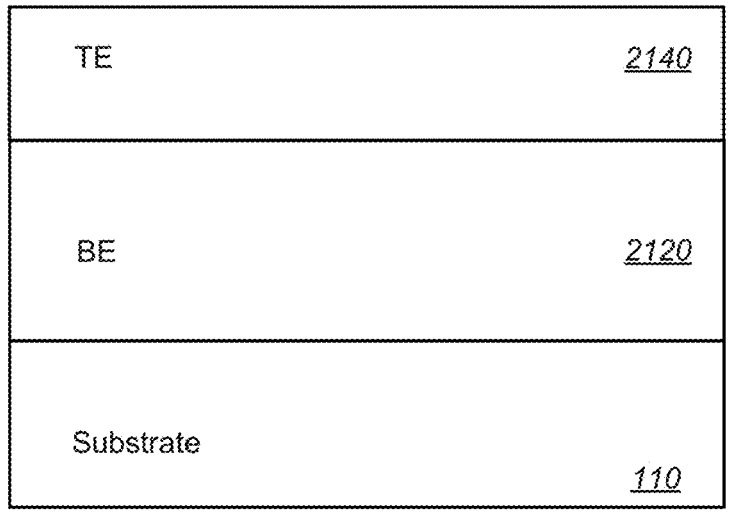
FIGS. 21A and 21B are diagrams illustrating in-situ formation of the switching layer(s) by ion implantation, according to some embodiments.
Figure 21B:
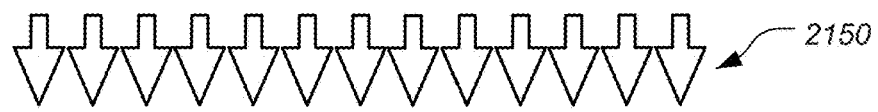

FIGS. 21A and 21B are diagrams illustrating in-situ formation of the switching layer(s) by ion implantation, according to some embodiments. FIG. 21A shows just the BE 2120 and TE 2140. One or both of 2120 and 2140 is a transition metal. In FIG. 21B, an ion implantation process 2150 implants oxygen ions approximately at the interface and/or predominately into one of the electrodes 2120 and 2140 to form an in-situ transition metal oxide layer 2130, which is the switching layer. According to some embodiments, multiple switching layers can be formed by using layers of different metal in the electrodes. In one embodiment, BE 2120 is made of layers of Pt/Ti/V, and the TE 2140 is Mo. By implanting oxygen ions, the resulting switching layers 2130 are TiOx/VOx/MoOx. Note that in this case only part of the TE 2140 is converted to MoOx. According to other embodiments, ion implantation with other ions can be used, such as Au, Pt, Xe, H, N, Cl, F, Si to name a few to either be partially embedded into the switching layers and/or to mostly embedded outside the switching layer to create intentional defects for filament formation. Other in situ switching layers such as TiN, AlN, InN, GaN can be fabricated similarly using N ion implantation for example into electrodes of Ti, Al, or In.

Figures 22A, 22B:
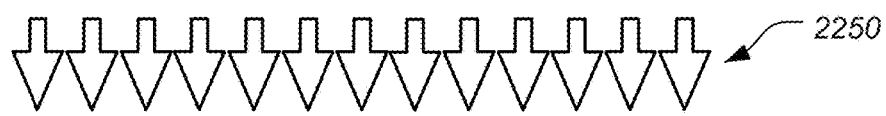
FIGS. 22A and 22B are diagrams illustrating another example of in-situ formation of switching layer(s), according to some embodiments.

FIGS. 22A and 22B are diagrams illustrating another example of in-situ formation of switching layer(s), according to some embodiments. In this example, the BE 2220 and TE 2240 need not be transition metals since one or more transition metal layers 2200 and 2202 are sandwiched between them. According to some embodiments, the bottom and top electrodes 2220 and 2240 are materials such as Pt, Au, Al, Cu, Ag, TiN, GaN, InN, silicides, nitrides, carbides, carbon, and/or semiconductors. The intermediate layers 2200 and 2202 can be transition metals such as Ti, Ta, V, Ni, Hf, Zr, Cr, Zn, Mn, W, Mo, Ir, Os, Al. An oxygen ion implantation 2250 is preformed into the layers 2200 and 2202 at doses sufficient to form transition metal oxide layers 2230 and 2232 that can then be used for switching. Oxygen ion implant doses range from approximately $1\times10^{10}/cm^2$ to $5\times10^{20}/cm^2$ or greater at energies from a few KeV to 800 KeV or greater. According to some embodiments, ion implantation of other ions can also be used to assist in creating defects for filament formation. Nitride based switching layers can also be fabricated for example layer 2202 can be Ti, In, or Al and N ions are implanted. In addition multiple different kinds of switching layers such as transition metal oxide and transition metal nitride can be fabricated in situ with O and N ion implantation.

As used herein, "filament formation" refers to the formation of a channel or channels through which electric current flows along material defects, wherein the resistivity of the channel(s) can be modified by charged ions and vacancies. Note that the width of each channel can range from a small fraction of the size of the lateral dimension of the RRAM to the actual lateral dimension of the RRAM.

Figures 23A, 23B:
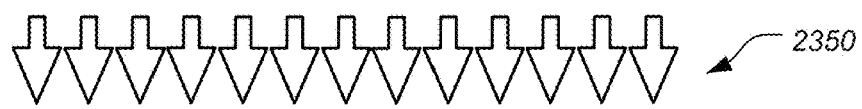
FIGS. 23A and 23B are diagrams illustrating in-situ formation of switching layers in combination with non-switching layers, according to some embodiments.

FIGS. 23A and 23B are diagrams illustrating in-situ formation of switching layers in combination with non-switching layers, according to some embodiments. In addition to in-situ formation of transition metal oxide switching layers 2330 and 2332 from transition metal layers 2300 and 2302 by oxygen ion implantation 2350, other layers can also be formed. For example, a tunnel silicon dioxide layer 2334 of a few nm thick can be formed by the addition of a Si layer 2304 which can then be oxidized to silicon dioxide and/or SiOx by the oxygen ion implantation 2350. According to some embodiments, other layers can also be used that instead of forming oxide can change the electrical characteristics of the layer such as GaAs, GaN, InN, to name a few. In such cases, implanted oxygen ions can increase the resistivity of the layer for current control, and also may have nonlinear IV characteristics than can minimize sneak current in a crossbar RRAM architecture.

It should be noted that while the RRAM devices discussed herein are mostly transition metal oxide based, according to some embodiments the techniques described are applied to other resistive memory devices not based on transition metal oxide for switching, such as transition metal nitride, transition metal carbide, metal sulfides, metal chlorides, metal fluorides, sulfides, chlorides, fluorides, diamond-like carbon, carbon, polymer, and phase change non-volatile memory devices.

It should be noted that resistive random access memory (RRAM) also known as memristors can also be used in logic operations. According to some embodiments, the techniques described herein are not limited to memory devices but apply also to logic operations. See, e.g. "NATURE NANOTECHNOLOGY|VOL 8|JANUARY 2013|www.nature.com/naturenanotechnology, Memristive devices for computing."

According to some embodiments, in a phase change memory (PCM), Ge is sandwiched between top and bottom electrodes, an ion implant mask is used, as in FIG. 4 for example, for selective area ion implantation. Sb and Te can be implanted such that the phase change material Ge—Sb—Te can be formed in-situ. Oxygen ions can also be implanted in areas where phase change material is not desirable; for example, an ion implant mask can be used in selective area ion implant regions to reduce the size of the phase change area to improve electrical performance, such as low current operation. Other PCM material such as CuS, AgS, Sb—Te, Sb—Te—TiN, to name a few, may also be used, where Cu electrodes can be partially converted to CuS with S ion implantation.

Figure 24:
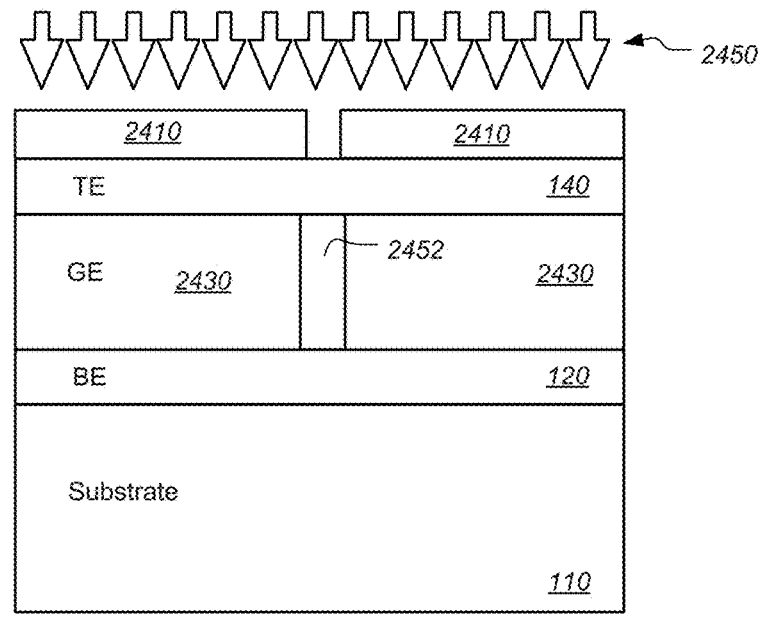
FIG. 24 is a diagram illustrating ion implanting with a phase change memory device, according to some embodiments.

FIG. 24 is a diagram illustrating ion implanting with a phase change memory device, according to some embodiments. In this example, a Ge—Sb—Te phase change memory region 2452 is formed within a Ge layer 2430 that is sandwiched between a bottom and top electrodes 140 and 120. To make the Ge 2430 highly resistive, O ions can first be implanted using an implant mask (not shown) everywhere in the Ge region except where Sb and Te will be implanted. Using a self-aligned process a second implant mask 2410 can be used. The mask 2410 is self-aligned to the first implant mask where the first implant mask is removed exposing an aperture. Implantation process 2450 then implants Sb and Te ions selectively into the Ge forming the Ge—Sb—Te phase change material 2452 for memory completely in-situ. See e.g., MRS BULLETIN·VOLUME 39·AUGUST 2014·www.mrs.org/bulletin, "Phase change materials and phase change memory." Heat treatment may or may not be desirable or necessary to optimize the device performance.

According to some embodiments, defect paths or channels are created by ion beam, electron beam, electromagnetic waves, ultrasound, internal stress, and/or built-in stress in the switching material, which can be in crystalline, non-crystalline, microcrystalline and/or amorphous material. Within transition metal oxide switching layers, chemical bonds between metal and oxygen are broken microscopically such that vacancies are formed. The vacancies can be, for example, oxygen vacancies and/or metal vacancies. These defects can form a path or channel such that vacancies and ions can drift under the influence of an electric field and/or potential.

In known techniques, paths/channels of crystallographic defects where the bonds are broken are created during forming process where a large voltage of approximately 5-50V (depending on thickness of switching layer) is applied between the top and bottom electrode. According to some embodiments, a path of defects where bonds are broken is created using ion implantation, electron beam, electromagnetic waves, heat, ultrasound, built-in stress. Defects can take the form of vacancies, interstitials, point defects, line defects, plane defects, Frenkel defects, antisite defects, impurities, amorphous regions, topological defects, dislocations, and/or F-centers. Amorphous and polycrystalline materials have microscopic crystal structures and crystalline materials have macroscopic crystal structures. Defects such as bond breakage, for example, can provide a path/channel for vacancies, ions, electron diffusion and drift under an electric field and/or potential applied across the top and bottom electrodes of a resistive random access memory (RRAM).

As noted, known forming processes can be used to cause bond breakage with the application of a large voltage across TE and BE, resulting in high electric field within the switching layer and high current density. A voltage of 1-30 volts across approximately 2-60 nm thick switching layer, with a breakdown field of $5\times10^6$ V/cm and with current from a few micro amperes to tens of milliamperes is known to be used. Filament diameters can range from nanometers to hundreds of nanometers. Filaments can be non-uniform in diameter as a function of length and can have multiple branches. Furthermore, multiple filaments may be formed during a forming process. In polycrystalline switching layers, the defects can form along grain boundaries. By purposely introducing the defective channels and/or paths described herein, the filaments are formed mostly along the purposely introduced defective paths/channels. By using purposely formed defective path/channels, the known forming process under high electric field will be unnecessary. In some cases, an applied voltage to initiate the drift of vacancies, ions, electrons to form the filament may be used instead. This initial voltage, however, will be in the neighborhood of a few volts and less than the bond breaking voltage necessary for forming processes.

Figures 25A, 25B:
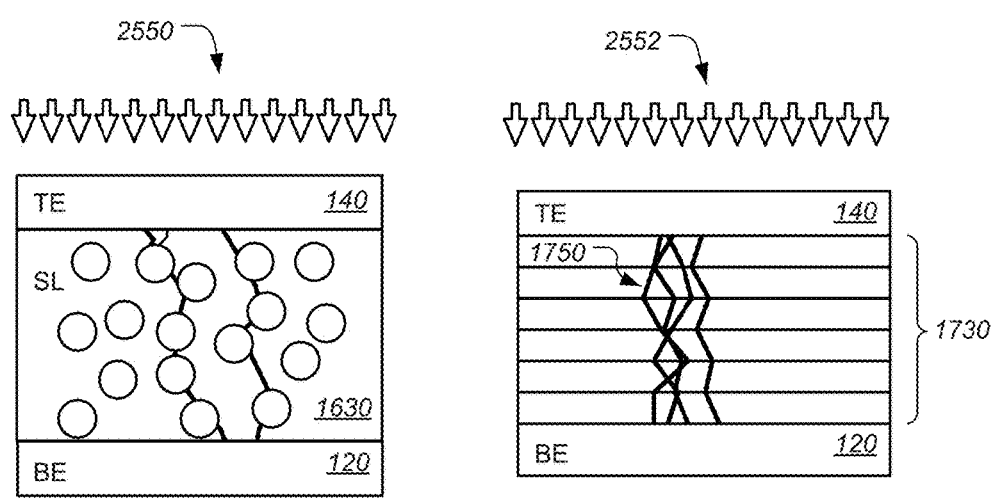
FIGS. 25A and 25B are diagrams illustrating intense ultrasound and/or heat used to generate defects in switching layers, according to some embodiments.

FIGS. 25A and 25B are diagrams illustrating intense ultrasound and/or heat used to generate defects in switching layers, according to some embodiments. FIG. 25A, shows a switching layer 1630 having large atomic mass atoms incorporated therein which cause local strain in the material. Ultrasound 2550 provides external stimuli to cause local defects to propagate. Similarly, in FIG. 25B, layers 1730 include mismatched material layers that result in stress between neighboring layers. Ultrasound 2552 provides external stimuli to cause local defects 1750 to propagate. According to some embodiments, heat is used with or without the ultrasound to provide the external stimuli to propagate the defects. According to some embodiments, the switching layers do not have built-in internal stress but the ultrasound is intense enough to nevertheless cause and propagate defects in the switching layers.

Figure 26:
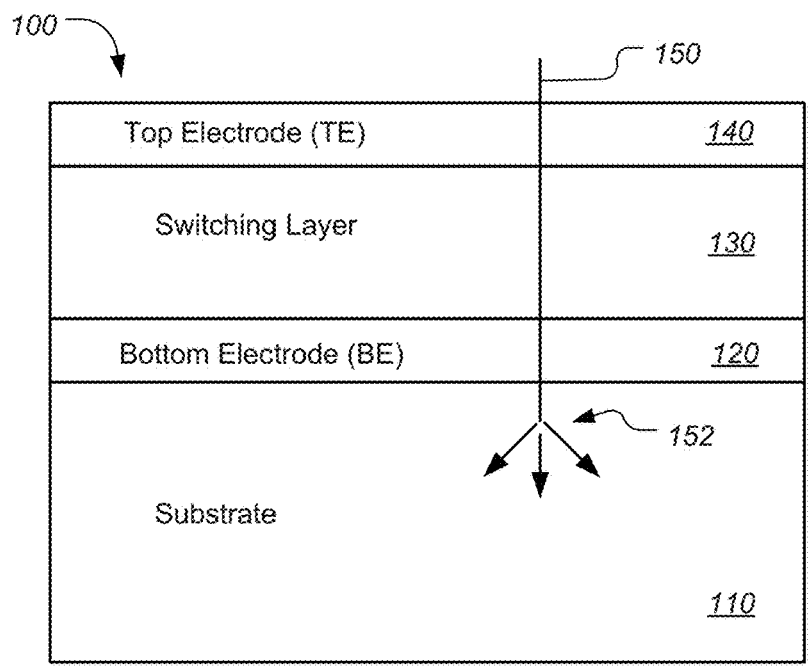
FIG. 26 is a diagram illustrating the use of ion implantation or other radiation to create paths or channels of defects in the switching layer structures, according to some embodiments.

FIG. 26 is a diagram illustrating the use of ion implantation or other radiation to create paths or channels of defects in the switching layer structures, according to some embodiments. Beam 150 can be ions such as Au, Pb, U, Er, Yt, Zn, O, Pt, Fe, Bi, H, He, Ga, Hf, N, C, V, Ti, Ta, Ar, Xe, positrons, and electrons. The implantation can take place into and/or through the switching layer 130, either with the top electrode 140 in place, in some embodiments, or without a top electrode yet formed in other embodiments. The implantation disrupts and/or breaks the chemical bonds between the metal and oxygen to form defective metal-oxygen bonds and/or vacancies. Examples of transition metal oxide switching materials include TiOx, HfOx, TaOx, VOx, WOx, and ZnOx. Other switching layer materials are also possible, such as C, S, F, and N. According to some embodiments, energy can range from sub KeV to a few thousand KeV, and even to MeV. Dose can range from less than $1 \times 10^3/cm^2$ to greater than $1 \times 10^{20}/cm^2$. The implantation may be blanket ion implantation or selective area ion implantation.

Figure 27:
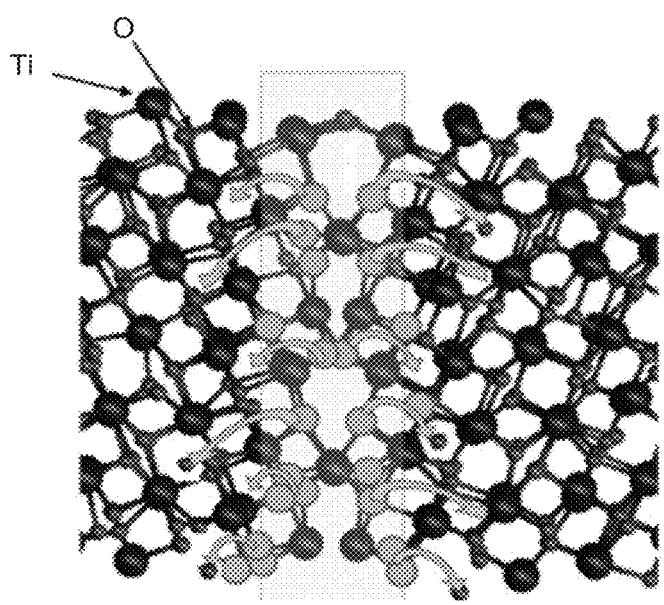
FIG. 27 is a diagram illustrating a forming process as is known in the prior art.

FIG. 27 is a diagram illustrating a forming process as is known in the prior art. FIG. 27 is adapted from "Progress on RRAM as a future non volatile memory" (NVM), P. D. Kirsh, Oct. 28, 2011, Sematech. FIG. 27 shows that in known RRAM manufacturing techniques, a forming process is used before the RRAM can exhibit memory effects such as high and low resistance states. The forming process comprises applying a large voltage across the top and bottom electrode, causing a breakdown to occur where bonds between the metal ions and oxygen ions break. This process results in a haphazard path for vacancies, ions and/or electrons to drift under the applied field. This movement of ions, vacancies and/or electrons in this defective path of broken bonds gives rise to high and low resistance states. The defective paths with vacancies, ions and/or electrons diffusing, drifting and/or hopping is often referred to in the literature as a filament. The uses of such forming processes in RRAMs have been known for many years. However, to date has yet to result in a known commercial product. This is believed in part due to the non-manufacturability of applying the forming voltage of every memory element in a large memory chip, and also in part due to the haphazard nature of the bond breakage during the forming process. The resulting devices have poor reproducibility and poor device-to-device consistency and poor reliability. According to some embodiments described herein, ion implantation or other radiation is used to break the bonds. This leads to a more uniform defect path/channel, which results in a reproducible and more manufacturable and reliable RRAM.

According to some embodiments, we take advantage of the damage inflicted by ion implantation, particle beam, electron beam, electromagnetic radiation, heat, ultrasound to name a few. In the example of ion implantation, the ions cause defects such as bond breakage. The defects become the pathways or channels for vacancies, ion and/or electrons to migrate, the combination of which is referred to as a "filament." According to some embodiments, heat treatment to activate certain ions can be used. Subsequent ion implantation can then cause the defective pathways/channels for ions, vacancies and/or electrons to migrate. Heat treatment at certain temperatures can be used for partial activation in some embodiments. In some cases, partial annealing and or heat treatment can be used to remove some, but not all, of the defects. Heat treatment can be used to optimize the resistivity of the RRAM, activate the diode characteristics, and optimize the nonlinearity of the current voltage characteristics. Although some amount of damage or defects should remain in order to have a filament in the RRAM, heat treatment can be used to optimize the characteristics of the filament.

Annealing and/or heat treatment temperatures can range from less than 200° C. to over 1800° C. for a duration from milliseconds to many hours. The anneal can take place in an inert environment such as Ar, or in a reactive environment such as O, or H. The annealing process can have a combination of gases such as N and H, Ar and H, Ar and N. The annealing process can also be in a plasma environment where a gas discharge such as N, O, H or combination of gases can be used in the glow discharge.

Figure 28:
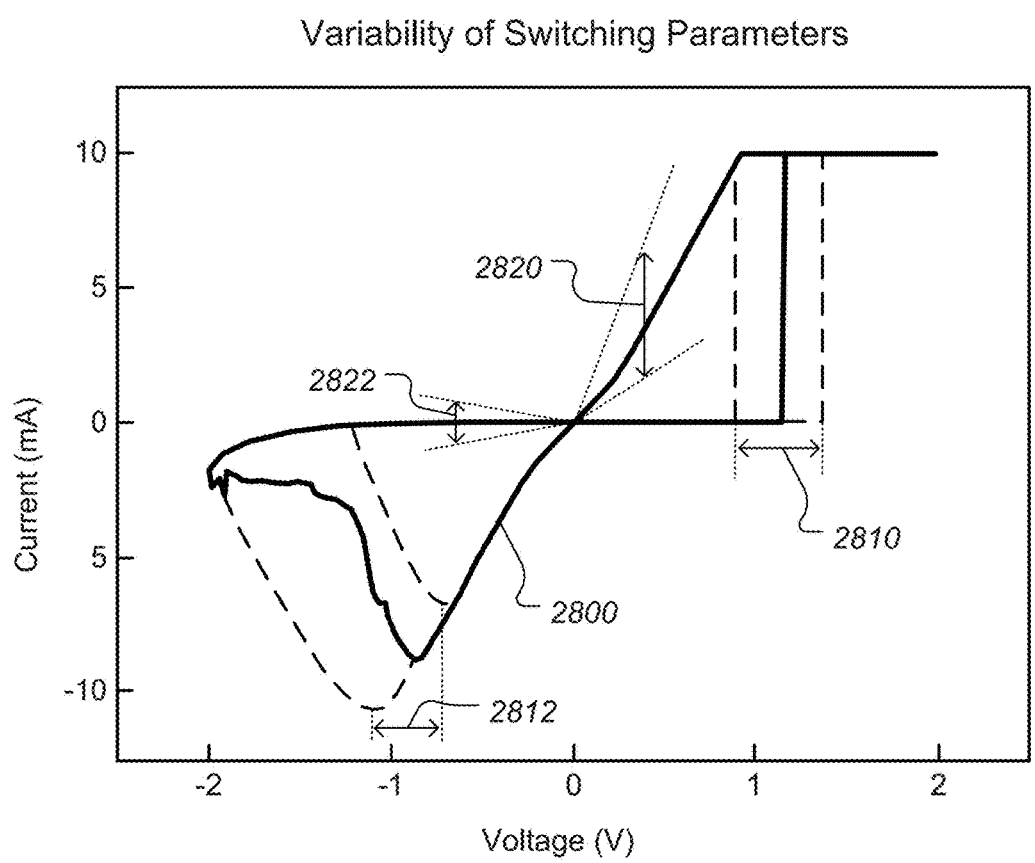
FIG. 28 is a diagram illustrating variability of switching parameters, according to known RRAM forming processes.

FIG. 28 is a diagram illustrating the variability of switching parameters, according to known RRAM forming processes. FIG. 28 is adapted from "A Two-Step Set Operation for Highly Uniform Resistive Switching ReRAM by Controllable Filament," Sangheon Lee et al, Sep. 18, 2013, ESSDERC 2013 in Romania. Due to the haphazard nature of the filament formation using known forming processes where a breakdown voltage is applied between the top and bottom electrode, the switching parameters of the RRAM often exhibit variability in $V_{set}$ 2810, the voltage where the RRAM goes from HRS to LRS, the variability of the value of the LRS 2820, the slope which is the resistance, the variability of the HRS slope 2822 and the variability of the $V_{reset}$ 2812 which is the voltage to go from LRS to HRS. In comparison according to many embodiments described herein, using purposely introduced defective paths/channels, which are created by ion implantation, electron beam, electromagnetic radiation, ultrasound, heat, and/or built-in stress, the variability of the switching parameters can be greatly reduced.

Figure 29A:
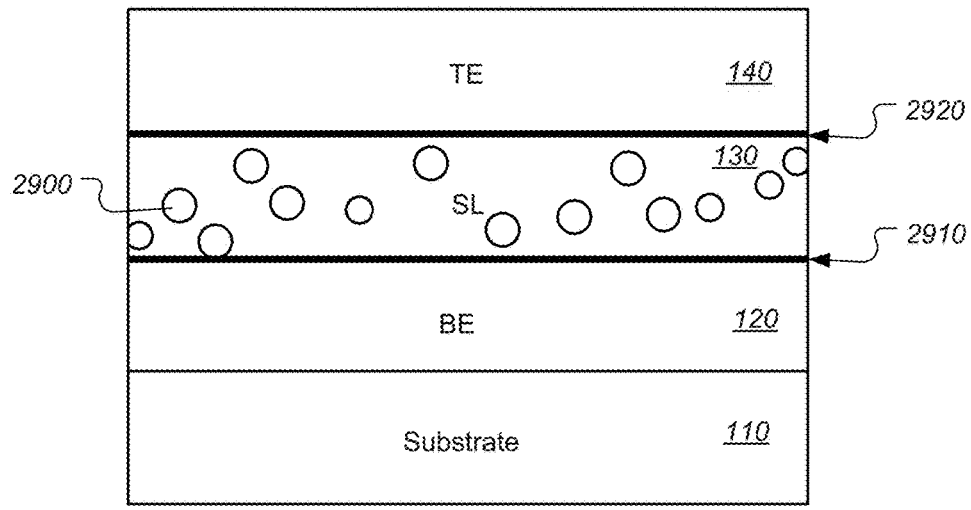
FIGS. 29A and 29B are diagrams illustrating aspect of RRAM processing, according to some embodiments.
Figure 29B:
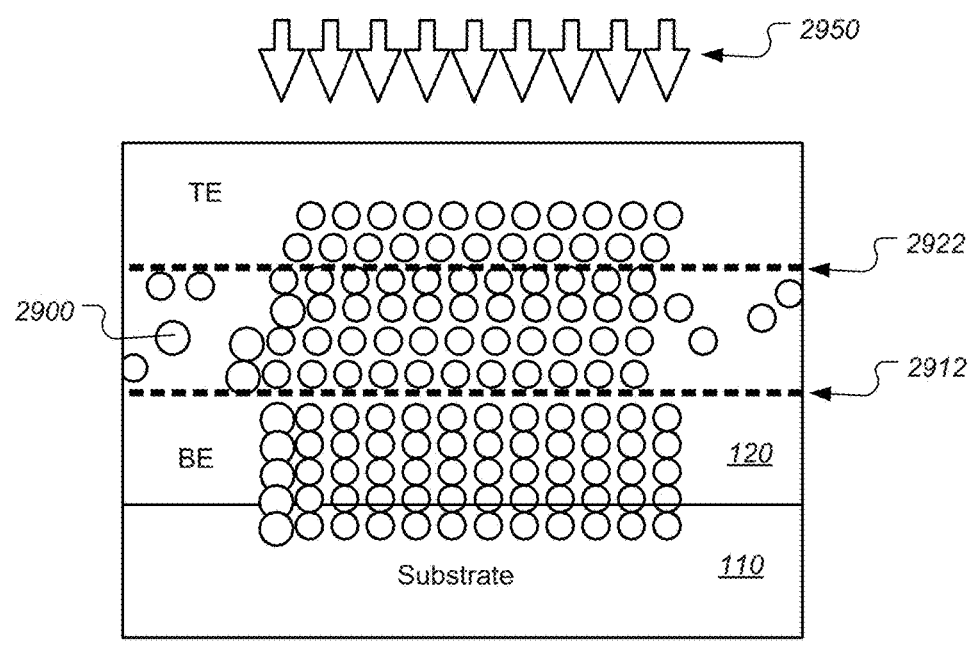

FIGS. 29A and 29B are diagrams illustrating aspect of RRAM processing, according to some embodiments. As the RRAM undergoes processing, the interfaces of the BE 120 and switching layer(s) 130 are exposed to processing environments, such as photoresist stripping, dry/wet etching, wafer handling between processing equipment, and/or breaking vacuum. Some or all of these steps can cause an unintentional barrier layer (UBL) 2910 to form at the interface between the BE 120 and SL 130, and an UBL 2920 between SL 130 and TE 140. These UBLs 2910 and 2920 can be an oxide, an organic layer such as residual from the photoresist processing, pump oil residue, contaminants due to redeposited material in a vacuum chamber during plasma etching, to name a few, and can be a barrier that can impede electric current flow. According to some embodiments, these UBLs 2910 and 2920 are disrupted by ion implantation 2950 through the TE 140 and into the RRAM device. According to some embodiments, implantation can be to the BE 120, and/or the substrate 110. The disrupted UBLs are shown by the dotted dark line 2912 and 2922 in FIG. 29B. The disruption of the UBLs allow the flow of current and the formation of the filaments for RRAM operation where vacancies, ions and/or electrons can migrate, diffuse, drift, hop along the defect paths formed by ion implantation. The circles represent defects, such as defect 2900. Note that prior to ion implantation as shown in FIG. 29A, some native defects exist. After ion implantation the defect concentration increases, as shown in FIG. 29B. The circles can also represent ions implanted such as metal and non-metal ions.

Figure 30A:
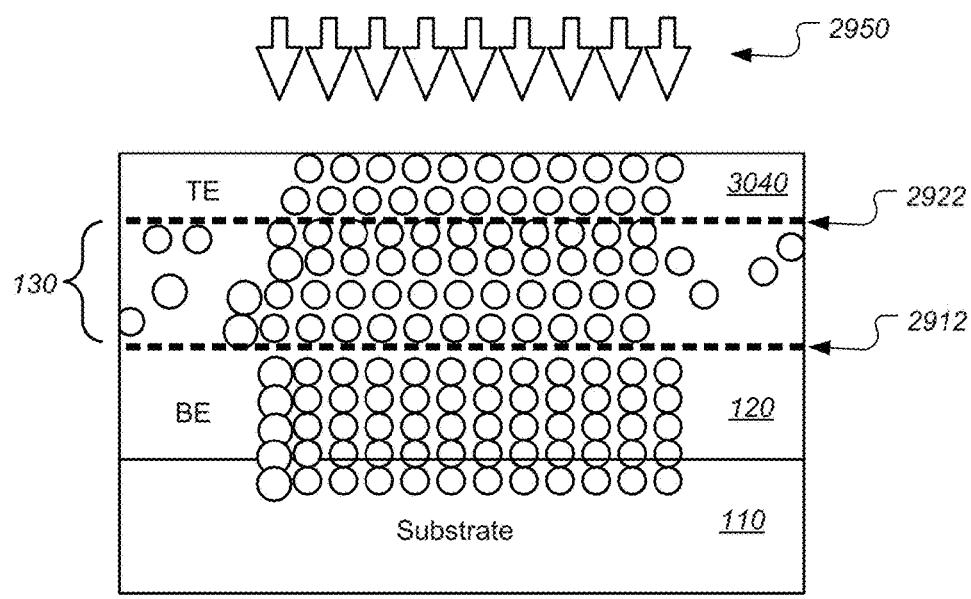
FIGS. 30A and 30B are diagrams illustrating forming a thin TE for ion implantation followed by forming a thicker TE, according to some embodiments.
Figure 30B:
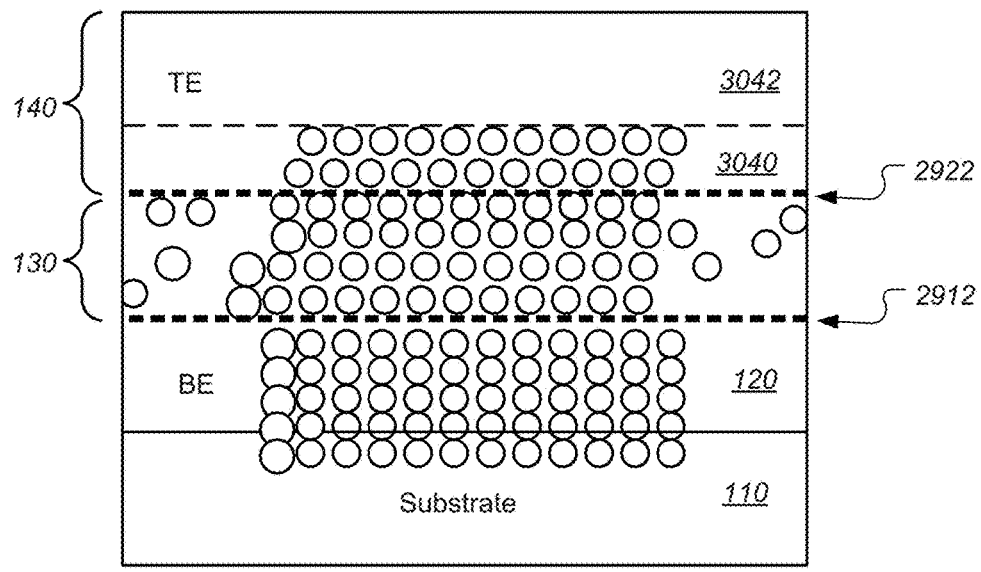

FIGS. 30A and 30B are diagrams illustrating forming a thin TE for ion implantation followed by forming a thicker TE, according to some embodiments. In FIG. 30A a thin TE 3040 can be used for ion implantation through the RRAM structure to reduce the energy that the ions need to penetrate through the TE 3040, SL(s) 130, BE 120 and/or substrate 110. The thinned TE 3040 can have a thickness ranging from less than 10 nm to over 100 nm. The UBLs that forms between the BE 120 and SL 130 (UBL 2910 in FIG. 29A) and between SL 130 and TE 3040 (UBL 2920 in FIG. 29A) may be formed as described above. The UBLs are then disrupted by ion implantation 2950 through the thin TE 3040 and into the SL 130, BE 120 and/or substrate 110. The disrupted UBLs 2922 and 2912 are shown. The UBLs, which act as current barriers, are disrupted such that their chemical bonds are broken by ion implantation into those regions and/or ions passing through those regions. Metal, oxygen, non-metal ions can be implanted or traverse through the interface. In addition, ions in thin TE 3040 and SL 130 can be knocked into the contaminated UBL. The disrupted UBLs 2912 and 2922 can than more easily allow current flow. After ion implantation process, and/or radiation process such as X-ray, the TE 140 can be thickened by adding material 3042 to reduce series resistance.

Figure 31A:
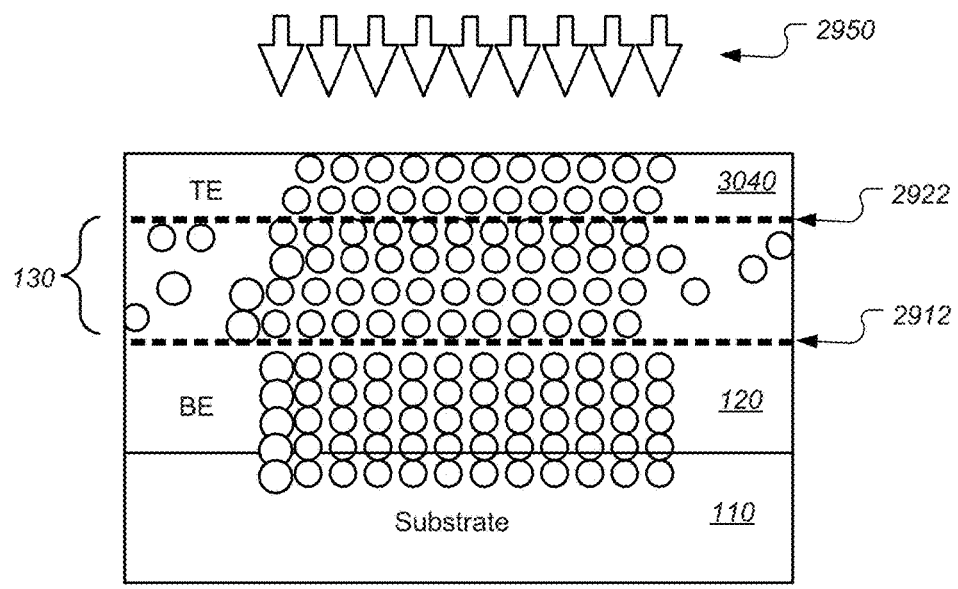
FIGS. 31A and 31B are diagrams illustrating a RRAM structure with top and bottom electrodes made of a combination of metals and semiconductors, according to some embodiments.
Figure 31B:
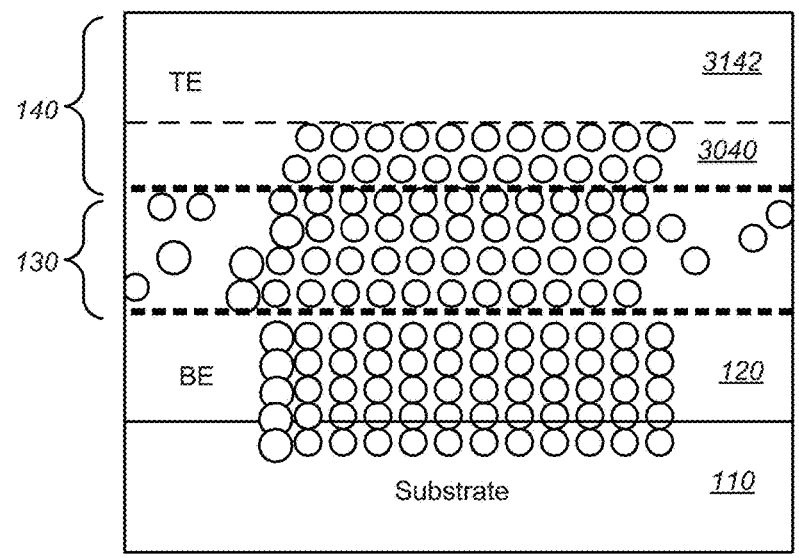

FIGS. 31A and 31B are diagrams illustrating a RRAM structure with top and bottom electrodes made of a combination of metals and semiconductors, according to some embodiments. The TE (both thin portion 3040 and the post-implant thickened TE 140) and BE 120 can be made of a combination of metals and semiconductors, such as silicides (NiSi, PtSi), nitrides (TiN), polycrystalline silicon, highly doped amorphous silicon, and metal layers such as Ti/Pt, Ta/Pt/Au, Ni/Ti and Pt/Ni/Pt. After ion implantation through thin TE 3040, the TE 140 can be thickened with metal 3142, such as Al for example, to reduce series resistance as shown in FIG. 31B.

According to some embodiments, ion implantation and/or irradiation create defects that disrupt the interfacial UBLs and allow current to pass more easily. Ion implantation can further introduce both metal and non-metal ions into the unintentional interfacial UBLs and/or knock ions from the TE and SL into the UBLs, disrupting them and allow current to more easily flow. According to some embodiments, the RRAM is manufactured without the prior art forming voltages and accompanying high current that can damage the RRAM and reduce its reliability.

Some references, e.g. U.S. Pat. Nos. 8,062,918, 8,420,478, 8,465,996, 8,872,151 discuss implanting ions partially into the SL to increase defect concentration. However, those references propose implanting ions before the TE is formed which allows a UBL to form at the interface between the SL and TE. The UBL thickness can be a large fraction of the switching layer. For example, the switching layer can have a thickness as low as 2 nm, while a UBL can have a thickness in the range of 1-20 nm. Thus, a UBL can drastically change the characteristics of the switching layer with its thickness and composition. The UBL can be considered a contamination. This necessitates a further forming process that decreases the reliability of the RRAM and increases its variability. In addition, the references teach implanting the ions/defects such that they remain predominantly in part of the SL. Since the implanted ions/defects do not in large part reach into the interface of the SL and BE, those techniques would be ineffective at disrupting a UBL which may exist between the SL and BE. By not effectively disrupting the UBLs on either side of the SL, a high forming voltage may be needed to break through the barrier.

U.S. Pat. No. 8,809,159 discusses a thin TE of 20 nm that is transparent to radiation that can be formed prior to irradiation. The transparent TE is required since very low energy is used for irradiation and need to irradiate through the TE and into the SL. This low energy of tailoring the irradiation primarily in the SL results in non-uniform distribution of defects and may not disrupt a UBL formed at the SL and BE interface.

According to some embodiments, ion implantation/irradiation into and/or through the unintentional barrier layer(s) (UBLs) is performed using ions with multiple implant energies, each being tailored for the TE, UBLs, SL, BE, and/or through the UBLs and into the BE and/or substrate. No further critical interfaces that can unintentionally impede current flow are formed after the ion implantation process and irradiation process.

According to some embodiments, multiple energies of implanted ions range from Kev to over MeV. For example, protons can be implanted to 2 microns at 200 KeV that for a single layer RRAM crossbar architecture puts the bulk of the protons into the substrate. The transit of the protons through the TE, SL and BE and into the substrate create a uniform distribution of defects channel/paths for the vacancies, ions, and/or electrons to migrate and form a filament. Other ions besides protons can be used, including metal and/or non-metal ions. Greater uniformity of performance across an entire chip that includes larger numbers of RRAM cells can be achieved by uniformly creating enhanced channels in the switching layers through the use of radiation and/or ion implant damage.

Figure 32:
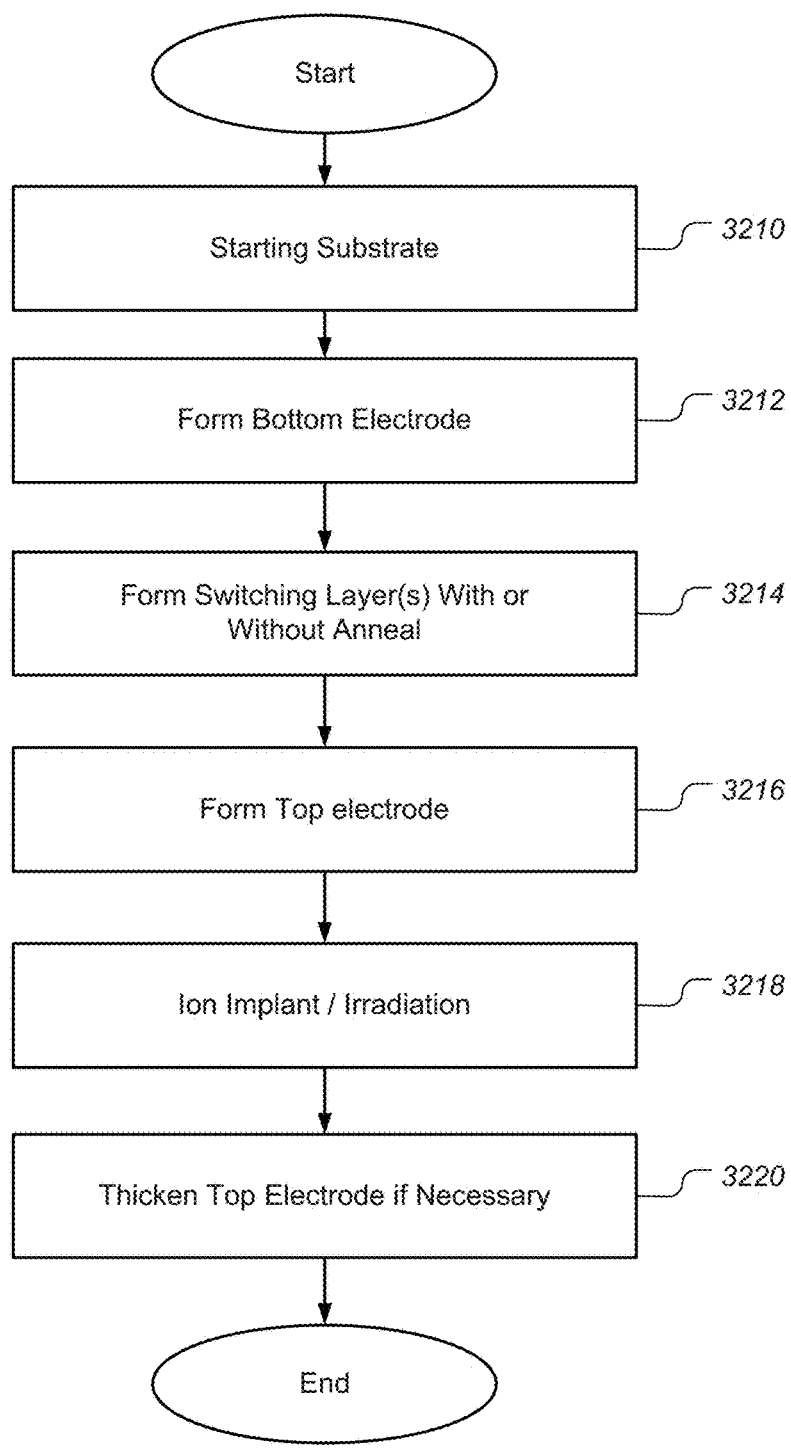
FIG. 32 is a flow chart illustrating processing blocks for a basic RRAM, according to some embodiments.
Figure 33A:
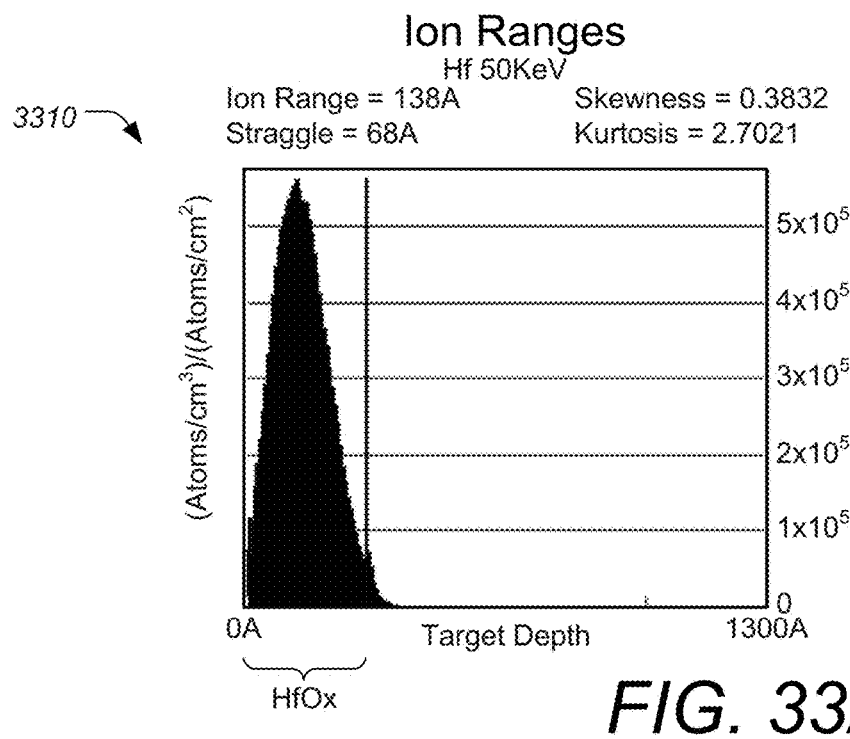
FIGS. 33A-33D are plots illustrating simulated result of Hf ions implanted according to a known technique.
Figure 33B:
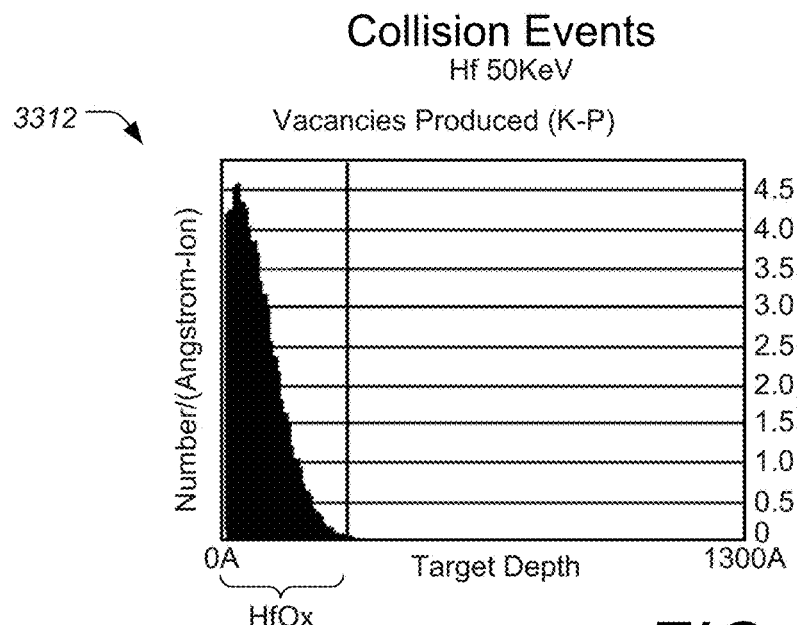
Figure 33C:
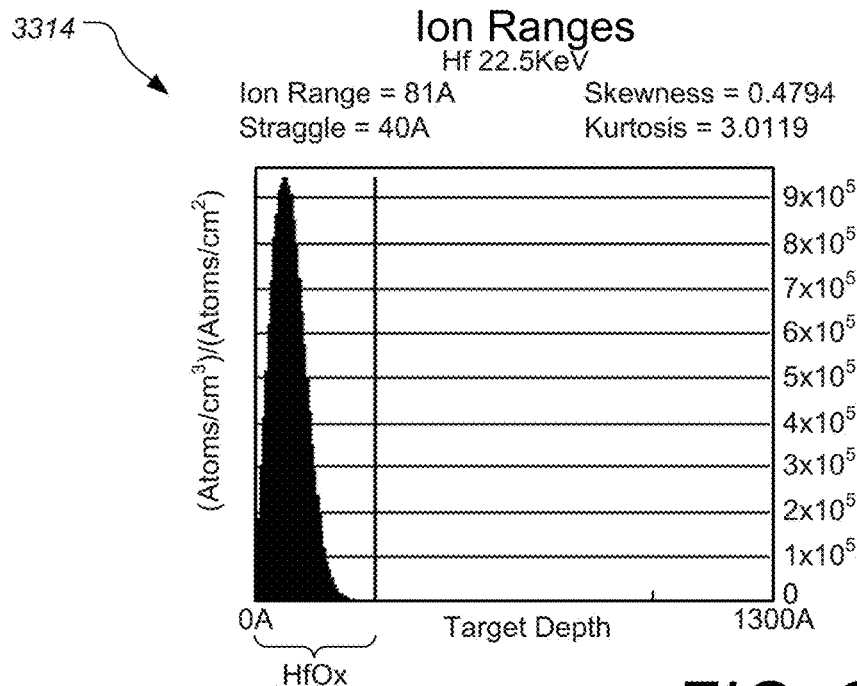
Figure 33D:
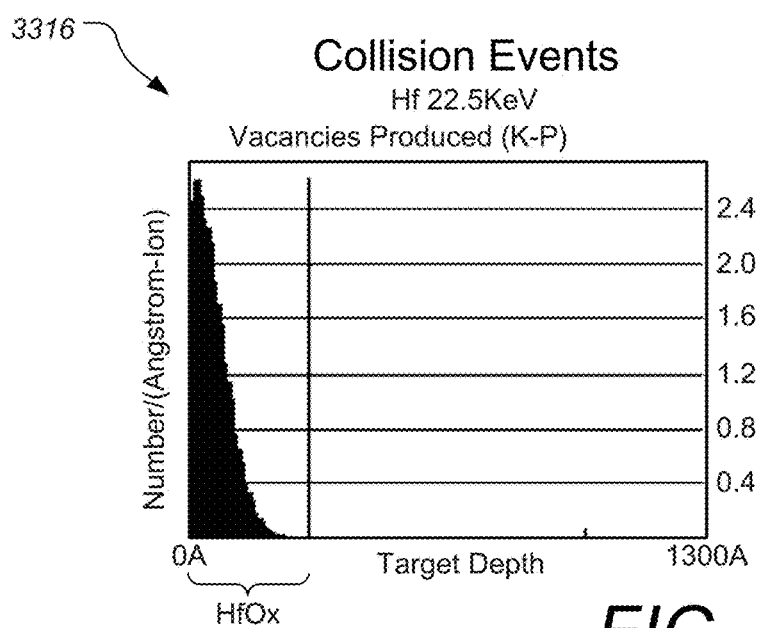

FIG. 32 is a flow chart illustrating processing blocks for a basic RRAM, according to some embodiments. Processing steps for a RRAM device/crossbar are shown starting with block 3210 where the substrate may contain CMOS integrated circuits of active and possibly passive devices to interface with the RRAM to other information processing units such as CPUs. In block 3212 the bottom electrode is formed, followed in block 3214 in which switching layer(s) are formed. According to some embodiments, the switching layer can also include resistors, tunnel and/or diode layers. In block 3216 the top electrode is formed. Ion implantation and/or irradiation is (are) performed through the entire RRAM structure in block 3218. In the case of stacked RRAM architectures, the implantation or irradiation of block 3218 can be through the entire stacked RRAM structure with sufficient energy to penetrate the RRAM and/or the entire RRAM stack. According to some other embodiments, intermediate implantation/irradiation steps can be carried out following the formation of one or more stack layers. In block 3220, the top electrode is thickened, if desirable. The ion implant and/or irradiation of block 3218 may consist of multiple energies, doses and different ions, electrons, and protons. According to some embodiments, a uniform distribution of defect channels extends from the top electrode, through the switching layer(s) and into the bottom electrodes and/or into the substrate. With proper masking of areas to be exposed to radiation and/or ion implantation (selective area irradiation and/or ion implantation), the entire silicon wafer is irradiated and/or ion implanted which is conducive to high volume silicon wafer processing.

According to some other embodiments, the device is irradiated in situ. That is, irradiation is performed after the deposition of the BE, the SL and the TE, for example as shown in FIG. 32. According to some embodiments, high dose (from 100 rad to 10 million rad in silicon) electromagnetic radiation, such as X-rays in the range of about 3 KeV to about 100 KeV, is used to create a more uniform channel of defects through the SL. One rad in silicon, or 1 rad (Si), is generally defined as 100 ergs energy absorbed per gram of silicon. In general, higher radiation, at higher Kev energies, with greater depth penetration, whether in the form of ions, X-rays, gamma-rays, or electrons, can provide more uniform defects in a thin layer such as the SL, especially in the presence of a much thicker top layer TE. This high uniformity in defects, which provides low variation to operating performance, in the SL is important to the manufacturing of a device with very large number of elements. This in situ irradiation as shown later with high energy electromagnetic radiation or ions, could be carried out in a simple one-layer RRAM structure, in a multiple layer stacked cross bar RRAM structure, or a vertical RRAM structure. For the multiple layer stacked and vertical RRAM structures, even higher irradiation energies can be used as described elsewhere herein.

In the following section, we describe a practical device having uniform defects generated in the SL in situ with thick top electrode TE (e.g. over 100 nm), using electromagnetic radiation. More specifically, according to some embodiments, x-ray radiation with photon energies ranging from 3 Kev to 100 Kev is used. There have been prior impractical attempts at generating defects in the SL with electromagnetic irradiation. For example, one prior art proposal, U.S. Pat. No. 8,809,159, discusses the use of very low radiation photon energies (wavelengths of 200-600 nm or 6.2 to 2.1 ev), resulting in extremely narrow range of depths of defect generation in the SL. This low-energy approach also necessitates that the irradiation is preformed before the top electrode is deposited or using a very thin layer of top electrode (10 to 20 nm in thickness). This is an impractical approach, which could result in large defect variations in SL from relatively small thickness variations in SLs and/or TEs across the chip. Such prior proposals also cannot provide in situ irradiation of a multiple layer cross bar structures or vertical structures. According to some embodiments a thick TE on the order of 100 nm or more is followed by irradiation with energies 100 to 1000 times higher than those used in U.S. Pat. No. 8,809,159.

FIGS. 33A-D are plots illustrating simulated result of Hf ions implanted according to a known technique. U.S. Pat. No. 8,872,151 discusses implanting Hf ions into a 30 nm HfOx switching layer without a top electrode at 50 KeV and 22.5 KeV. The plots 3310, 3312, 3314 and 3316 are Monte Carlo simulations of these conditions. As can be seen, the vacancies generated within the switching layer are very non-uniform. This non-uniformity with areas devoid of vacancies can cause inconsistent and irreproducible RRAM switching characteristics and requires further forming to initiate switching, as volumes without vacancies will require forming to generate vacancies. Forming may also be required to break the UBLs between the HfOx and the bottom electrode, and between the top electrode and the HfOx that is deposited after the ion implantation process. Non-uniformity of the vacancy concentration is over 95% within the switching layer. This non-uniformity can cause constrictions in the vacancy concentration resulting in mobility degradation that can eventually lead to RRAM failure after many cycles between HRS (high resistance state) and LRS (low resistance state). Lower concentration of vacancies can also lead to low vacancy mobility and lower conductivity.

Figure 34:
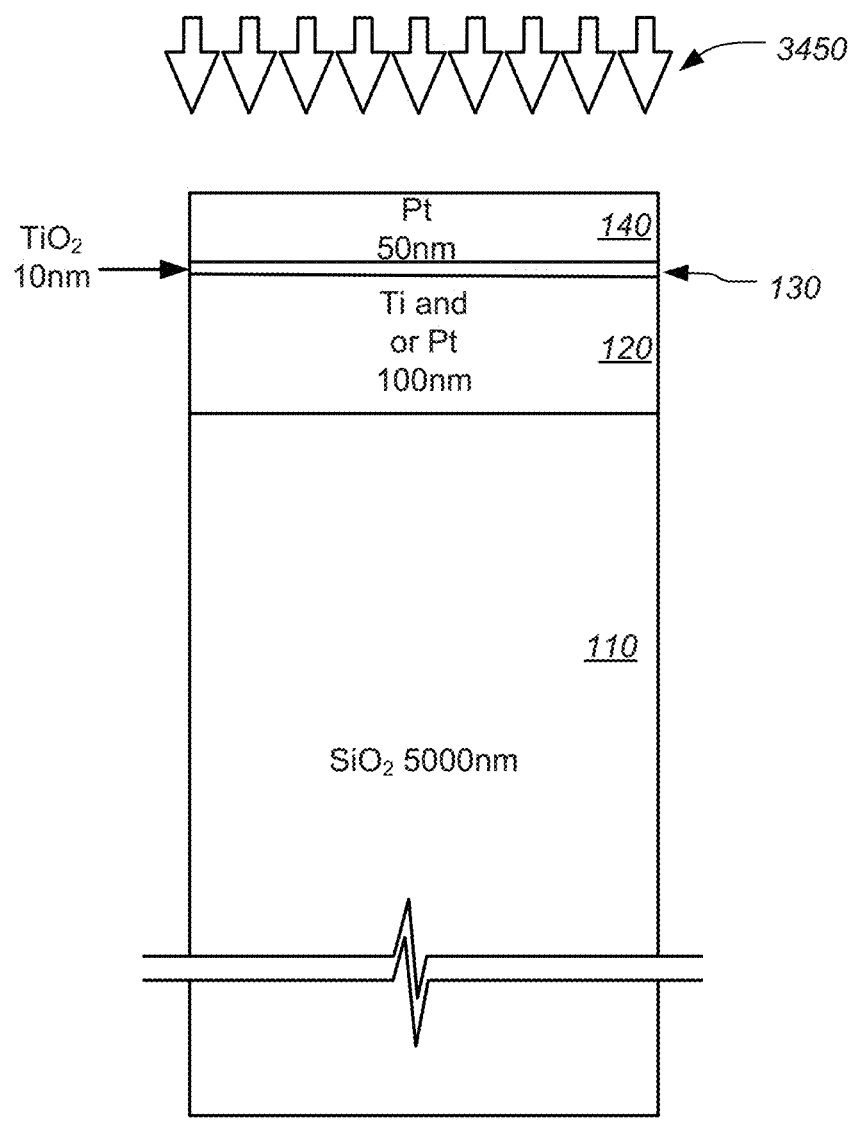
FIG. 34 is a diagram illustrating relative thicknesses of an example of a simple RRAM structure, according to some embodiments.
Figure 35A:
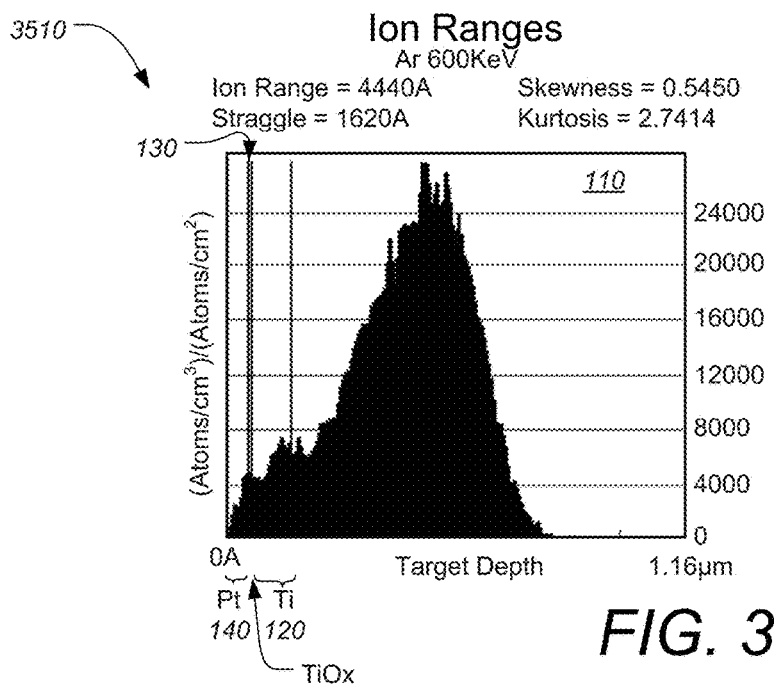
FIGS. 35A-35D are plots illustrating simulation results of Ar ions implanted into a structure as shown in FIG. 34 at 600 KeV, according to some embodiments.
Figure 35B:
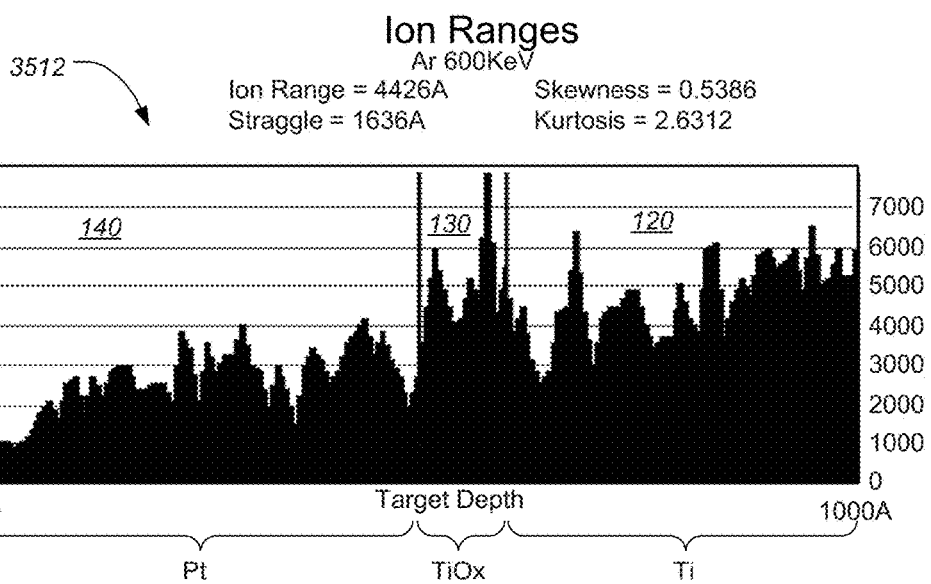
Figure 35C:
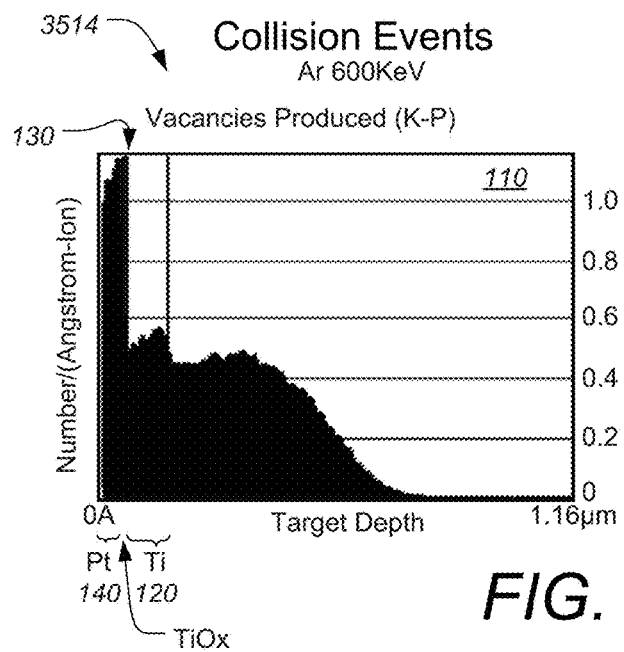
Figure 35D:
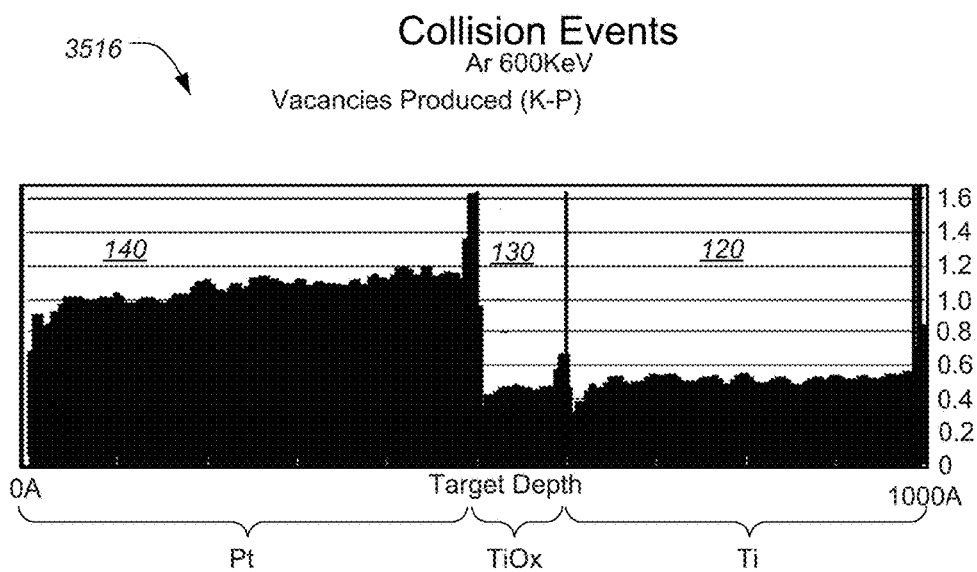
Figure 36A:
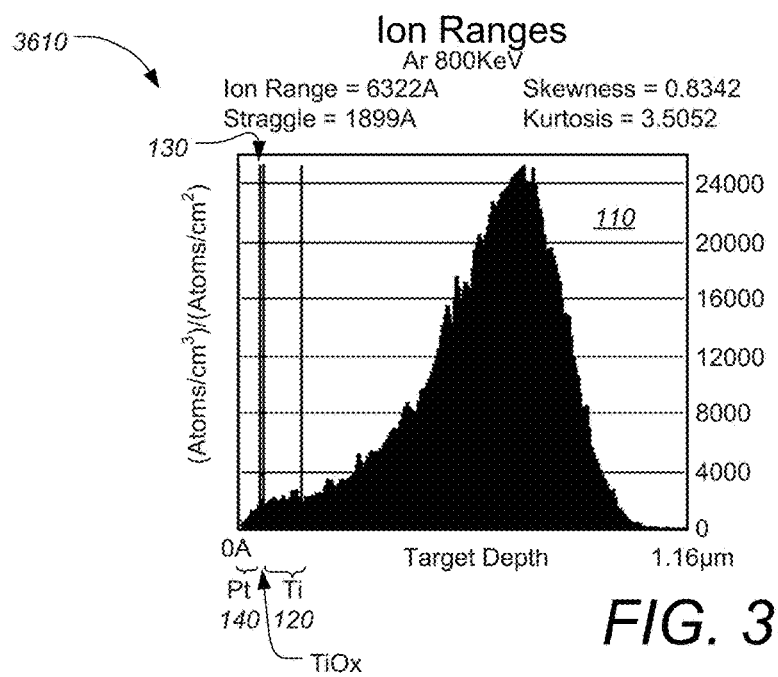
FIGS. 36A-D are plots illustrating simulation results of Ar ions implanted into a structure as shown in FIG. 34 at 800 KeV, according to some embodiments.
Figure 36B:
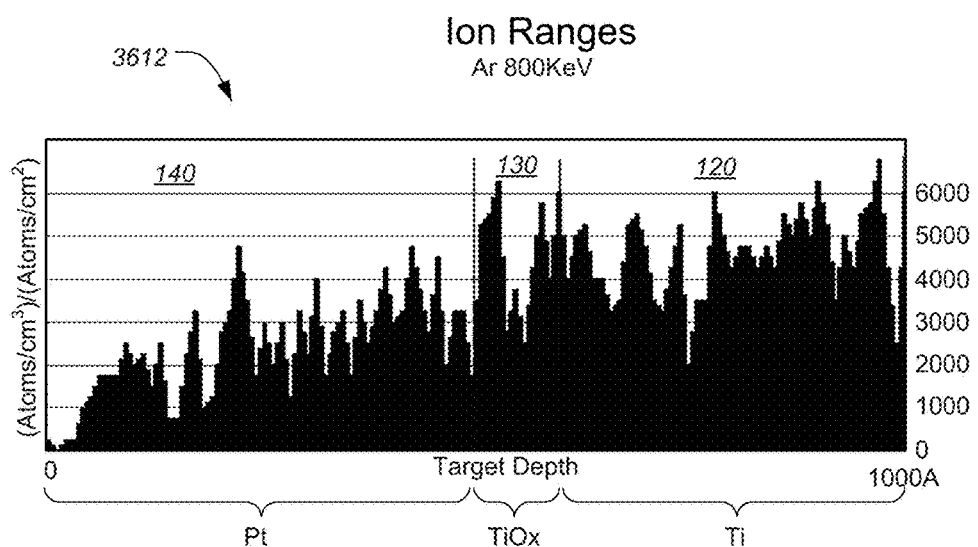
Figure 36C:
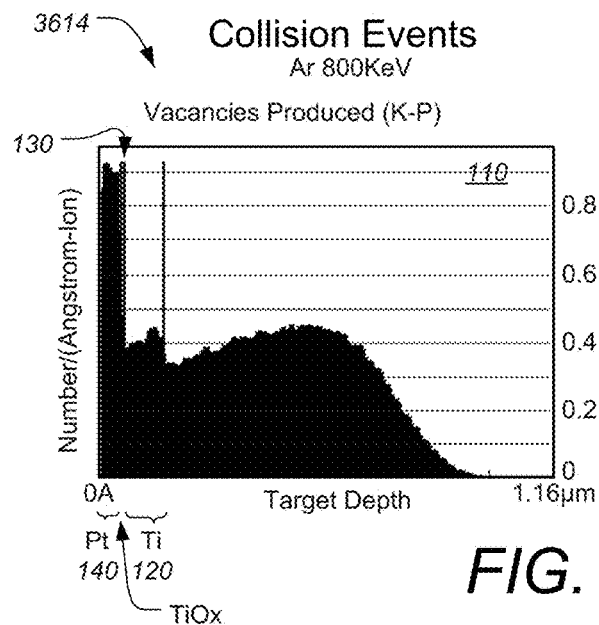
Figure 36D:
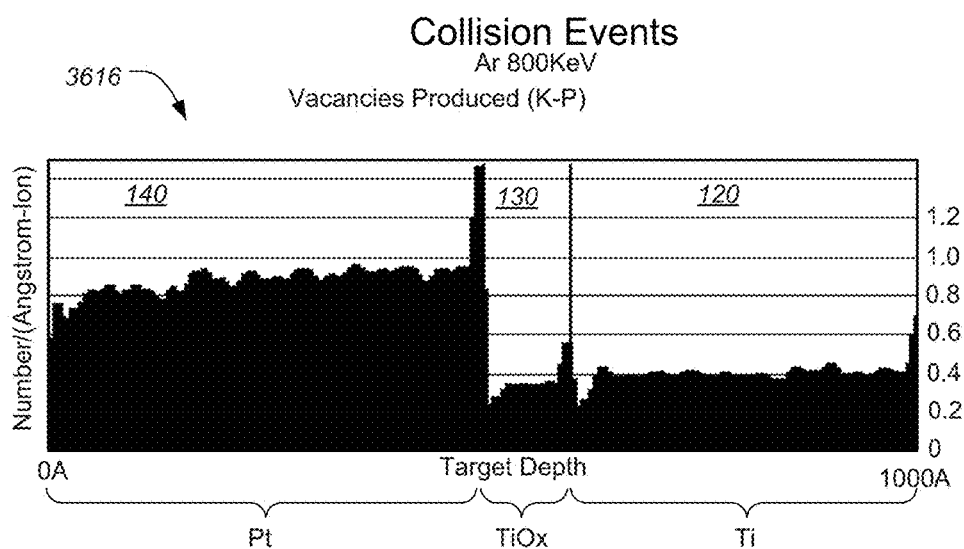
Figure 37A:
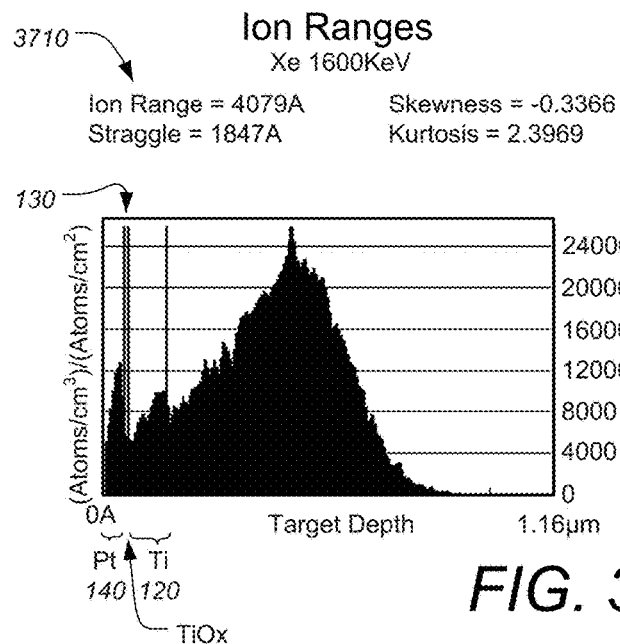
FIGS. 37A-D are plots illustrating simulation results of Xe ions implanted into a structure as shown in FIG. 34 at 1600 KeV, or triply ionized and accelerated at 533 KeV, according to some embodiments.
Figure 37B:
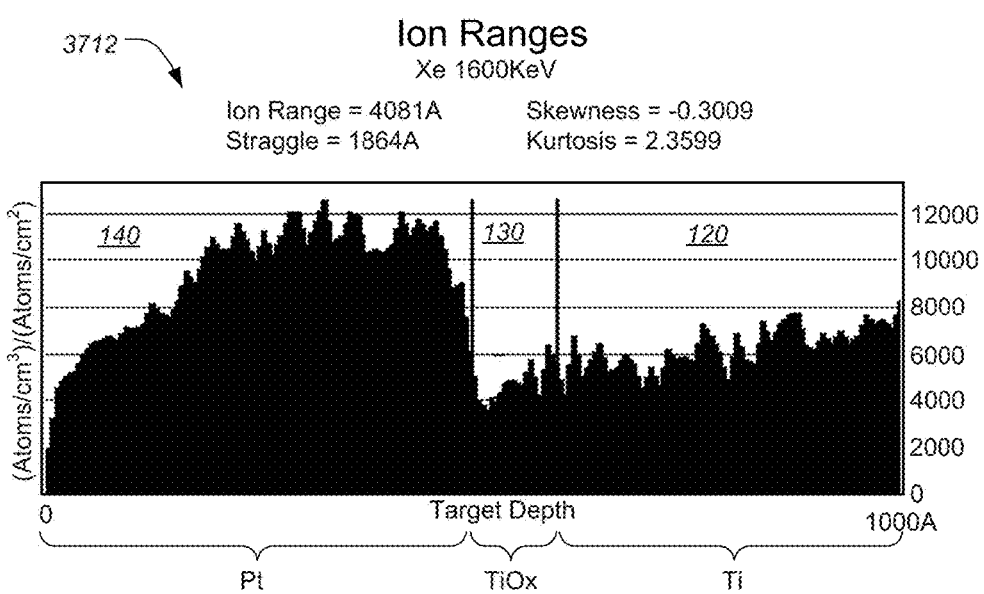
Figure 37C:
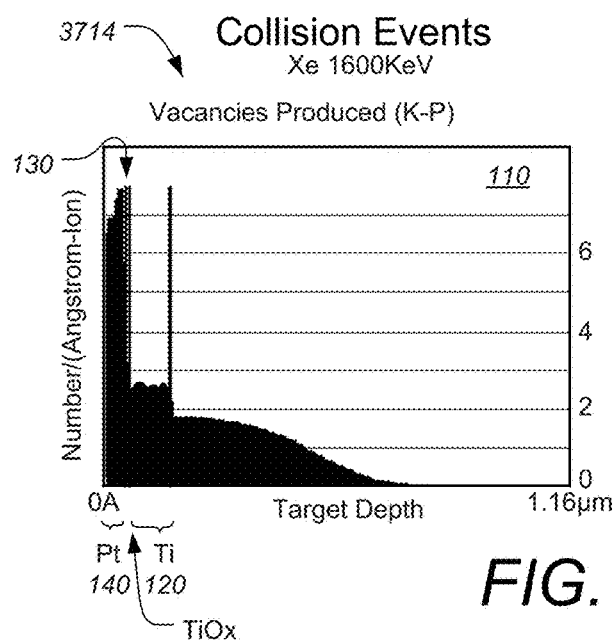
Figure 37D:
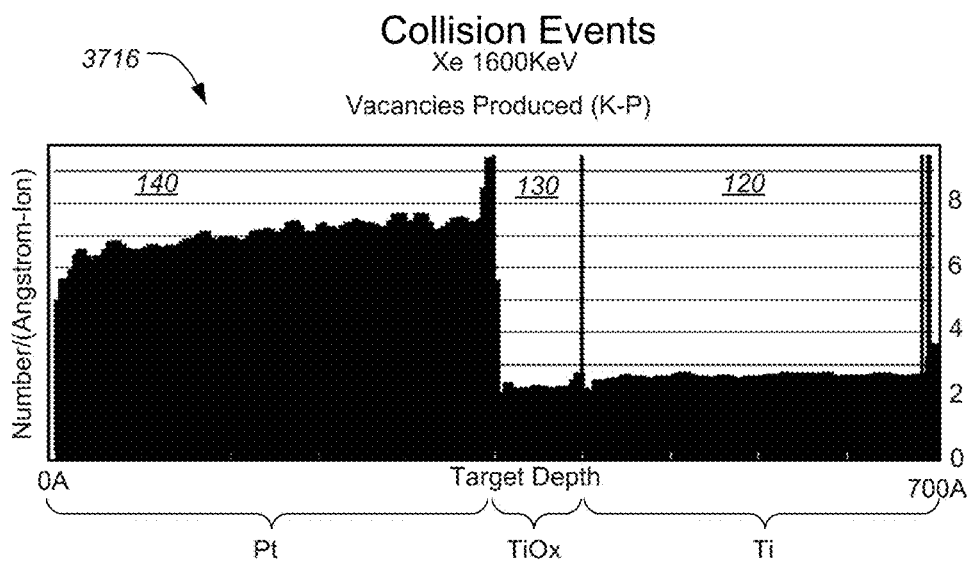
Figure 38A:
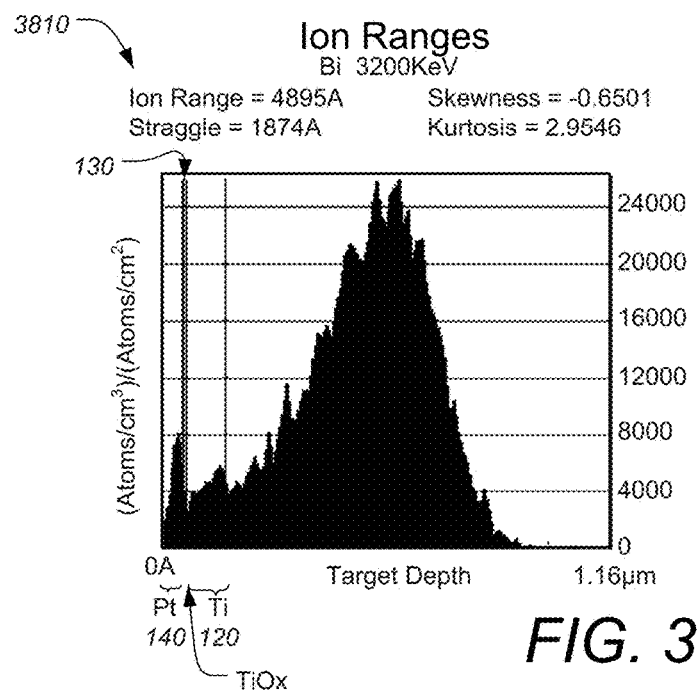
FIGS. 38A-D are plots illustrating simulation results of Bi ions implanted into an example structure as shown in FIG. 34 at 3200 KeV, according to some embodiments.
Figure 38B:
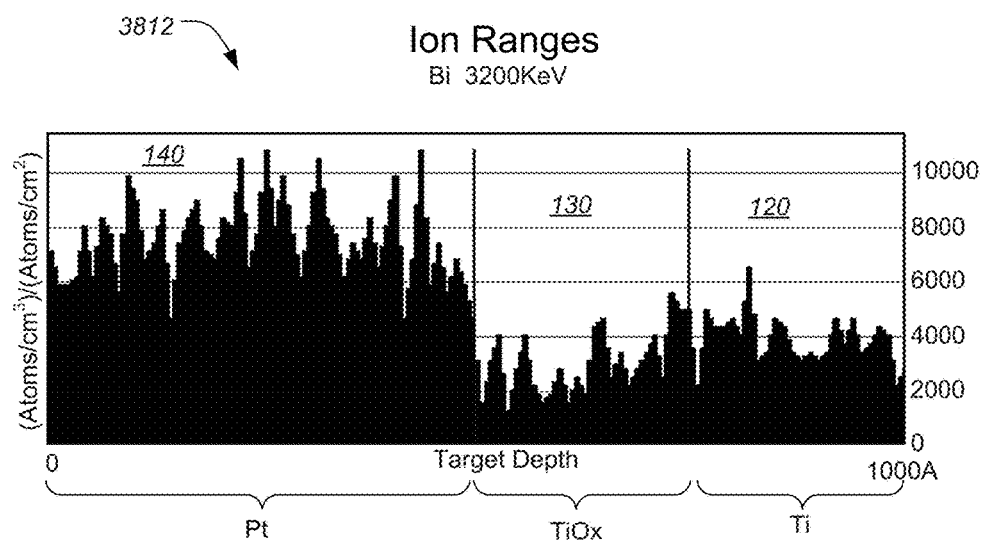
Figure 38C:
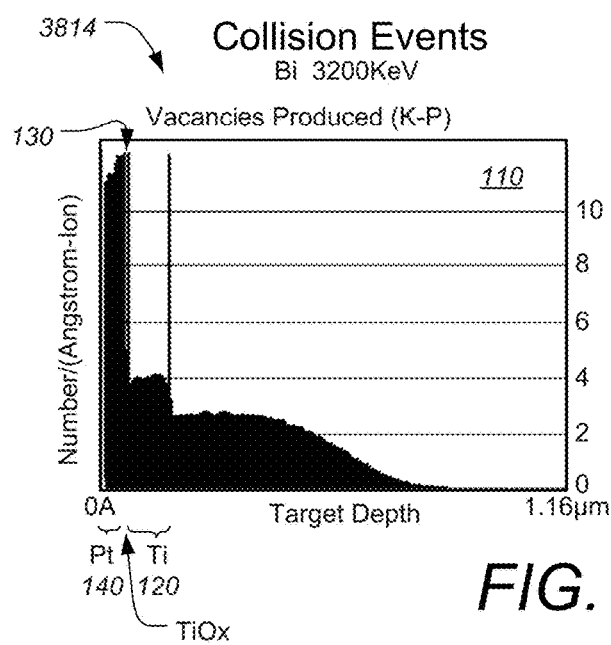
Figure 38D:
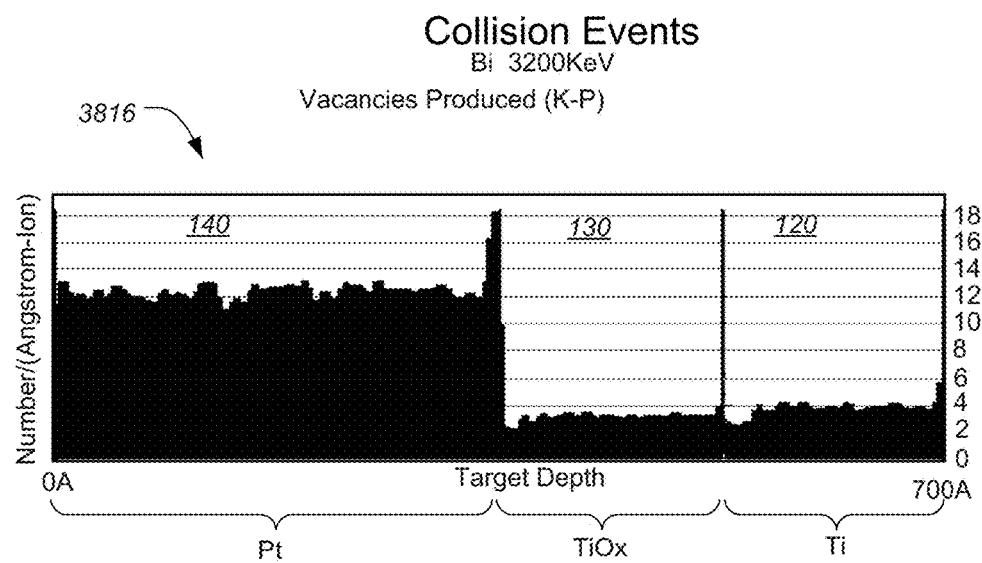

FIG. 34 is a diagram illustrating relative thicknesses of a simple RRAM structure of the electrodes and the switching layers, according to some embodiments. TE 140 is 50 nm of Pt; SL 130 is 10 nm of TiOx; BE 120 is 100 nm of Ti (or in some cases Pt); and substrate 110 is 5000 nm of $SiO_2$. Implantation process 3450 can be performed using a variety of ion species, a variety of implant energies and a variety of doses. Several implant scenarios into the structure shown in FIG. 34 were simulated and the results are illustrated in FIGS. 35A-D, 36A-D, 37A-D and 38A-D. It has been found that providing a relatively deep implant process, such that the bulk of ions are implanted well into the substrate 110, results in greatly increased uniformity of the defect profile. This uniform defect profile and the associated uniform vacancy concentration profile greatly increase RRAM reproducibility, reduce RRAM variability and improve RRAM reliability. The vacancy concentration uniformity within the switching layer in this case is better than 10%. According to some embodiments, the bulk of the ions are implanted outside the switching layer, which can provide acceptable vacancy concentration uniformity. According to some embodiments, 90% or more of the ions are implanted outside the switching layer. According to some embodiments, 70% or more of the ions are implanted outside the switching layer. According to some embodiments 50% or more of the ions are implanted outside the switching layer. According to some embodiments, 30% or more of the ions are implanted outside the switching layer. In some cases, 10% or more of the ions are implanted outside the switching layer. Uniformity of the vacancy concentration within the switching layer can range from better than 5% to better than 80% in variations about a mean value. In some cases, the vacancy concentration uniformity can be better than 5% in variation. In some cases it can be better than 10%. In some cases, it can be better than 20%. In some cases, the vacancy concentration uniformity can be better than 30%. In some cases it can be better than 40%-50%. In some cases, the vacancy uniformity can be better than 60-80% in variation about a mean value. According to some embodiments, multiple ion implants with different ion species, energies and/or doses are used to improve the RRAM reproducibility, reduce variability and improve reliability. According to some embodiments, a combination of shallow and deep ion implants are used. For example, a first shallower ion implantation effectively disrupts the UBLs between the TE and SL and/or SL and BE layers. This is followed by a second, deeper implant that is effective in generating a uniform defect profile across the entire SL layer for. Other combinations of ion implantation can also be incorporated into the RRAM manufacturing process, for example implants that convert transition metals to transition metal oxides in situ (nitrides, carbides, fluorides, chlorides, oxides and any combinations thereof are other examples).

FIGS. 35A-35D are plots illustrating simulation results of Ar ions implanted into a structure as shown in FIG. 34 at 600 KeV. The Ar ions can be singly ionized and accelerated at 600 KeV or doubly ionized and accelerated at 300 KeV. As seen in plot 3510, the Ar ion peak is just less than 500 nm into the SiO2 layer. Plot 3512 is an expanded plot of the TE 140, SL130 and the upper part of BE 120. Plots 3514 and 3516 are collision events plots that show the vacancies generated by the implantation. The expanded plot 3516 of the vacancies generated shows good uniformity within the 10 nm thick TiOx switching layer 130 without any voids of vacancies either in the switching layer 130. Further, it can be seen that are no voids of vacancies at the TE 140 to SL 130 interface, and at the SL 130 to BE 120 interface, which is where the UBLs are prone to form. Vacancies are directly proportional to collision events; given approximately by r×collision events×dose×$10^6$/cm$^3$, where "r" can have a value from 1 to 0.01. The value for "r"=1 is chosen for all the following vacancy concentration calculations. If "r" is less than one then the vacancy concentrations can be corrected accordingly with a higher dose. Choosing "r"=1 is approximately correct for heavy ions where each implanted ion collision event will generate a vacancy.

FIGS. 36A-D are plots illustrating simulation results of Ar ions implanted into a structure as shown in FIG. 34 at 800 KeV. In Plot 3610, the Ar ion peak is deeper than 500 nm into the SiO2 layer. Plot 3612 is an expanded plot of the TE 140, SL130 and the upper part of BE 120. Plots 3614 and 3616 are collision events plots that show the vacancies generated by the implantation. The expanded plot 3616 shows that vacancies are generated approximately uniformly within the switching layer 130 with better than 50% uniformity. Not considering the dip and the peak of the vacancy at the TiOx boundary with Pt and Ti that may be an artifact of the simulation, the uniformity of the vacancy concentration in the switch layer is better than 3%. Further it can be seen that are no voids of vacancies at the TE 140 to SL 130 interface, and at the SL 130 to BE 120 interface, which is where the UBLs are prone to form. Ar is an inert ion used primarily to generate vacancies and defects, and to knock electrode ions into the interfaces to disrupt the UBLs that can form during processing which as cause the RRAM device to require a breakdown-level forming process.

FIGS. 37A-D are plots illustrating simulation results of Xe ions implanted into a structure as shown in FIG. 34 at 1600 KeV, or triply ionized and accelerated at 533 KeV. From plot 3710 it can be seen that the ion distribution peak is approximately 500 nm from the surface. Plot 3712 is an expanded plot of the TE 140, SL130 and the upper part of BE 120. From plots 3714 and 3716 it can be seen that the vacancies/defects generated within the switching layer 130 and at the TE/SL and SL/BE interfaces are approximately uniform with variation in the vacancy concentration of less than 10%. Not considering the dip and peak of the vacancy in the switching layer, which may be due to an artifact in the simulation, the uniformity is better than 2%. The approximate uniform distribution and/or distributions without any voids within the switching layer and/or at the interfaces of vacancies/defects within the switching layer and at the interfaces can result in low variability RRAM switching characteristics and improve reproducibility and reliability. Although 1600 KeV of acceleration energy is used in this example, other energies less than or greater than 1600 KeV can also be used. According to some embodiments, multiplied ionized ions can use a correspondingly lower accelerating voltage, and achieve similar depth of implant. The relationship E (energy)=ZeV can be used where Z is the ion charge number, V is the accelerating voltage and e is the electron charge. For example, a triply ionized Ar ions having a 600 KV accelerating voltage will have an energy of 1800 KeV. Also energies where the ion peak lies within the bottom electrode can also be used; consideration is given to any CMOS circuits and/or devices that may be beneath the RRAM and the energies can be tailored to minimize ion implantation into the CMOS.

FIGS. 38A-D are plots illustrating simulation results of Bi ions implanted into an example structure as shown in FIG. 34 at 3200 KeV. From plot 3810 it can be seen that Bi ions are implanted to a depth of approximately 500 nm. Plot 3812 is an expanded plot of the TE 140, SL130 and the upper part of BE 120. Vacancies within the switching layer 130 and at the interfaces are approximately uniform as can be seen in plots 3814 and 3816. Bi ions can be multiply ionized to reduce the acceleration voltage. In addition, energies other than 3200 KeV may be used. For example, Bi ions can be implanted into the bottom electrode and/or top electrode interface, within in the switching layer, and/or at the bottom electrode interface and followed by higher energy Bi and/or other ions implant to generate vacancies without voids and/or approximately uniform vacancies within the switching layer(s) and the interfaces. The uniformity of the vacancy concentration is approximately less than 5%. Not considering portions than might be due to simulation artifacts, better than 2% in vacancy concentration uniformity is achieved. Higher energy ion implantation can also have less variation to uniformity of vacancies, defects, ion distributions due to variations in thicknesses of the RRAM devices that can be caused by processing for example.

Figure 39:
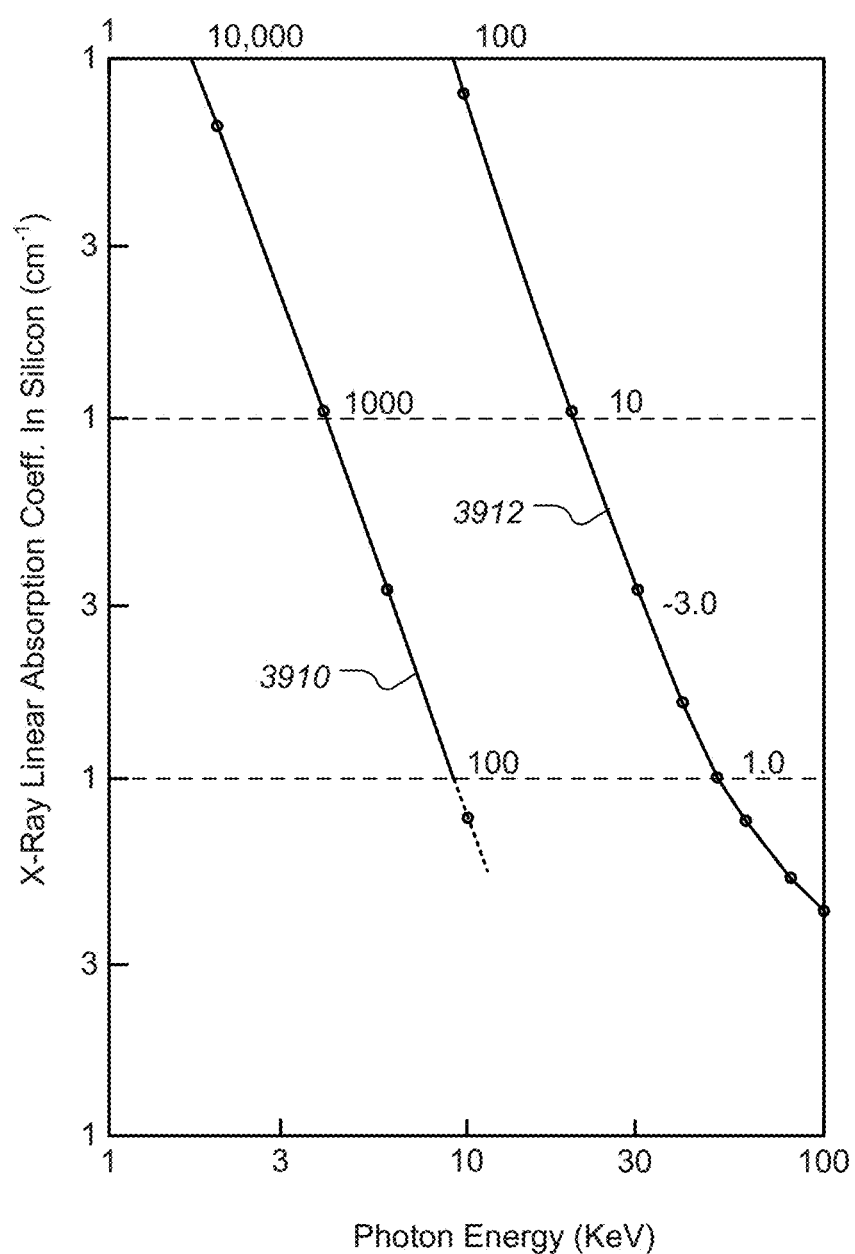
FIG. 39 is a log-log plot illustrating the relationship between X-ray linear absorption coefficient in Silicon (in $cm^{-1}$) and X-ray photon energy (in Kev), for energies between 1 Kev and 100 Kev. The use of high dose electromagnetic irradiation, such as X-rays, are shown to facilitate RRAM manufacture, according to some embodiments.
Figure 45:
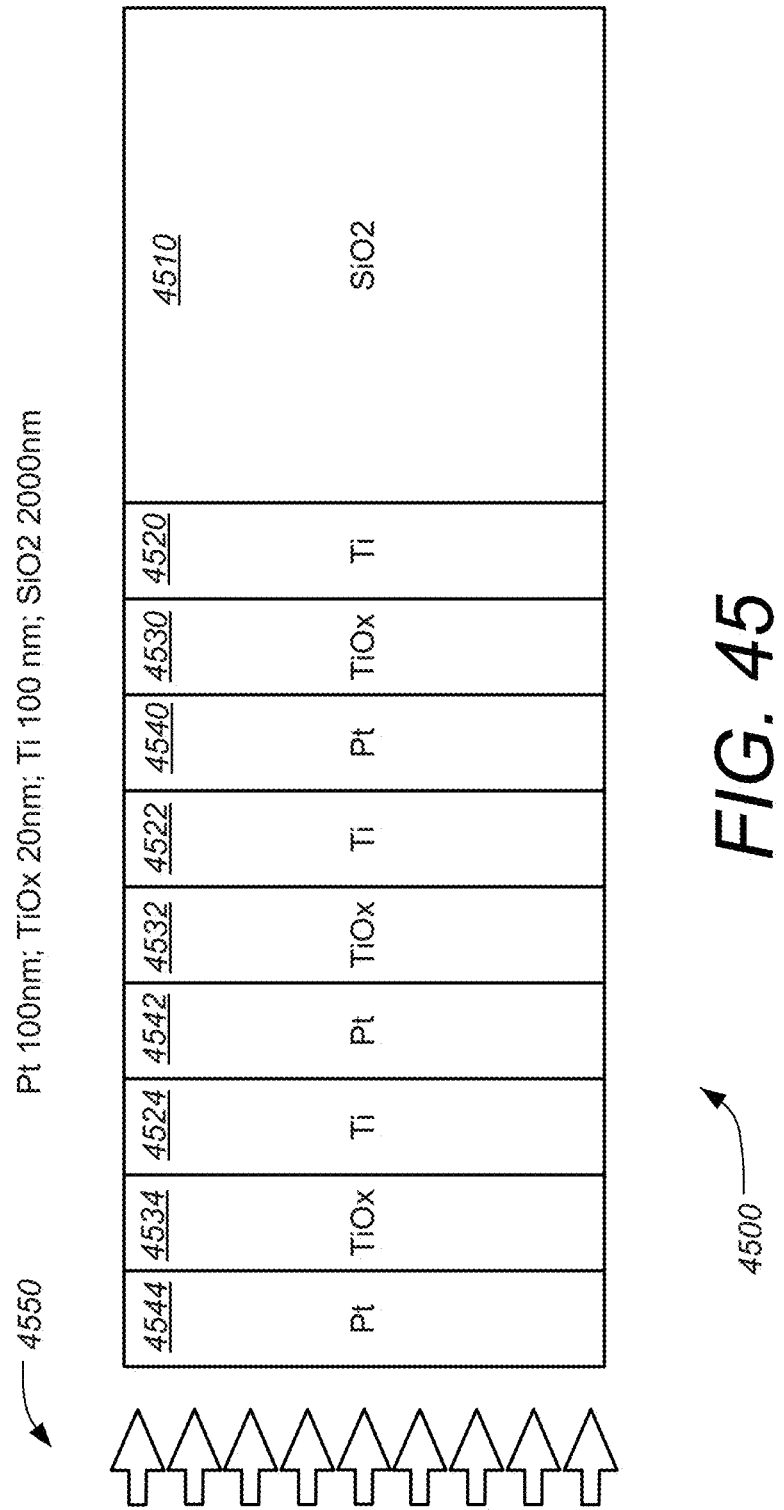
FIG. 45 is a diagram showing a structure of multi-layer of RRAM devices according to some embodiments.

FIG. 39 is a log-log plot illustrating the relationship between X-ray linear absorption coefficient in Silicon (in cm$^{-1}$) and X-ray photon energy (in Kev), for energies between 1 Kev and 100 Kev. The use of high dose electromagnetic irradiation, such as X-rays, are shown to facilitate RRAM manufacture, in the following examples. Electromagnetic irradiation in the range of 100 rad (in Si) to 10,000,000 rad (in Si), such as in the form of X-Rays, can also cause desirable damage in the switching layer(s). In FIG. 39, the linear absorption coefficient in silicon is shown broken into two curves 3910 and 3912 for clarity. For detailed references, see, e.g., NIST X-ray mass attenuation coefficient for Silicon. For X-rays in the 3 KeV to 100 KeV range, the linear absorption coefficient μ is in the range of 1000 to 0.4/cm (or cm$^{-1}$). The absorption (ABS) is then: ABS=1−e$^{-\mu\tau}$ where τ is the silicon thickness in cm. For example, an in situ RRAM device with a thickness of 200 nm or 0.2×10$^{-4}$ cm, and at 26 KeV where μ is 5 cm, then μτ=1×10$^{-4}$ and ABS=0.0001. Thus the ABS is virtually linearly proportional to the RRAM device thickness. A change of several percent in the RRAM thickness changes the ABS by only several percent. Thus this irradiation, in the range of 26 KeV, or 20-30 KeV, is very insensitive to thickness variations and is particularly well suited to in-situ irradiation of stacked cross bar RRAM devices where there is little tolerance for variations. An example of a stacked structure of three RRAM devices is shown in FIG. 45, can be readily irradiated in-situ using the ranges described above. According to some embodiments, in-situ irradiation of RRAM structures having larger numbers of stacked devices is also practical using an energy range of 20-30 KeV. In some examples, stacks of 5 to 15 or more stacked RAMM devices are irradiated in-situ using an energy range of 20-30

Figure 53:
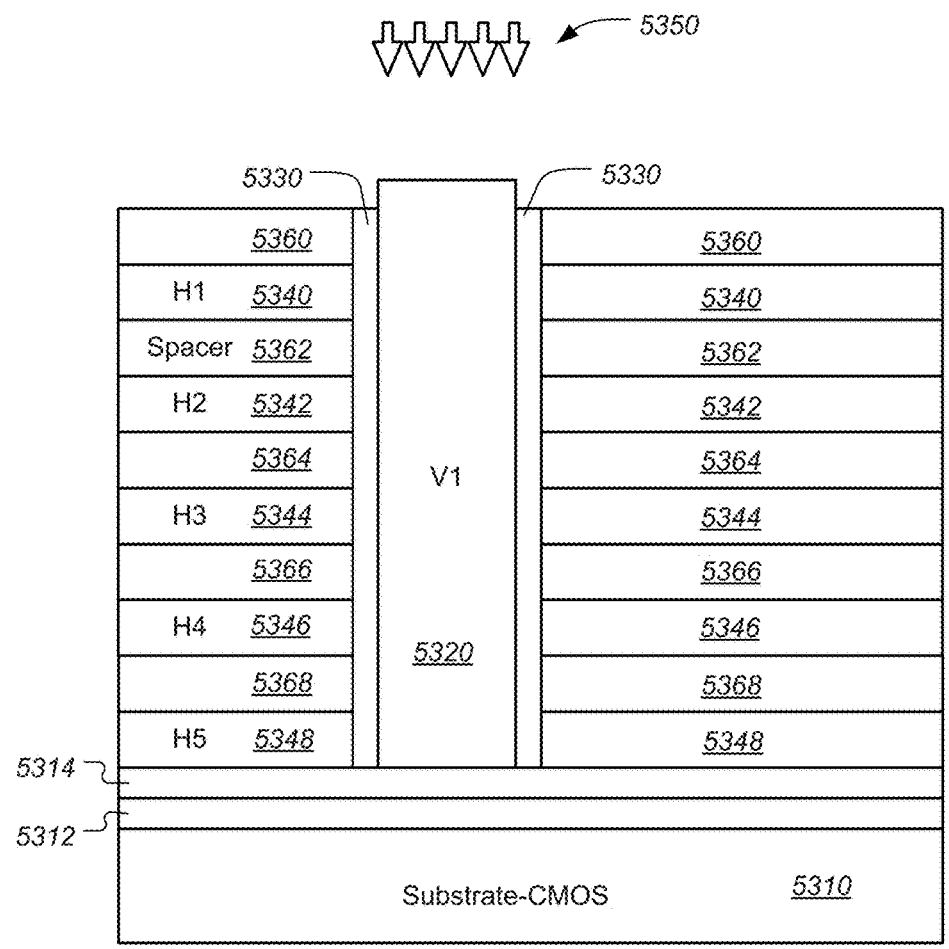
FIG. 53 is a diagram showing a structure of vertically stacked RRAM devices according to some embodiments.

Kev. Vertical RRAM structures, an example of which is shown in FIG. 53, are also well suited for in-situ irradiation using electromagnetic energy, especially in the range of 20-30 KeV According to some embodiments, x-rays can be provided with Bremsstrahlung devices (such as those used for medical purposes), or electron synchrotron devices. Furthermore, since both electrodes are formed prior to the in-situ irradiation of the switching layer, the irradiation can disrupt any UBLs formed unintentionally via contamination during processing.

According to some embodiments, in cases where CMOS may be beneath and/or around the RRAM crossbar, precautions can be taken to mask those sensitive regions to exposure to radiation by a thin layer, e.g. several microns thick, of heavy metal such as W, Ta, Bi, Au and Pb. For example, before starting the construction process of the crossbar, as shown in FIG. 32 in step 3212, a layer of W, Ta, Bi, Au, Pb and/or other metals is first deposited to shield other components that are underneath or around this location. This suggests that impractically thick shielding would be required for x-ray photon energies much beyond 60 KeV. This effect was not appreciated in prior art proposals such as U.S. Pat. No. 8,809,159, where irradiation with Cobalt-60 gamma-rays seems to be suggested. Such highly penetrating radiation would disrupt all components in the device. According to some embodiments, for less stacked and thinner RRAM structures, irradiation with lower energy x-rays, in the range below 10 KeV, may be useful. The benefit of such embodiments would be that a much thinner heavy metal shield can be used.

Figure 40:
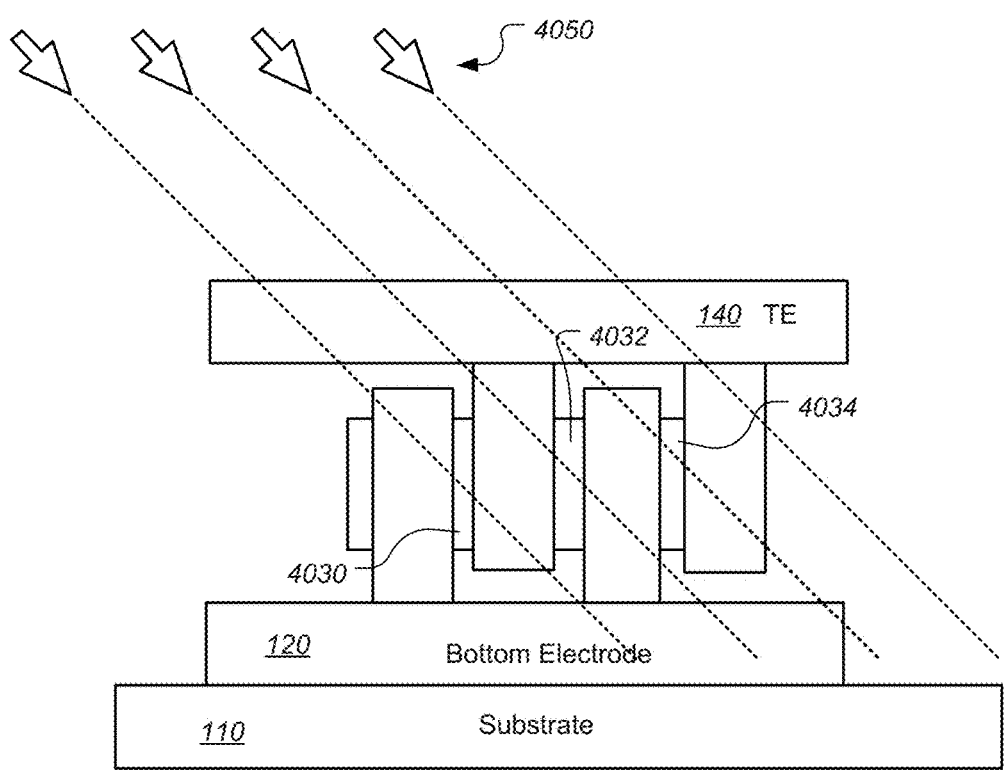
FIG. 40 is a diagram illustrating a simple cross section of a RRAM structure that has the switching layer(s) normal or nearly normal to the substrate, according to some embodiments.

FIG. 40 is a diagram illustrating a simple cross section of a RRAM structure that has the switching layer(s) normal or nearly normal to the substrate, according to some embodiments. In general, RRAM switching layers can be horizontal (parallel to the substrate and/or almost horizontal) and/or vertical (normal to the substrate and/or almost vertical) and any angle from normal to parallel to the substrate. For further details of arranging the switching layers normal to the substrate, see e.g. U.S. Pat. Publ. No. 2015/0090948. Ion implantation and/or irradiation with X-ray/Gamma rays can impinge the RRAM structure at angles ranging from normal to the substrate to off normal, for example from right angle to an acute or obtuse angle to the substrate. In the example shown in FIG. 40, radiation 4050 (e.g. ion implantation and/or radiation) is directed at the RRAM structure at an off normal angle, for example approximately 45 degrees through the top electrode 140 and into the switching layers 4030, 4032 and 4034, into the bottom electrode 120 and/or into the substrate 110. The ion implantation and/or irradiation 4050 can also be normal or almost normal to the substrate 110 and cause vacancies/defects within the switching layer(s) and interface(s). According to some embodiments, the angle of the ion implant or other radiation can range from less than 5 to 80 degrees or more off normal.

Figure 41:
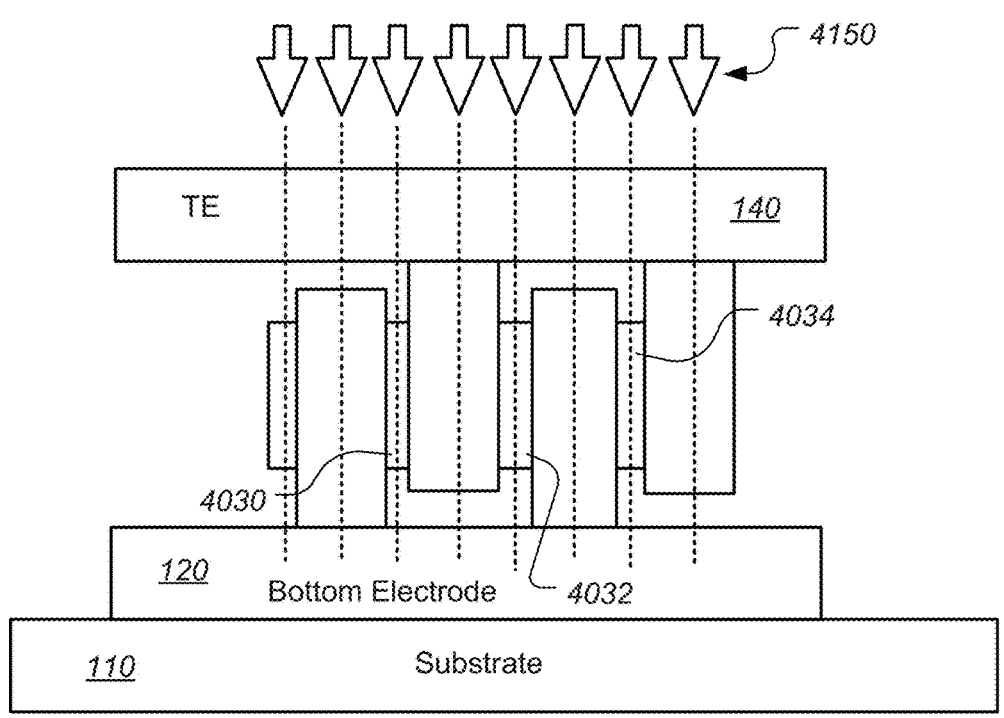
FIG. 41 is a diagram illustrating a cross section of a RRAM structure where the ion implant or other radiation is performed normal or almost normal to the substrate, according to some embodiments.

FIG. 41 is a diagram illustrating a cross section of a RRAM structure where the ion implant and/or other radiation is performed normal or almost normal to a primary planar surface of the substrate, according to some embodiments. The RRAM structure is as shown in FIG. 40. The ion implantation and/or irradiation by X-ray/Gamma rays 4150 can impinge at an angle that is normal and/or almost normal to the primary planar surface of the substrate. The energies are chosen such that the ions and/or radiation generate vacancies/defects through the electrodes and into the switching layer(s) and interfaces, into the bottom electrode and/or into the substrate. In this example, ions and/or radiation penetrate the switching layers 4030, 4032 and 4034 edge wise after the interfaces between switching layers and any other layers for current control and the electrodes, such as the bottom electrode 120 and top electrode 140, are fabricated. In this way, the ions and/or radiation 4450 can disrupt any UBLs formed unintentionally via contamination during processing. This disruption improves RRAM switching characteristics without relying on a forming process that applies a near breakdown voltage-current to the devices. Vacancies and defects are generated in the switching layers 4030, 4032 and 4034. According to some embodiments, ions such as O, transition metal ions, other non-transitional metal ions, inert ions such as Ar, Xe, non-inert ions such as H, Cl, N, F, and other ions such as Li, Na, K, C to name a few can also be implanted into the switching layers edge wise and/or almost edge wise. The distribution of ions and/or vacancies/defects is along the direction of the impinging ions. In most cases, the width of the switching layer is greater than the thickness of the switching layer, which ranges from about 2 to about 40 nm. A distribution of vacancies and/or ions can therefore be placed along the width of the switching layer(s) rather than the depth of the switching layer(s). This technique can advantageously localize the vacancies/ions within the width of the switching layer(s) that can further confine the switching region within the switching layer(s) to improve reproducibility and reliability.

Figure 42:
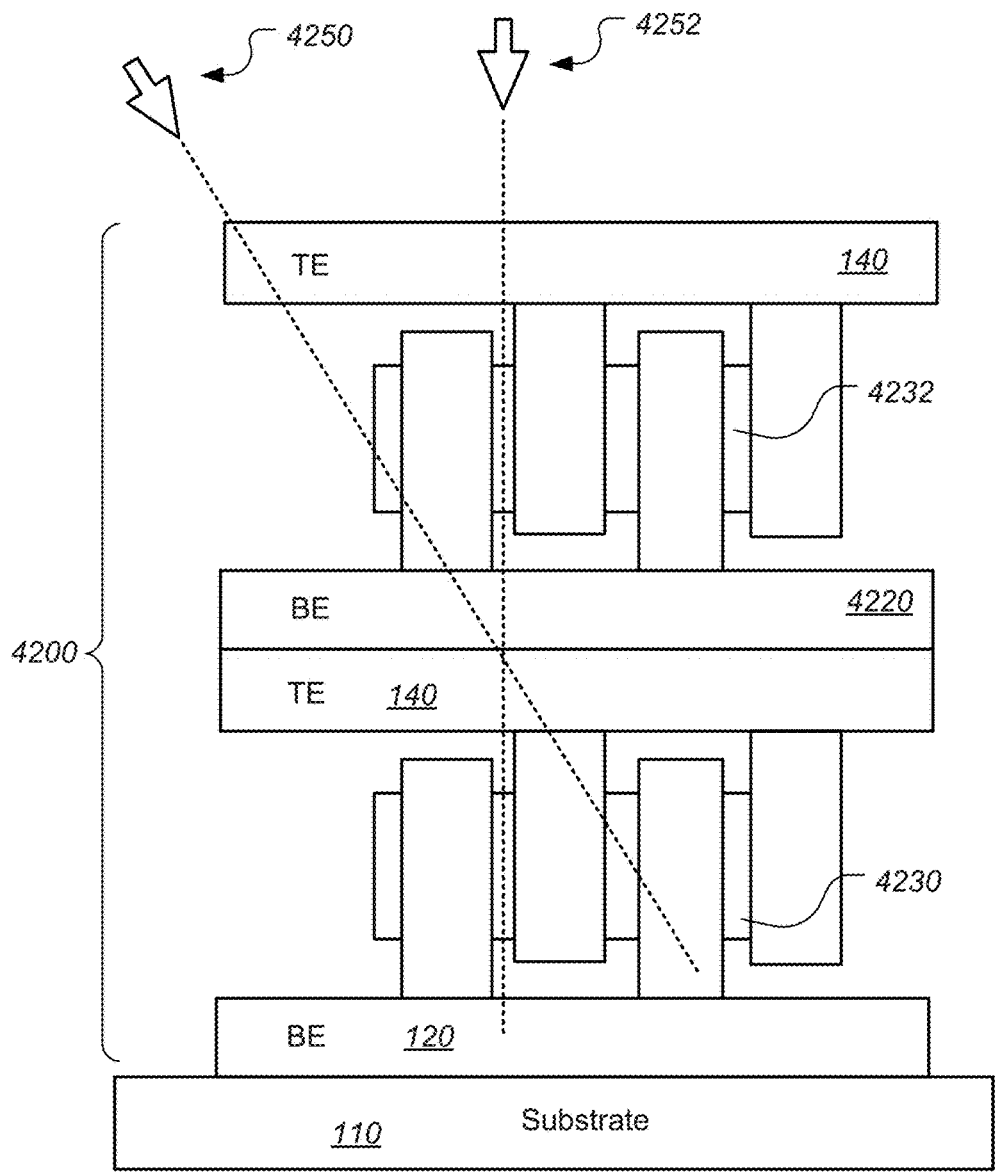
FIG. 42 is a diagram illustrating a stacked RRAM structure with two or more stacks where the plane of the switching layers are normal and/or almost normal to the surface of the substrate, according to some embodiments.

FIG. 42 is a diagram illustrating a stacked RRAM structure with two or more stacks where the plane of the switching layers are normal and/or almost normal to the surface of the substrate, according to some embodiments. Energies for ion implant and/or radiation such as X-ray/Gamma rays are selected such that the ions and/or radiation penetrate the entire stack 4200 through the electrodes 4240, 4220, 140 and 150, into the switching layers such as 4230 and 4232, and into the substrate 110. The ions and/or radiation also penetrate through the interfaces between electrodes and switching layers where UBLs may exist thereby disrupting the UBLs. The angle of the impinging ions and/or irradiation can be normal and/or almost normal to the substrate such as in example implant 4252 so that the switching layer(s) are penetrated edge wise. According to some other embodiments, the impinging ions and/or radiation can be off normal as in example implant 4250.

Figure 43:
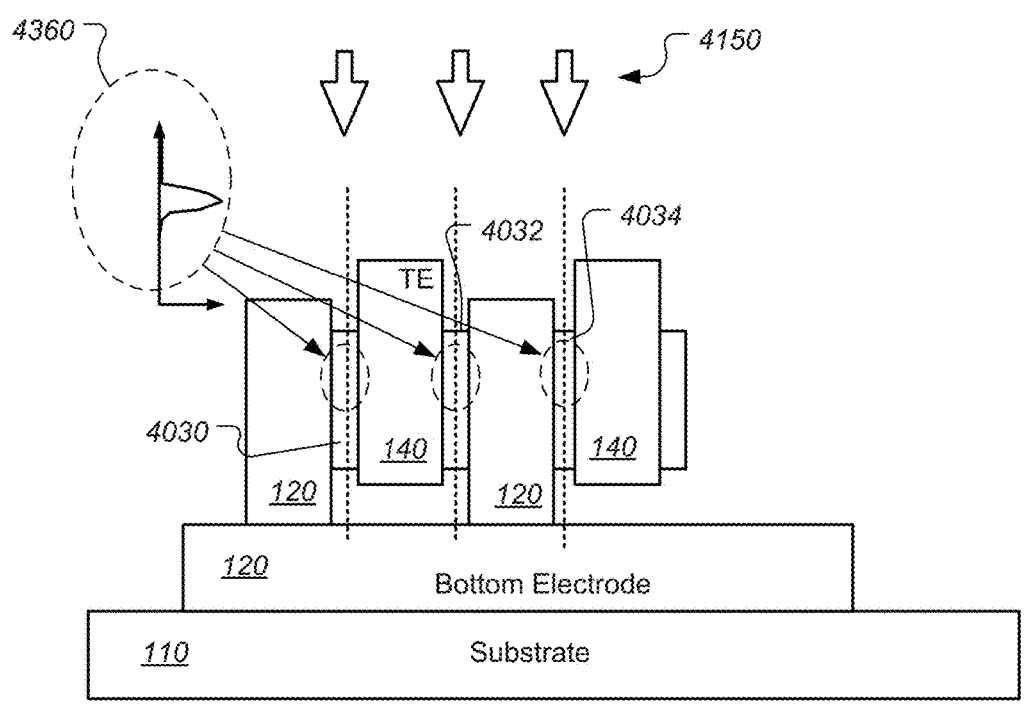
FIG. 43 is a diagram illustrating a cross section of an example of a basic simplified RRAM structure with vertical and/or almost vertical switching layer(s) with ion implantation and/or radiation impinging edgewise into the switching layers, according to some embodiments.

FIG. 43 is a diagram illustrating a cross section of a basic simplified RRAM structure with vertical and/or almost vertical switching layer(s) with ion implantation and/or radiation impinging edgewise into the switching layers, according to some embodiments. In the case of ion implantation, the edgewise direction allows for localization of the ions/vacancies/defects in a region along the width of the switching layers rather than along the depth or thickness of the switching layer. Note that the vacancy concentration is approximately uniform along the direction of the current flow. An example ion and/or defect profile is shown in inset diagram 4360. Ions with high enough energies can also penetrate along the entire width of the switching layers so as to implant into the bottom electrode 120 and/or substrate 110. According to some embodiments, multiple ion species, energies and/or doses can be used to optimize the RRAM switching characteristics, reproducibility and reliability, as well as to reduce RRAM variability. According to some embodiments, radiation such as X-rays and Gamma rays can also be used together with ion implantation and/or separately, to generate defects along the entire width of the switching layers. According to some embodiments, the ion implantation and/or radiation into the edge of the switching layers is performed after the electrodes and/or non-switching layers (such as current control layers, non-linear diode and/or tunnel layers) are in contact with the switching layers. This can be beneficial, for example, for disruption of any UBLs formed as interfaces. According to other embodiments, the ion implant and/or radiation can be initiated when the switch layers are deposited on the bottom electrode prior to the top electrode deposition.

Since the switching layers are typically a lower density material than the electrodes, ion implantation and/or radiation into the edge of the switching layer(s) may require less energy overall, while still achieving localized or non-localized uniformity, depending on the energy distribution of ions and/or vacancies. According to some embodiments, multiple ion species, energies, and/or doses may be used to optimize RRAM characteristics. The lower energy for ion implantation and/or radiation also minimizes unintentional effects of CMOS circuits that may be beneath and/or around the RRAM crossbar and reduces any shielding requirements during ion implantation and/or radiation.

According to some embodiments, the edge ion implant and/or radiation also acts to disrupt the UBLs that can form due to processing which would otherwise negatively impact RRAM characteristics. The disruption of the UBLs can allow a better contact between electrode and switching and/or non-switching layers.

Figure 44:
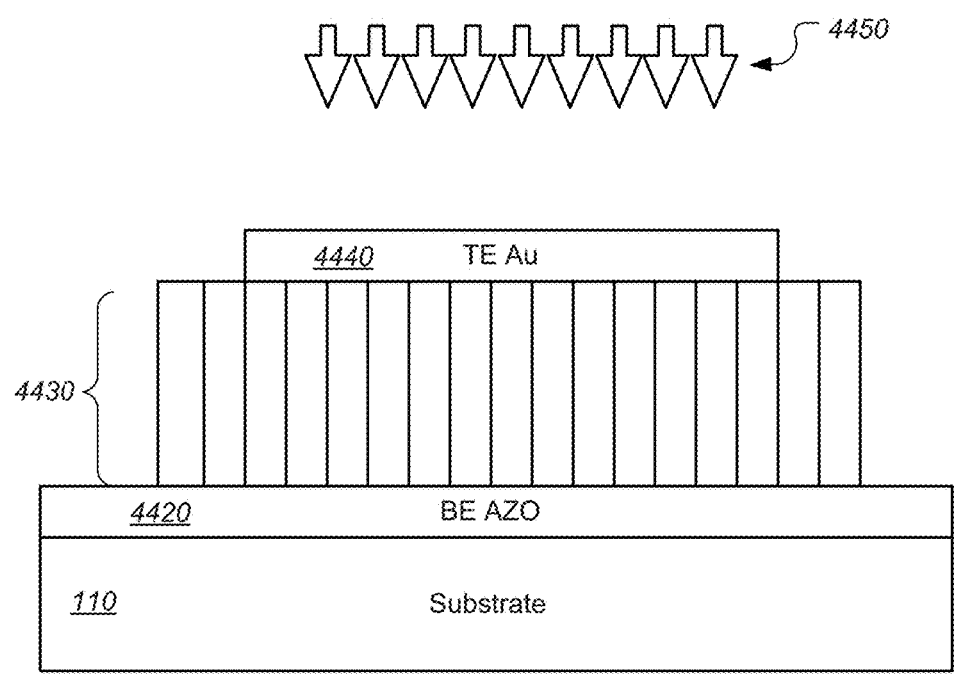
FIG. 44 is a diagram illustrating a simple RRAM structure where the switching layer that includes ZnO nanorods, according to some embodiments.

FIG. 44 is a diagram illustrating a simple RRAM structure where the switching layer includes ZnO nanorods, according to some embodiments. The ZnO nanorods can be core shell, with other switching layers such as HfOx and/or with other current control layers such as resistive layers, diode layers and/or tunnel layers. For simplicity, only the ZnO nanorods are shown in the switching layer 4430 between a bottom electrode 4420 and top electrode 4440. In this example, BE 4420 is aluminum doped ZnO (AZO), and TE 4440 is Au. Implantation process 4450 can include hydrogen ions implanted through the top electrode 4440, into the ZnO nanorods, into the bottom electrode 4420 and/or into substrate 110. The H ions can be used to create O vacancies in the ZnO nanorods. Doping the ZnO nanorods with H ions, with or without thermal anneal/heat treatment, either uniformly and/or non-uniformly, can adjust the switching characteristics of the RRAM. In addition, by implanting through the top electrode, any unintentional barrier layer (UBL) at the interfaces will be disrupted so as to provide good electrical characteristics. According to some embodiments, a higher energy ion implant can also be used to disrupt any UBL at the interface between the nanorods and the bottom electrode. According to some embodiments, other ions may also be used in the ion implantation, such as Zn, O, Ar, Xe, Al, Au, Ti, Hf, to dope and/or to create defects and/or vacancies within and along the nanorod interfaces with other nanorods. According to some embodiments, multiple energies, doses and/or species can be used to optimize the switching characteristics of the RRAM.

According to some embodiments, several specific example structures and processes will be described. In some examples, TE 140 is Pt having 50 nm thickness, the SL 130 is hafnium oxide having 20 nm thickness, the BE 120 is Ti or W having 100 nm thickness, and the substrate 110 is silicon dioxide having 2000-4000 nm thickness on Si wafer. Alternative examples include substituting titanium oxide, zirconium oxide, tungsten oxide, tantalum oxide, vanadium oxide or a combination of such oxides for the SL 130. The electrodes TE and BE can vary in thickness and can be made of TiN, AlN, silicide, W, Ni, Au, Pt, Cr, V, Ta, Nb, Al, Cu or a combination of these. Following are specific implant schedules that can be used with the above structure(s):

1. Argon at 600 KeV with a dose of $1\times10^{12}/cm^2$ to $5\times10^{14}/cm^2$;
2. Argon at 600 KeV with a dose of $1\times10^{12}/cm^2$ to $5\times10^{14}/cm^2$, followed by oxygen implant at 100 KeV with dose of $1\times10^{14}/cm^2$ to $5\times10^{16}/cm^2$;
3. Argon at 600 KeV with a dose of $1\times10^{12}/cm^2$ to $5\times10^{14}/cm^2$, followed by oxygen implant at 100 KeV with dose of $1\times10^{14}/cm^2$ to $5\times10^{16}/cm^2$ and hydrogen implant at 10 KeV with a dose of $1\times10^{14}/cm^2$ to $5\times10^{16}/cm^2$;
4. Argon at 600 KeV with a dose of $1\times10^{14}/cm^2$ to $5\times10^{16}/cm^2$;
5. Argon at 150 KeV with a dose of $1\times10^{12}/cm^2$ to $5\times10^{14}/cm^2$;
6. Argon at 150 KeV with a dose of $1\times10^{14}/cm^2$ to $5\times10^{16}/cm^2$;
7. Xenon at 1600 KeV with a dose of $1\times10^{12}/cm^2$ to $5\times10^{14}/cm^2$;
8. Xenon at 300 KeV with a dose of $1\times10^{12}/cm^2$ to $5\times10^{14}/cm^2$
9. Xenon at 300 KeV with a dose of $1\times10^{12}/cm^2$ to $5\times10^{14}/cm^2$, followed by oxygen implant at 100 KeV with dose of $1\times10^{14}/cm^2$ to $5\times10^{16}/cm^2$;
10. Xenon at 1600 KeV with a dose of $1\times10^{12}/cm^2$ to $5\times10^{14}/cm^2$, followed by oxygen implant at 100 KeV with dose of $1\times10^{14}/cm^2$ to $5\times10^{16}/cm^2$;
11. Xenon at 1600 KeV with a dose of $1\times10^{10}/cm^2$ to $5\times10^{13}/cm^2$;
12. Au at 650 KeV with a dose of $1\times10^{14}/cm^2$ to $5\times10^{16}/cm^2$;
13. Au at 650 KeV with a dose of $1\times10^{15}/cm^2$ to $5\times10^{17}/cm^2$, followed by oxygen implant at 100 KeV with dose of $1\times10^{14}/cm^2$ to $5\times10^{16}/cm^2$; and
14. Au at 400 KeV with a dose of $1\times10^{15}/cm^2$ to $5\times10^{17}/cm^2$, followed by oxygen implant at 100 KeV with dose of $1\times10^{14}/cm^2$ to $5\times10^{16}/cm^2$.

According to some embodiments, a hydrogen implant can be added to any of the above example implant schedules 1-3 and 5-14. Additionally, the energy and dose of any of the above implant schedules can be varied by +/−50%.

FIG. 45 is a diagram showing a structure of multi-layer RRAM devices according to some embodiments. The structure 4500 shown in FIG. 45 is an example of three vertically stacked RRAM devices. According to some embodiments, the TEs 4540, 4542 and 4544 are made of 100 nm of Pt; switching layers (SLs) 4530, 4532 and 4534 are made of 20 nm of TiOx; and Bes 4520, 4522 and 4524 are made of 100 nm Ti. Thus, the multi-layer structure 4500 consists of 3 RRAM devices on $SiO_2$ 4510 that can be formed on Si, for example. Ion implantation 4550 is performed. According to some embodiments Ar ions are implanted at 800 and/or 1600 KeV. According to some other embodiments H ions are implanted at 100 and/or 200 KeV into the structure 4500. Ar ions are inert and do not react with any material. Rather, their presence in the material is used to create defects and vacancies. H can be reactive and the bulk of the H ions are deposited into the $SiO_2$ layer 4510 at 200 KeV. Whereas, the bulk of the Ar ions at 800 and 1600 KeV reside in the second and third RRAM device respectively.

Figure 46A:
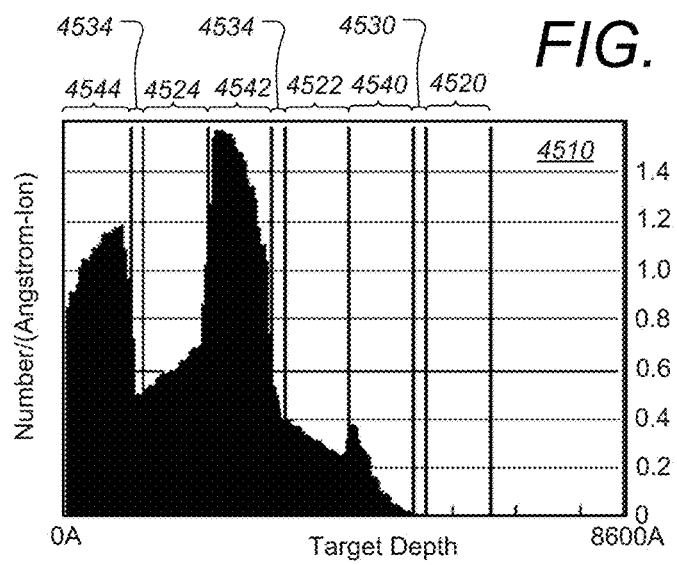
FIGS. 46A-46H are plots illustrating simulation results of Ar and H ions implanted into a structure as shown in FIG. 45 at various energies, according to some embodiments.
Figure 46B:
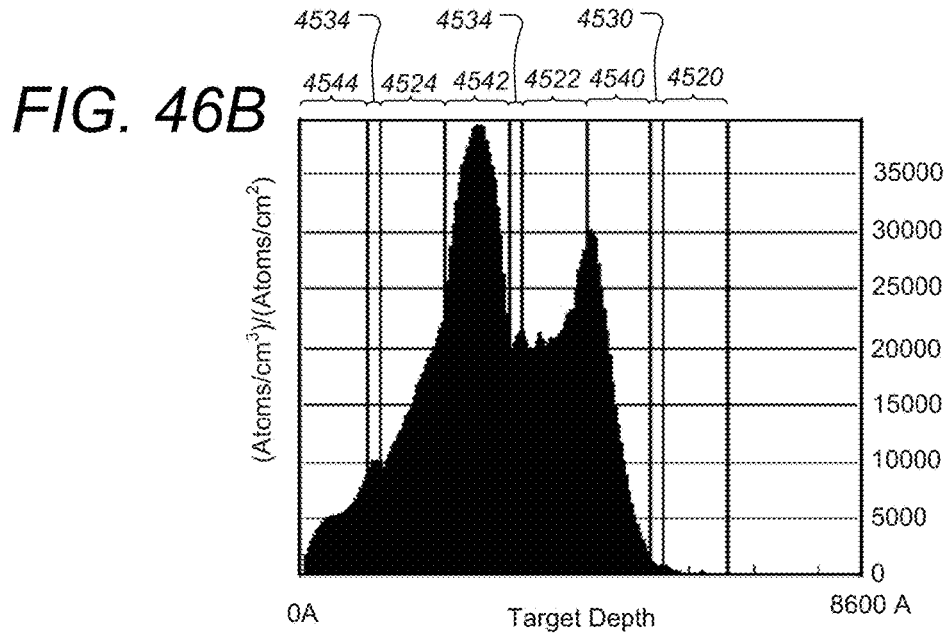
Figure 46C:
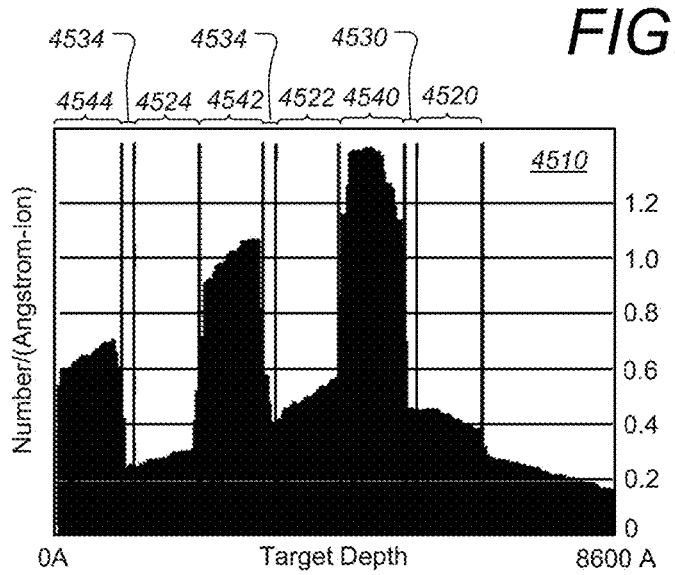
Figure 46D:
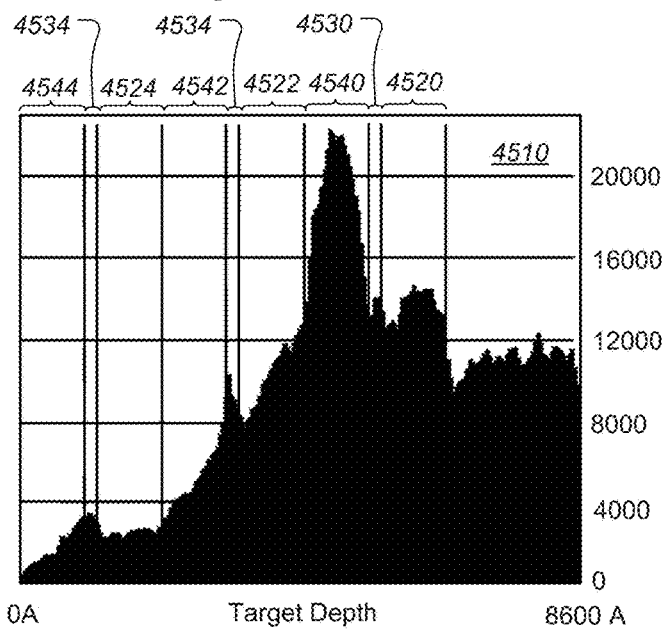
Figure 46E:
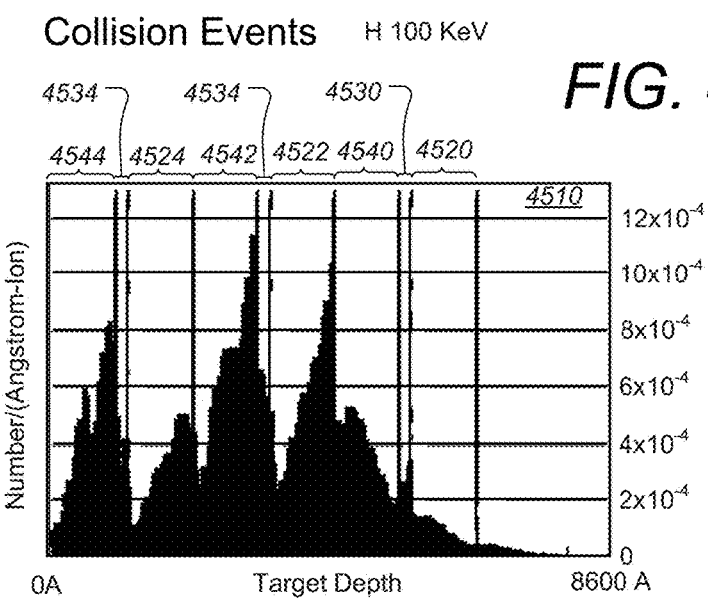
Figure 46F:
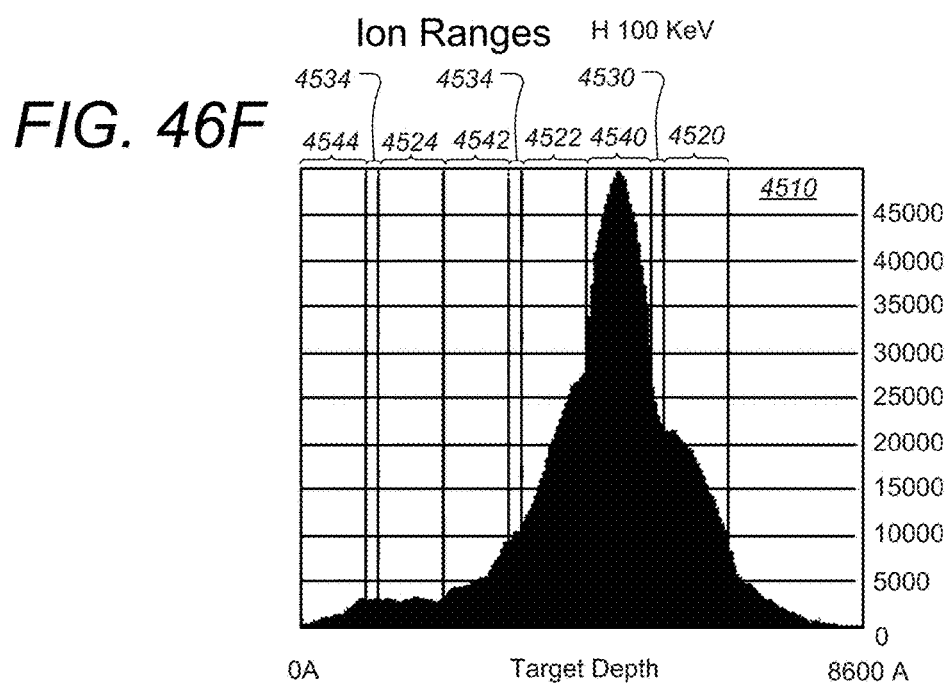
Figure 46G:
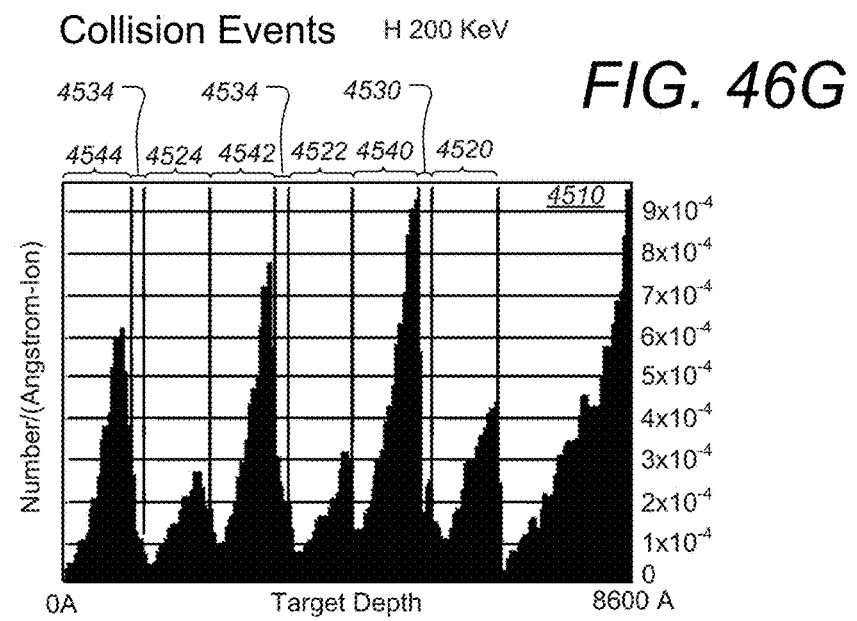
Figure 46H:
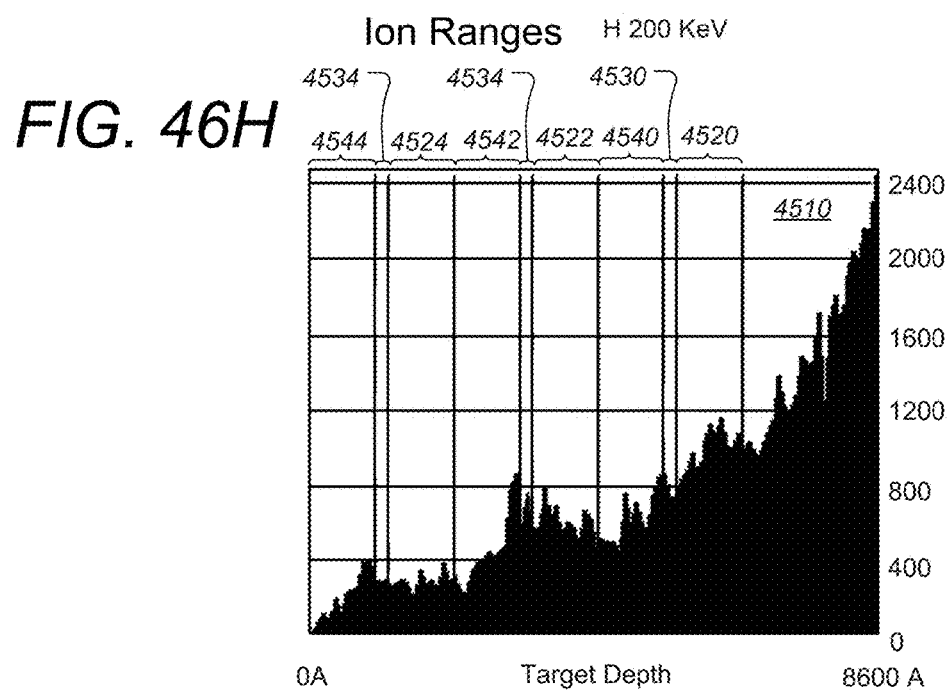

FIGS. 46A-46H are plots illustrating simulation results of Ar and H ions implanted into a structure as shown in FIG. 45 at various energies, according to some embodiments. Plots are shown of the range of the ions and the collision events. In the ion range plots (FIGS. 46B, 46D, 46F and 46H) the doping concentration of ions/$cm^3$ can be obtained by multiplying dose (ions/$cm^2$) with the vertical axis of (atomes/$cm^3$)/(atomes/$cm^2$). In the collision events plot (FIGS. 46A, 46C, 46E and 46G), vacancies concentration can be approximated by multiplying the (dose) (r) ($10^8$) with the vertical axis of number/(angstrom-ion) where "r" is the number of ions to create one vacancy. In some cases "r" can be assumed to be equal to one, and in other cases "r" can be assumed to be 0.01 and is dependent on implant conditions. In all our approximations, "r"=1 is assumed. For "r" other than 1, our dose can be adjusted accordingly. For example if r=0.01, then the dose can be increased by 100 to achieve the same level of vacancy concentration where r=1 was assumed. In FIGS. 46A and 46B it can be seen that Ar at 800 KeV can only penetrates 2 RRAM devices. In FIGS. 46C and 46D it can be seen that Ar at 1600 KeV Ar penetrates all 3 RRAM devices. In FIGS. 46E-46H it can be seen that H at 100 and 200 KeV is able to penetrate all 3 RRAM devices.

Figure 47A:
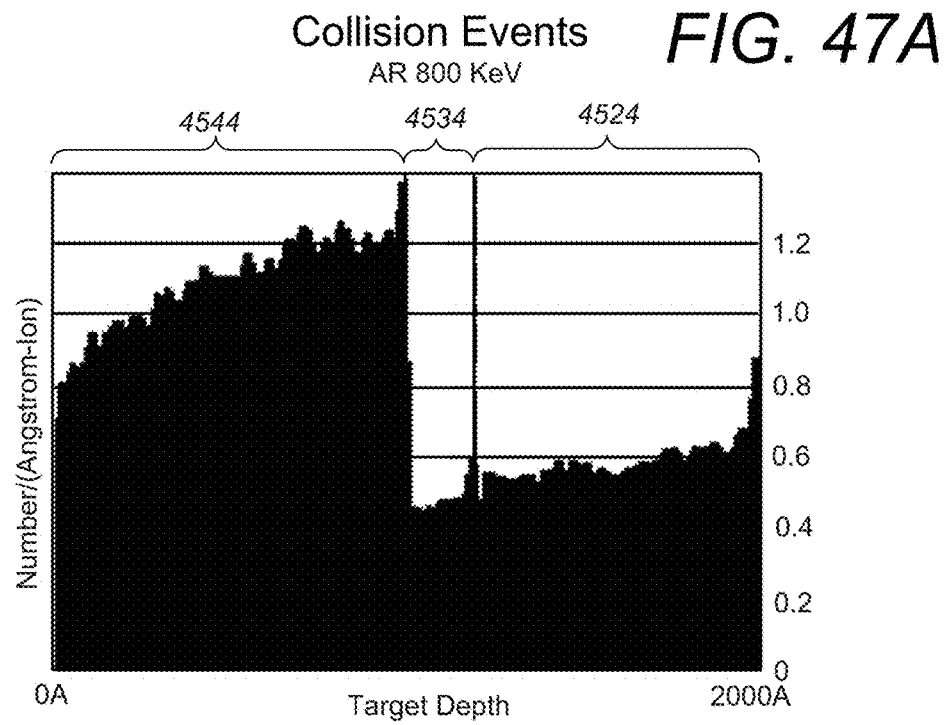
FIGS. 47A-47B are expanded plots illustrating simulation results of Ar ions implanted into a structure as shown in FIG. 45 at 800 KeV, according to some embodiments.
Figure 47B:
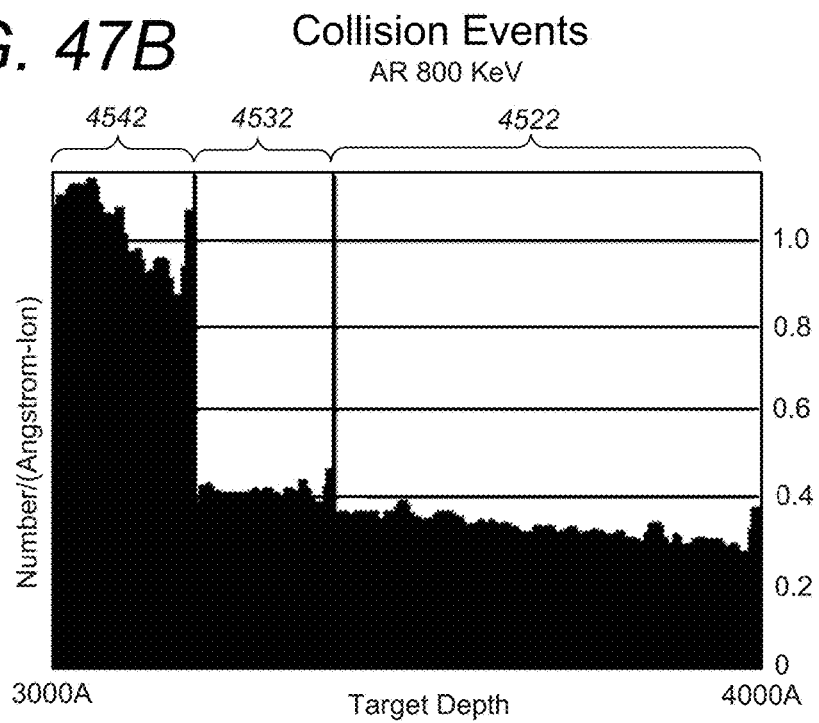

FIGS. 47A-47B are expanded plots illustrating simulation results of Ar ions implanted into a structure as shown in FIG. 45 at 800 KeV, according to some embodiments. As can be seen, at Ar 800 KeV vacancies are generated in the switching layer of the first two RRAMs. The first RRAM switching layer 4534 has better than 20% uniformity in the vacancy concentration and the second RRAM switching layer 4532 has better than 10% vacancy concentration uniformity. The device to device vacancy concentration variation is better than 10%.

Figure 48C:
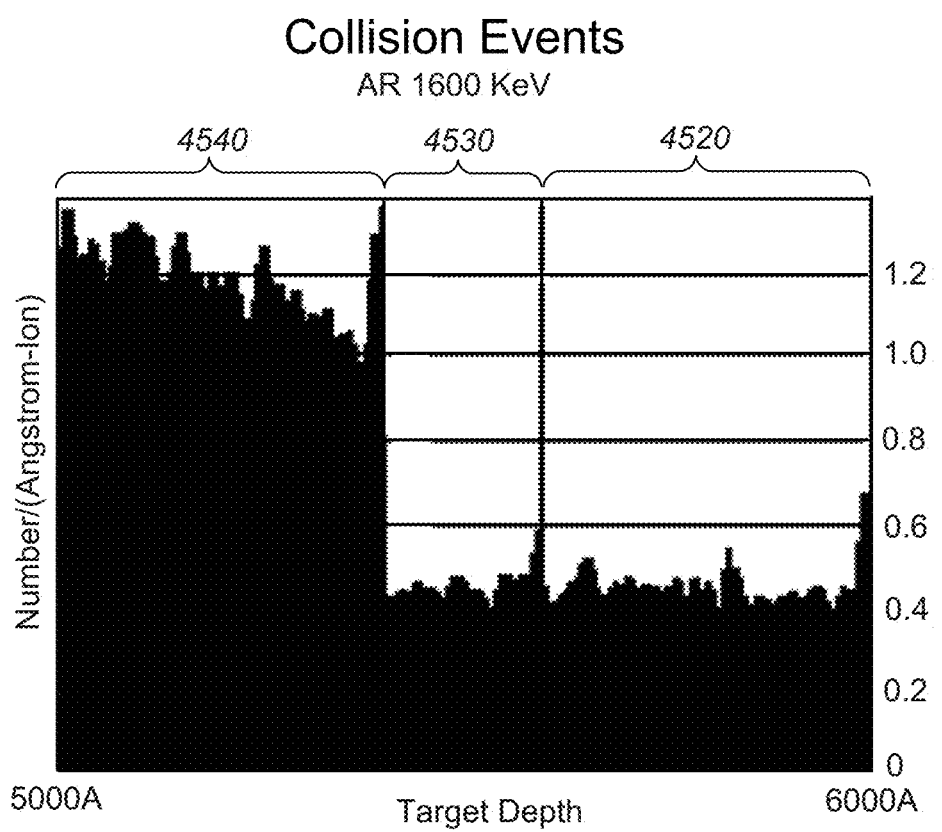

FIGS. 48A-48C are expanded plots illustrating simulation results of Ar ions implanted into a structure as shown in FIG. 45 at 1600 KeV, according to some embodiments. It can be seen that the switching layers 4534, 4532 and 4530 for RRAM1, RRAM2 and RRAM3 respectively all have vacancy concentration variations better than 20%. Ignoring likely simulation artifacts near the boundary of the switching layers, the uniformity of the vacancy concentration is better than 5% within each RRAM's switching layers. The device-to-device variation in the vacancy concentration better than 15%.

Figure 49A:
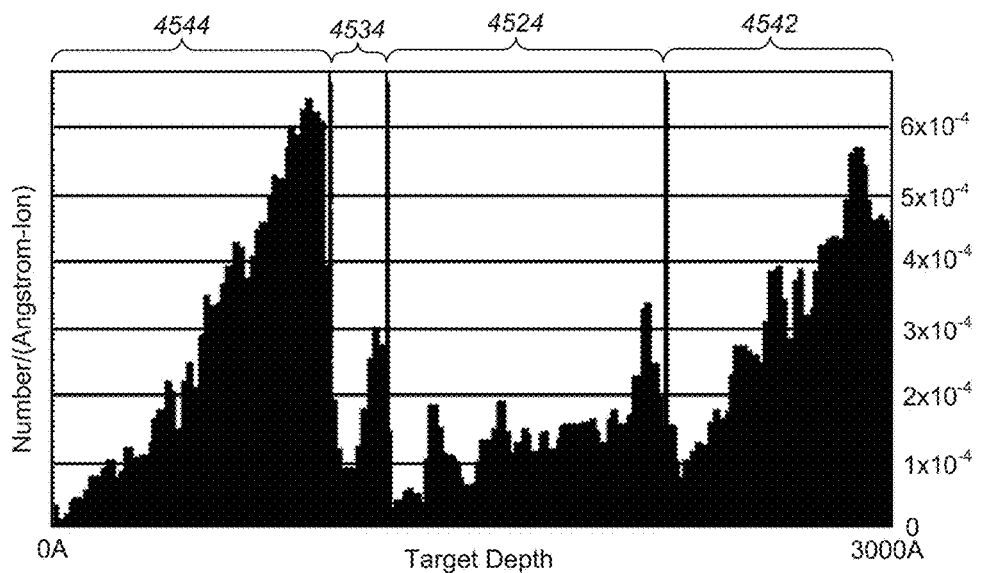
FIGS. 49A-49C are expanded plots illustrating simulation results of H ions implanted into a structure as shown in FIG. 45 at 200 KeV, according to some embodiments.
Figure 49B:
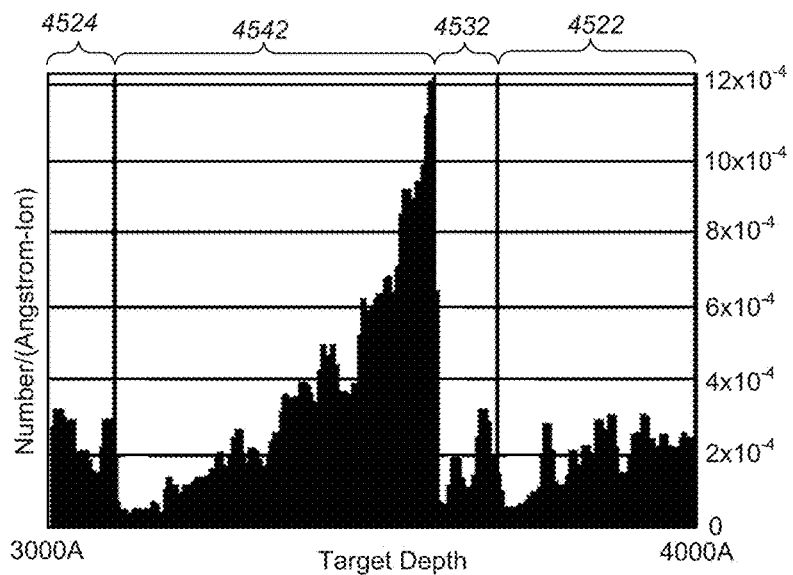
Figure 49C:
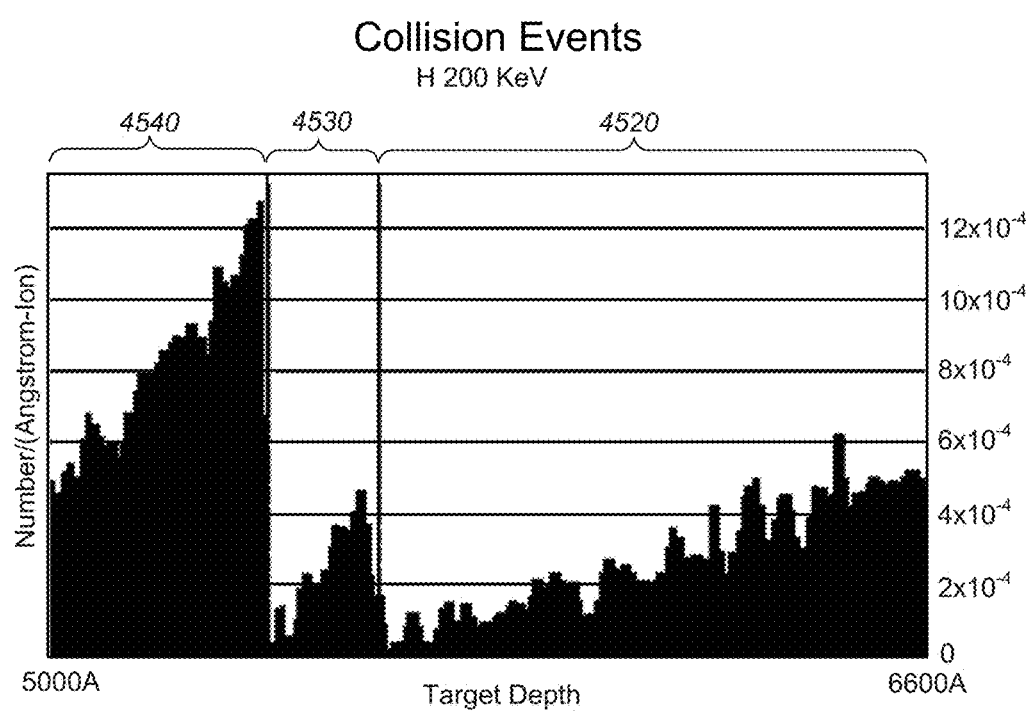
Figure 51A:
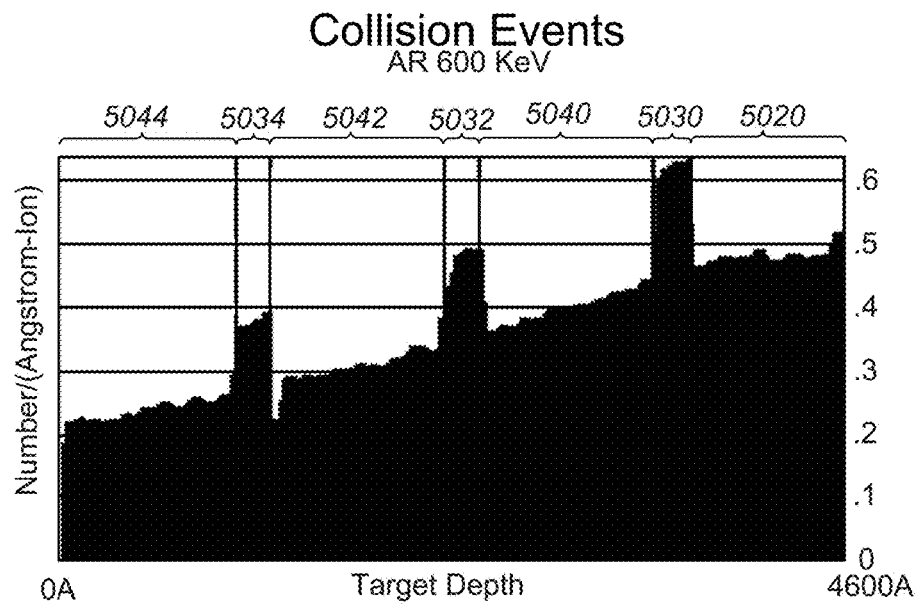
FIGS. 51A-51E are plots illustrating simulation results of Ar ions implanted into a structure as shown in FIG. 50 at 600 KeV, according to some embodiments.
Figure 51B:
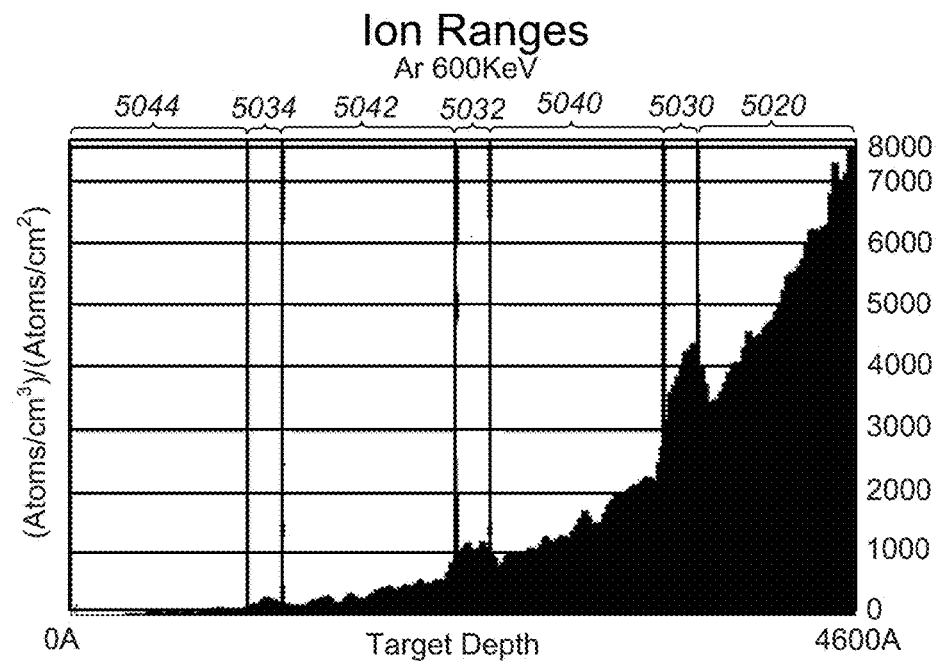
Figure 51C:
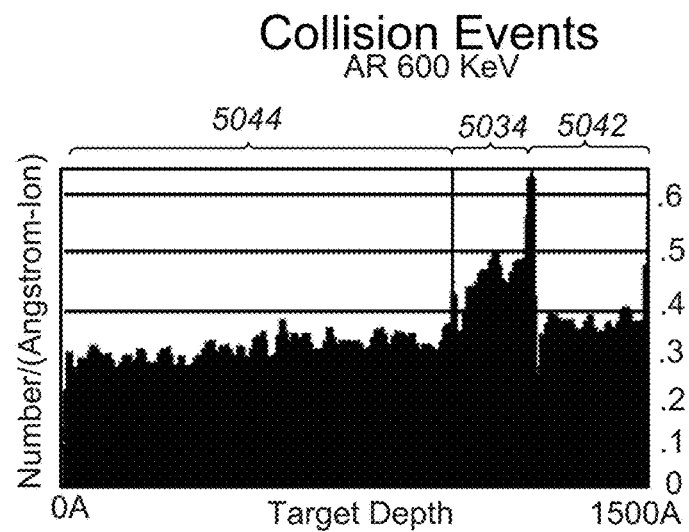
Figure 51D:
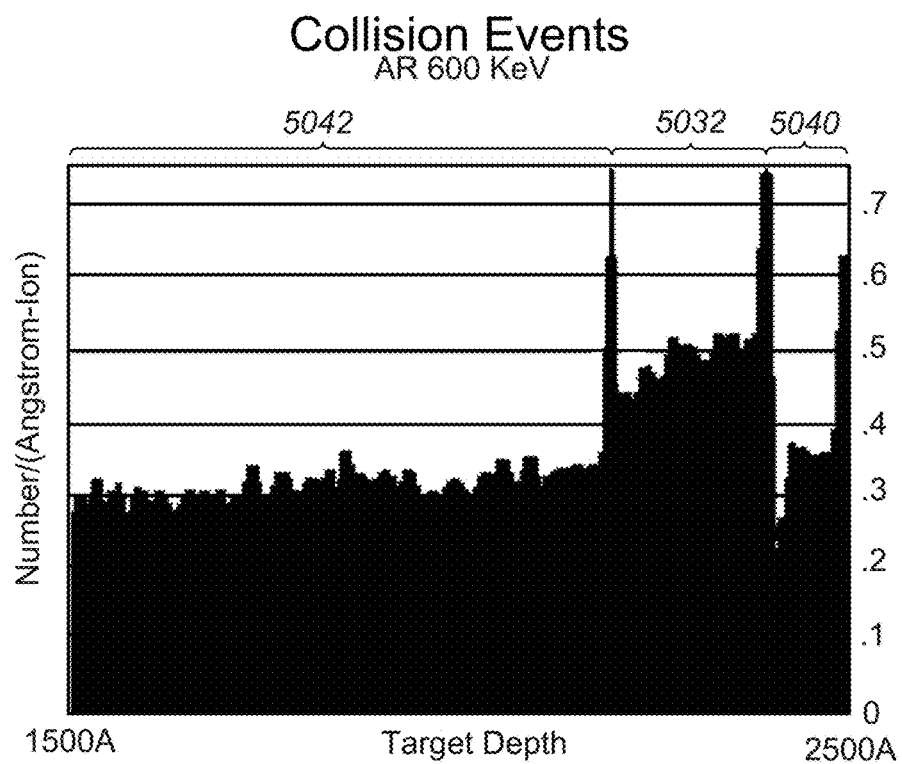
Figure 51E:
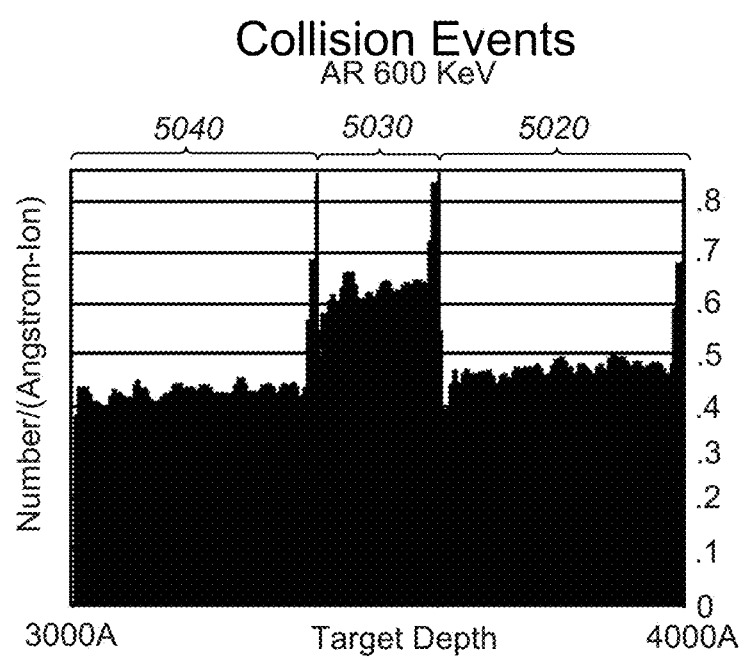
Figure 52A:
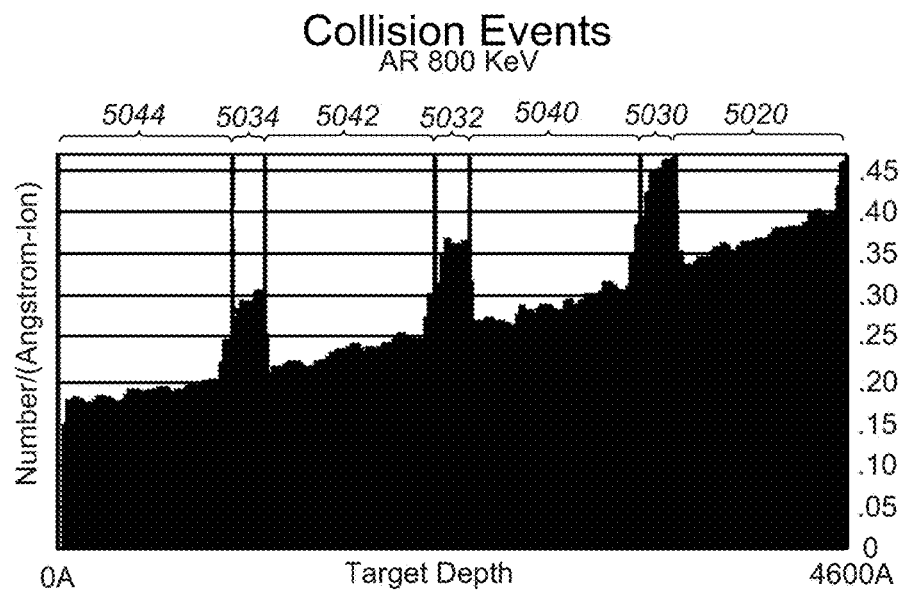
FIGS. 52A-52E are plots illustrating simulation results of Ar ions implanted into a structure as shown in FIG. 50 at 800 KeV, according to some embodiments.
Figure 52B:
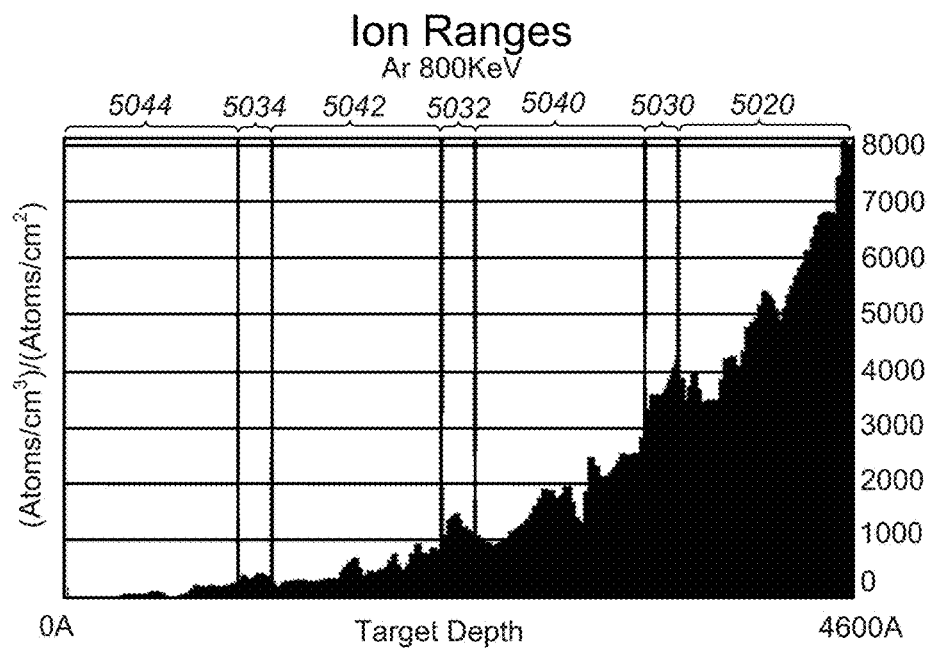
Figure 52C:
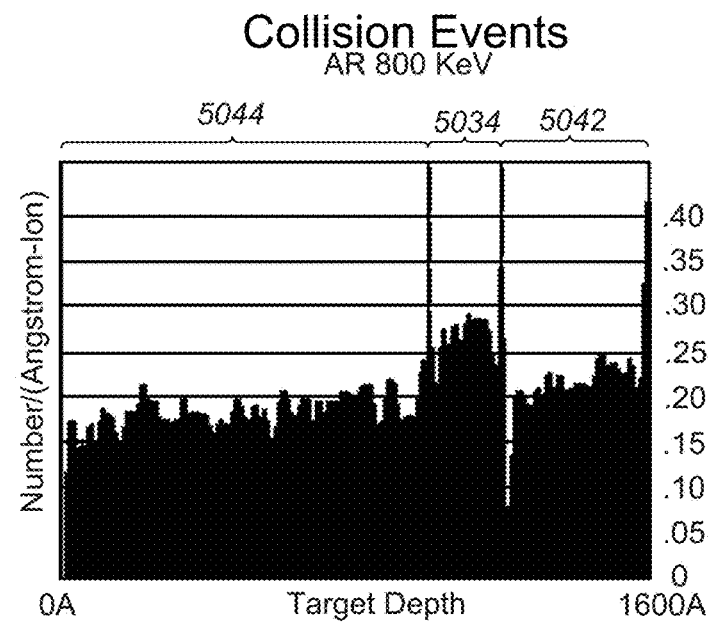
Figure 52D:
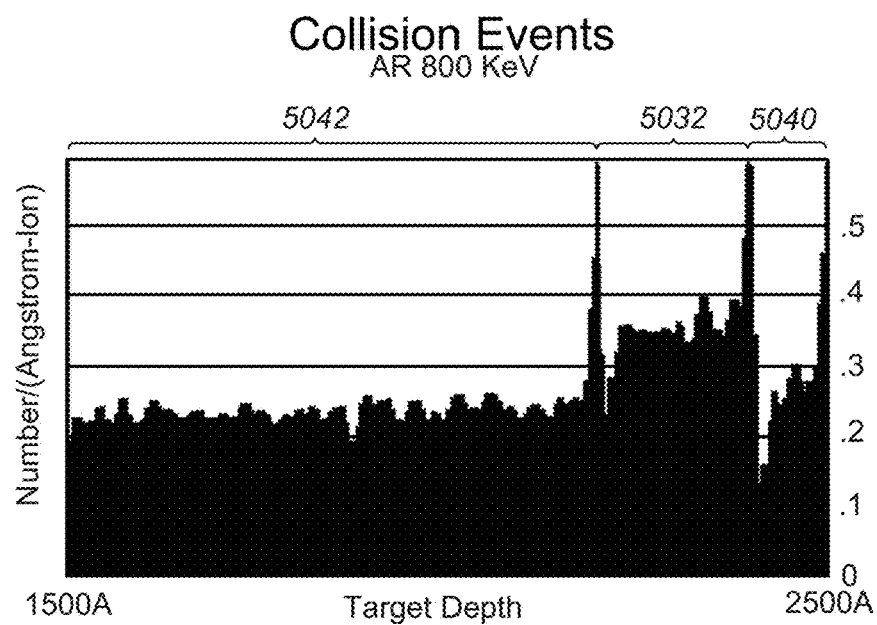
Figure 52E:
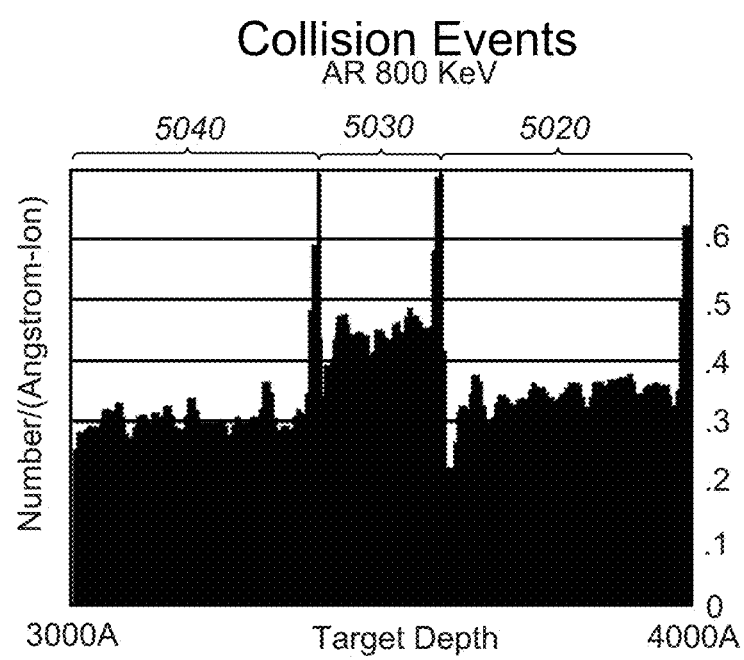

FIGS. 49A-49C are expanded plots illustrating simulation results of H ions implanted into a structure as shown in FIG. 45 at 200 KeV, according to some embodiments. The vacancy concentration uniformity is better than 60% all 3 RRAM SLs (4534, 4532 and 4530) and device-to-device uniformity is approximately 60% or better.

FIG. 50 is a diagram showing a structure of multilayer of RRAM devices according to some embodiments. The structure 5000 shown in FIG. 50 is an example of three vertically stacked RRAM devices. According to some embodiments, the TEs 5044, 5042 and 5040 are made of 100 nm of Al; SLs 5034, 5032 and 5030 are made of 20 nm of TiOx 20 nm; and BEs 5042, 5040 and 5020 are made of 100 nm of Al. Note that in this configuration, electrode layers 5040 and 5042 serve as both TE and BE functions for different RRAM devices. A 3000 nm $SiO_2$ underlies the RRAM devices. The structure is implanted with Ar ions using energies of 600 and 800 KeV. H ions can also be implanted using energies of 100 and 200 KeV. The stacked RRAM structure of FIG. 50 only shows the most basic structures for simplicity. Other layers can be included and implant energies of ion such as Ar, H, Xe, Ti, Hf can be adjusted accordingly to increase uniformity of distribution of ions and vacancies.

FIGS. 51A-51E are plots illustrating simulation results of Ar ions implanted into a structure as shown in FIG. 50 at 600 KeV, according to some embodiments. It can be seen in FIGS. 51A-51E that better than 10% vacancy concentration variation within each device can be achieved. Ignoring likely simulation interface artifacts the vacancy concentration is better than 5%. Device-to-device variation is better than 20% with Ar ion implant at 600 KeV.

FIGS. 52A-52E are plots illustrating simulation results of Ar ions implanted into a structure as shown in FIG. 50 at 800 KeV, according to some embodiments. It can be seen in FIGS. 51A-51E that better than 20% vacancy concentration variations within a device and device to-device can be achieved using a 800 KeV Ar ion implant into the 3 RRAM stack with composition as shown in FIG. 50. In some cases, better than 15% in vacancy concentration variation can be achieved with likely simulation artifacts removed.

FIG. 53 is a diagram showing a structure of vertically stacked RRAM devices according to some embodiments. The structure 5300 shown in FIG. 53 is an example of a vertical RRAM stack (VRRAM) of 5 RRAM devices having a vertical electrode 5320; horizontal electrodes 5340, 5342, 5344, 5346 and 5448; and a switching layer 5330 disposed between the horizontal and vertical electrodes. As shown in the FIG. 53, the switching layer 5330 is approximately normal to the substrate 5310. Between the horizontal electrodes 5340, 5340, 5342, 5344, 5346 and 5348 are electrically insulating spacer layer 5362, 5364, 5366 and 5368. Additionally, insulation layer 5314 is provided below horizontal electrode 5348, and insulation layer 5360 is provided above horizontal electrode 5340. In certain cases, CMOS electronics can exist in substrate 5310 beneath the VRRAM and a layer 5312 made of a material such as W (tungsten), Mo (molybdenum), Hf and/or Ta, can be deposited between the CMOS electronics and the VVRAM to stop ions and/or radiation from penetrating into the CMOS layers. The thickness of the electrodes 5340, 5340, 5342, 5344, 5346 and 5348 can range from 50 to 200 nm and the insulating spacer layers can range from 50 to 200 nm. The heavy metal stopping layer 5312 can range from 100 to 2000 nm. The total stack of VRRAM can range from 550 nm to 2200 nm approximately. In some cases it can be 4500 nm approximately. Ion implantation 5350 approximately normal to the surface that can penetrate into the edge of the switching layer either at a normal and/or off-normal angle to generate uniform defects along the entire length of the switch layer. Ion implantation and/or radiation can be implemented when the vertical electrodes and the horizontal electrodes are in place but prior the adding the vertical connecting wires. In some cases, ion implantation and or radiation can be implemented after the connecting wires for the vertical electrodes are in place. In some other cases, the ion implantation and/or radiation can be implemented after the entire VRRAM structure is formed. In some other cases, some masking for selective area ion implantation and/or radiation can be implemented. Mask material for selective are ion implantation and/or radiation can be a metal such as Hf, Ta, W, Pb, or Au. According to some embodiments, selective area ion implantation and/or radiation may performed on certain areas of the switching layer, such as areas that are directly between the vertical and horizontal electrodes. In some cases, there may be CMOS electronics adjacent to the VRRAM or RRAM stacks that can be shielded from ion implant and or radiation. Heavy metals can be used shielding the CMOS in a selective area ion implant and/or radiation. Other thick materials such as polyimide can also be used according to some embodiments.

For further details of connecting metals for the vertical and horizontal electrodes in a VRRAM and a 3D crossbar RRAM (also referred to as a horizontal RRAM), see, e.g. Park et al., *A Non-Linear ReRAM Cell with sub-1 μA Ultralow Operating Current for High Density Vertical Resistive Memory (VRRAM)*, IEDM12-501, (2012); Baek et al., *Realization of Vertical Resistive Memory (VRRAM) using cost effective 3D Process*, IEDM11-737 (2011), US Pat. Publ. No. 2013/0009122; and U.S. Pat. No. 8,525,247, each of which is incorporated herein by reference.

Figure 54:
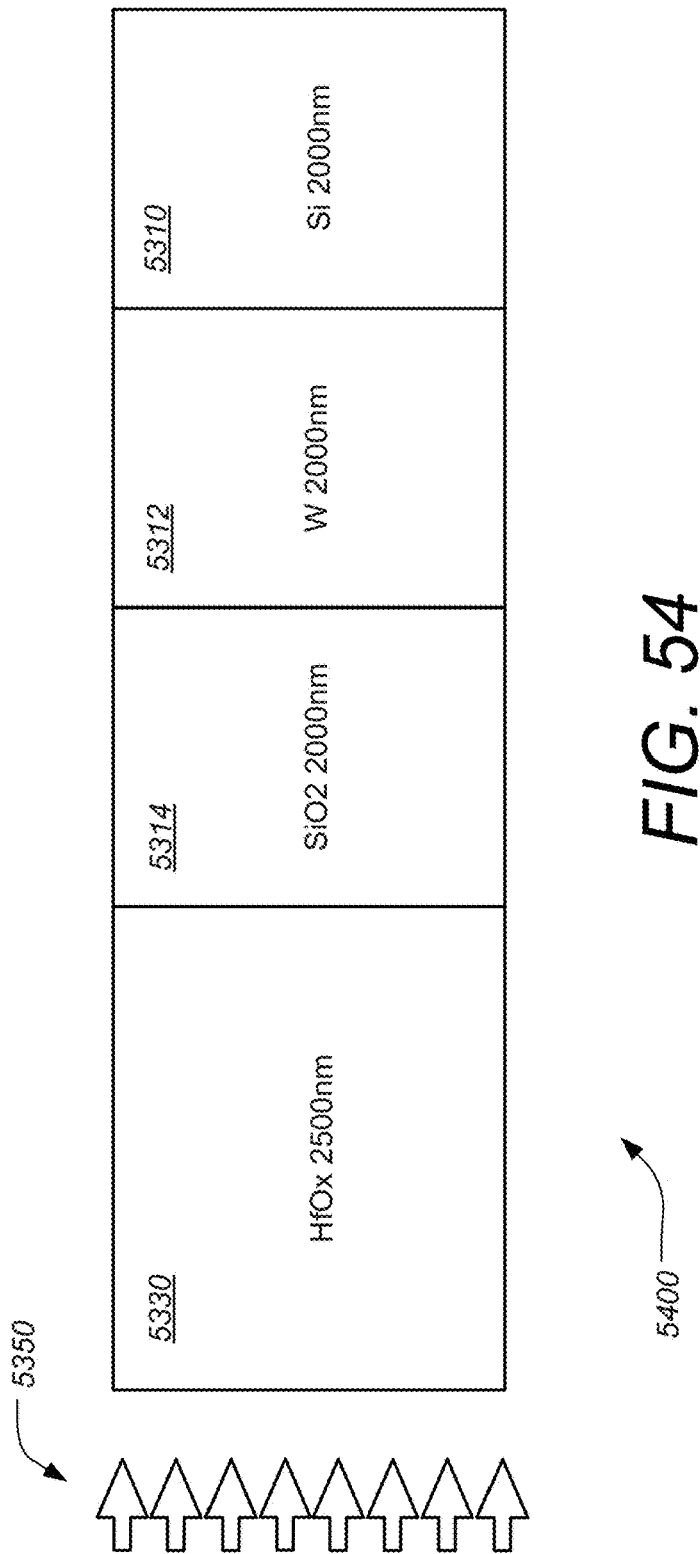
FIG. 54 is a diagram showing structure of vertically stacked RRAM devices that is simplified for purposes of simulation, according to some embodiments.

FIG. 54 is a diagram showing structure of vertically stacked RRAM devices that is simplified for purposes of simulation, according to some embodiments. In this case, the VRRAM structure 5400 comprises switching layer 5330 of HfOx at 2500 nm thickness, followed by insulation layer 5314 made of 2000 nm of $SiO_2$, layer 5312 made of 2000 nm of W, and Si layer 5310 of 10000 nm thickness. Ions are implanted to a depth of approximately 4500 nm to maximize uniformity of the vacancy concentration distribution within the HfOx switching layer 5330. The W layer 5312 is used to stop ions from penetrating into the Si layer 5310 which may contain CMOS electronics for controlling the VRRAM and other memory functions.

Figure 55A:
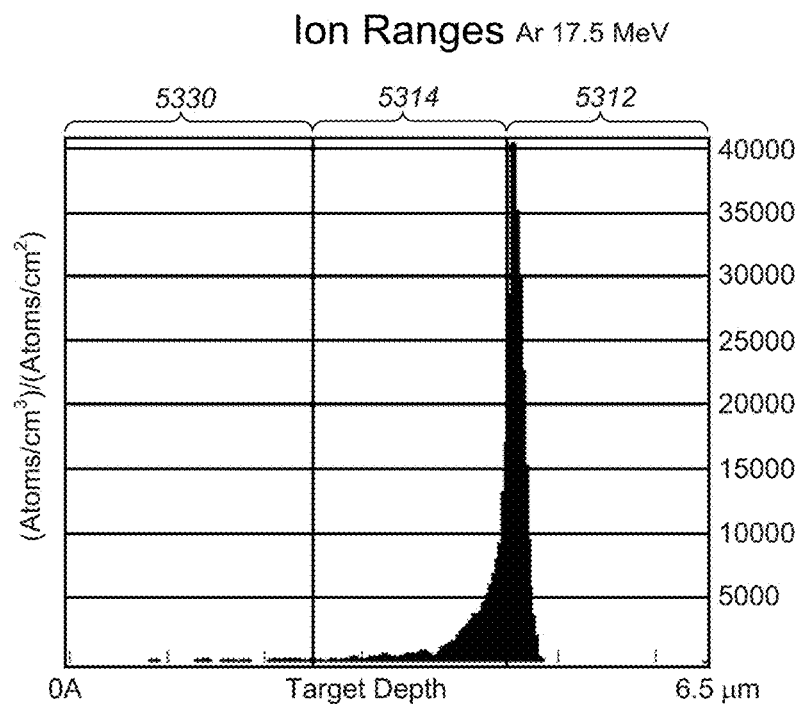
FIGS. 55A-55B are plots illustrating simulation results of Ar ions implanted into a structure as shown in FIG. 54 at 17.5 MeV, according to some embodiments.
Figure 55B:
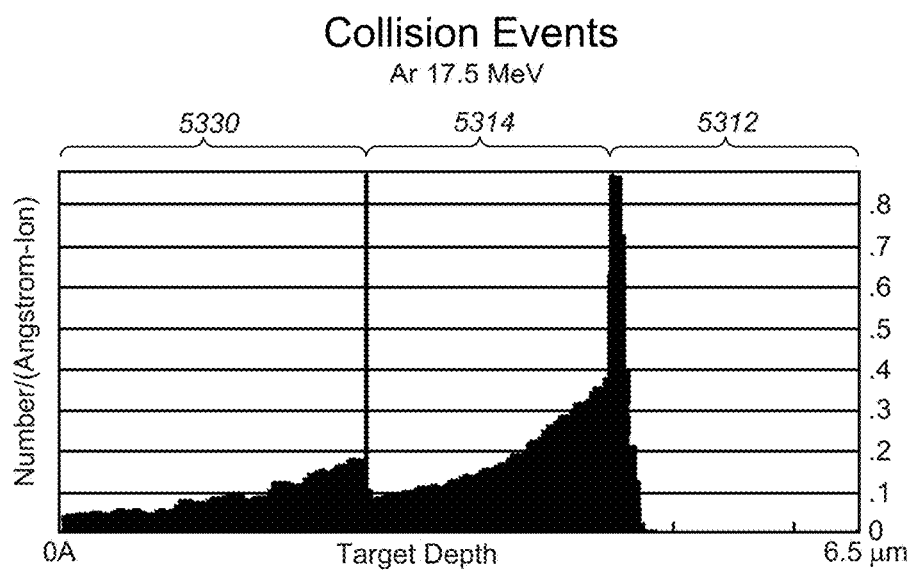

FIGS. 55A-55B are plots illustrating simulation results of Ar ions implanted into a structure as shown in FIG. 54 at 17.5 MeV, according to some embodiments. The plots show that the Ar ions penetrate to a depth of approximately 4500 nm. Vacancy concentration distribution along the 2500 nm length of the HfOx switching layer 5330 is better than 60% for Ar ions and better than 2% variation at any small region locally with likely simulation artifacts removed. The W layer 5312 is effective in stopping ions from penetrating into the Si layer which may contain CMOS circuits and electronics.

Figure 56A:
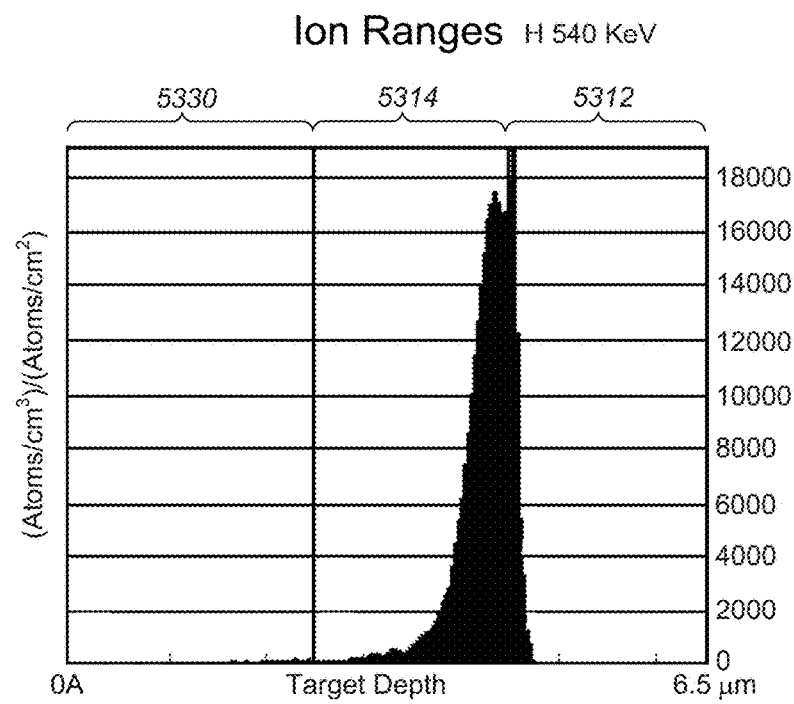
FIGS. 56A-56B are plots illustrating simulation results of H ions implanted into a structure as shown in FIG. 54 at 540 KeV, according to some embodiments.
Figure 56B:
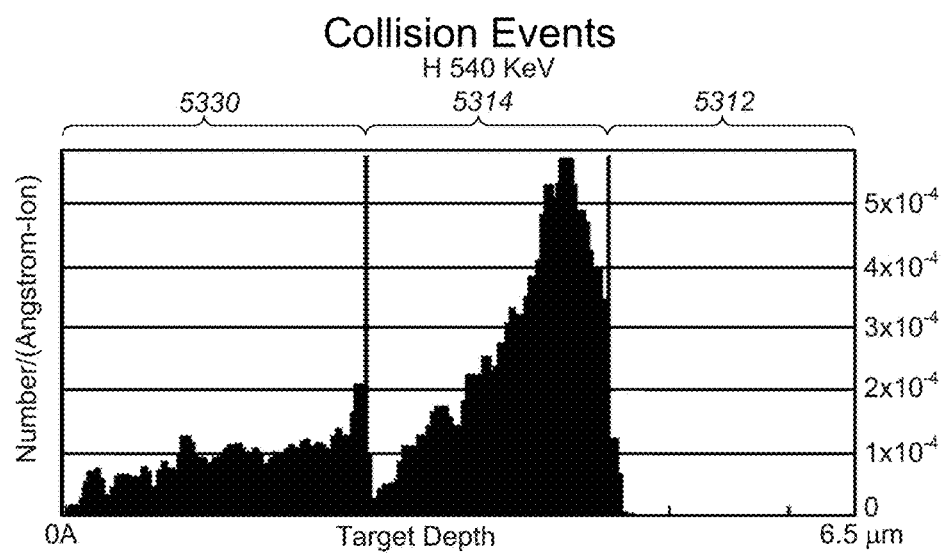

FIGS. 56A-56B are plots illustrating simulation results of H ions implanted into a structure as shown in FIG. 54 at 540 KeV, according to some embodiments. The plots show that the Ar ions penetrate to a depth of approximately 4500 nm. Vacancy concentration distribution along the 2500 nm length of the HfOx switching layer 5330 is better than 20% for H ions and better than 2% variation at any small region locally with likely simulation artifacts removed. The W layer 5312 is effective in stopping ions from penetrating into the Si layer which may contain CMOS circuits and electronics.

Figure 57:
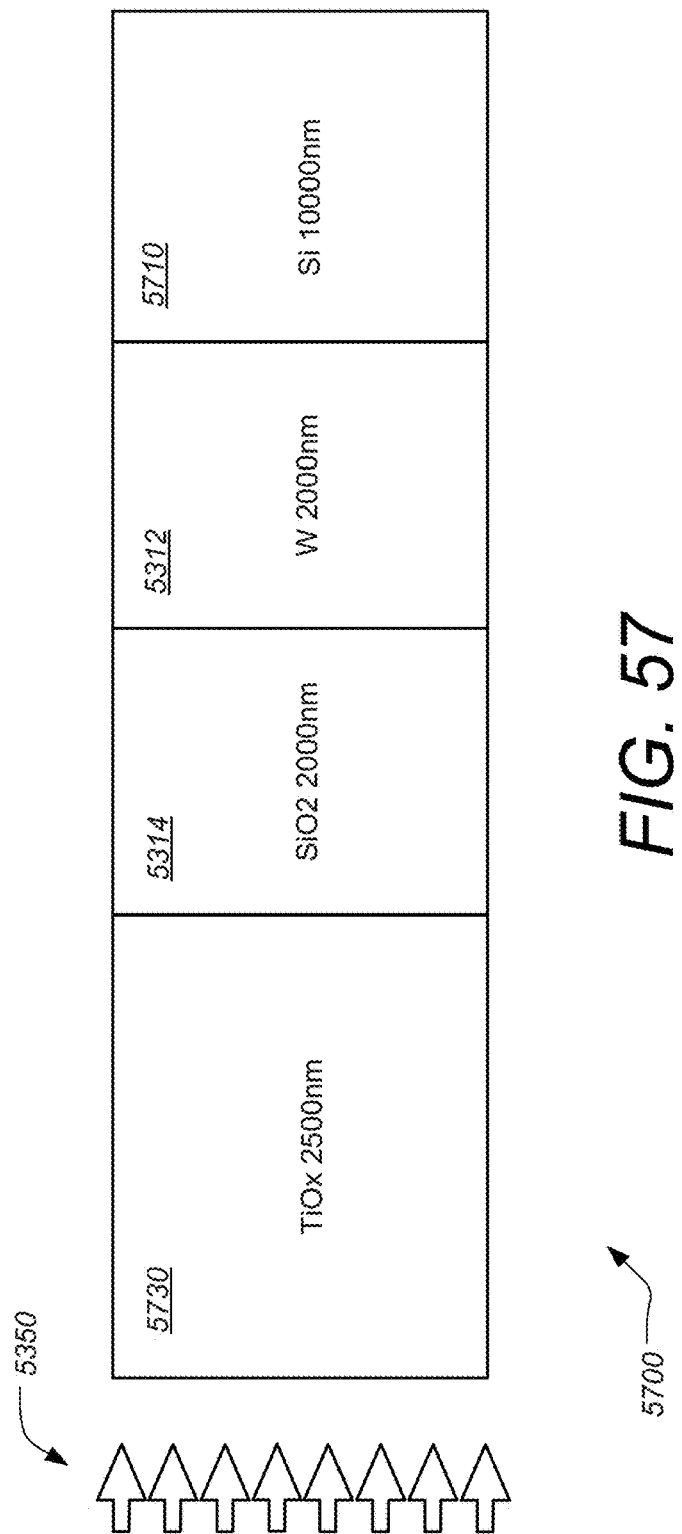
FIG. 57 is a diagram showing a structure of vertically stacked RRAM devices that is simplified for purposes of simulation, according to some other embodiments.
Figure 58A:
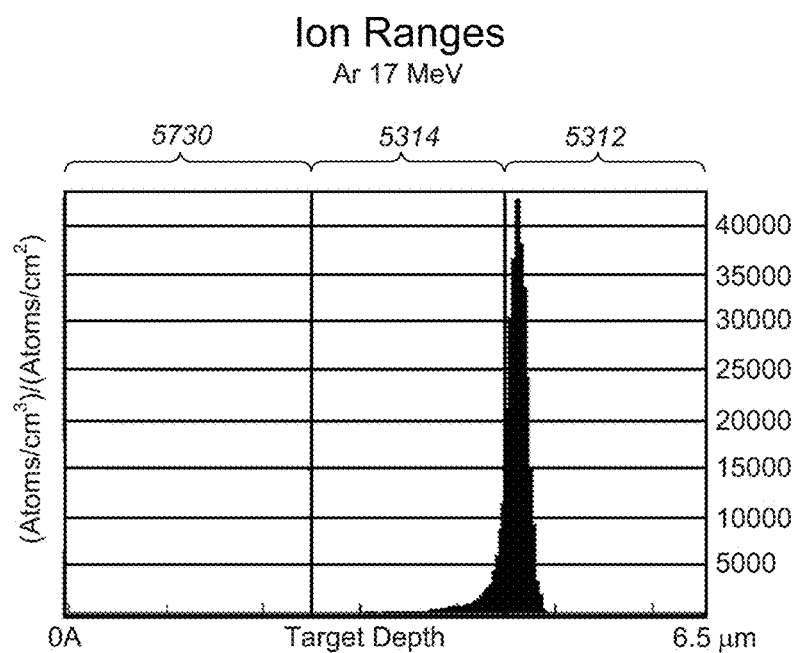
FIGS. 58A-58D are plots illustrating simulation results of Ar and H ions implanted into a structure as shown in FIG. 57 at 17 MeV and 520 KeV respectively, according to some embodiments.
Figure 58B:
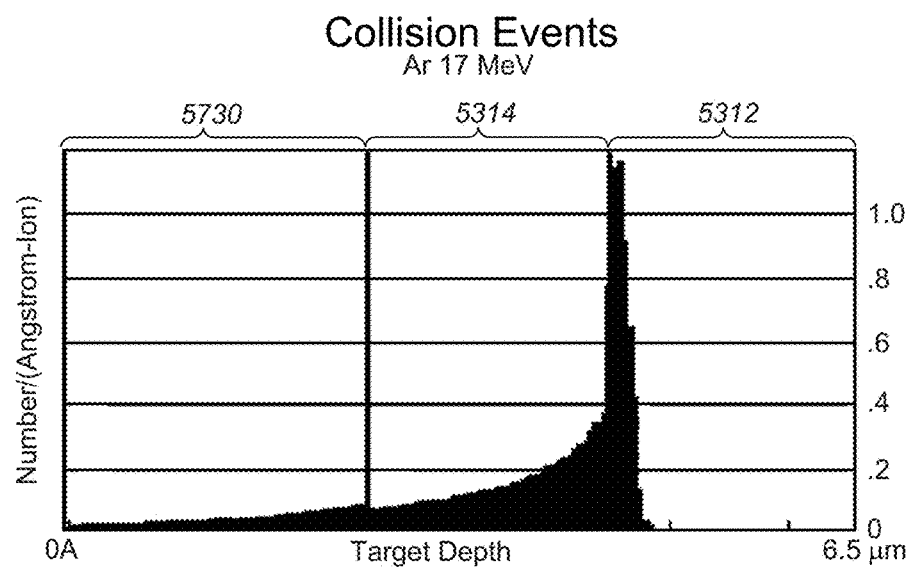
Figure 58C:
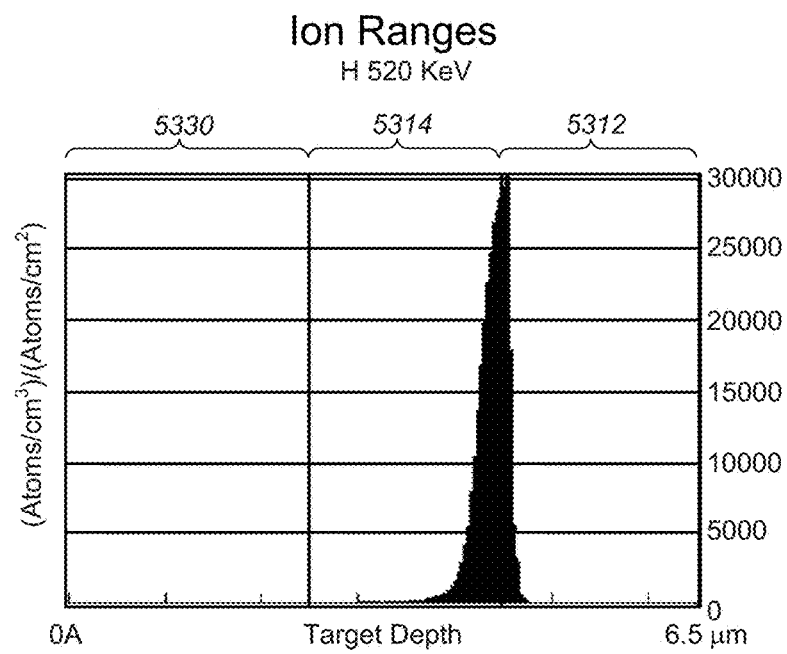
Figure 58D:
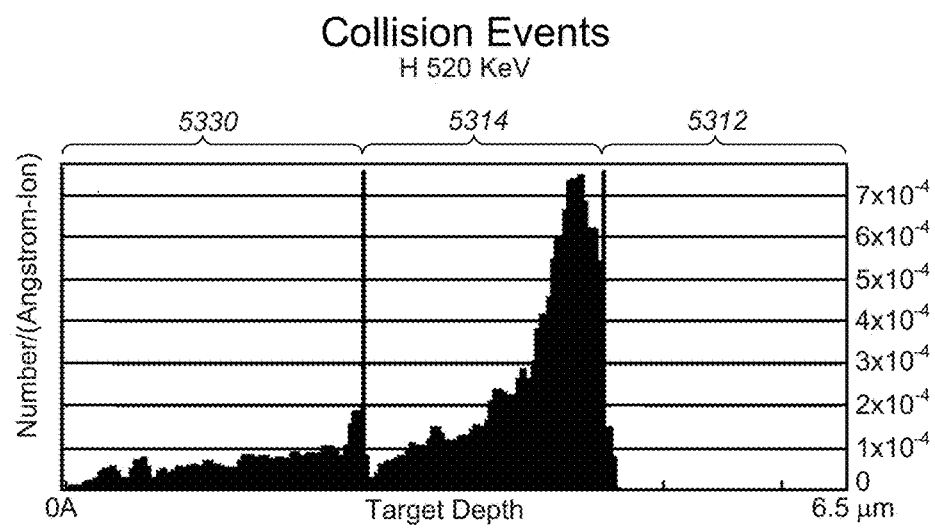

FIG. 57 is a diagram showing structure of vertically stacked RRAM devices that is simplified for purposes of simulation, according to some other embodiments. In this case, the VRRAM structure 5700 includes switching layer 5730 made of 2500 nm of TiOx. Insulation layer 5314 is 2000 nm of $SiO_2$, layer 5312 is 2000 nm of W; and layer 5710 is 10000 nm of Si. The W layer 5312 or similar heavy metal layer is used to stop ions from penetrating into the Si layer 5710 which may contain CMOS circuits and electronics. The W layer 5312 thickness can range from 500 to 2000 nm approximately depending on ion energies. The simulation conditions included Ar ions at 17 MeV and H ions at 520 KeV, which resulted in an ion range of approximately 4500 nm. The ion range peak was placed outside of the switching layer 5730 to maximize uniformity of the vacancy concentration distribution along the length of the switching layer such that the VRRAMs structure has relatively low variability between the RRAMs at different levels.

FIGS. 58A-58D are plots illustrating simulation results of Ar and H ions implanted into a structure as shown in FIG. 57 at 17 MeV and 520 KeV respectively, according to some embodiments. The resulting vacancy concentration distribution along the length of the TiOx switching layer 5730 is better than 40% variation in uniformity for the Ar implant and approximately 30% variation in uniformity for the H implant energy with the likely simulation artifacts removed. The W layer 5312 effectively stops ions from penetrating into the Si layer 5710 which may contain CMOS circuits and electronics for controlling the VRRAM memory stack and other memory functions.

Figure 59:
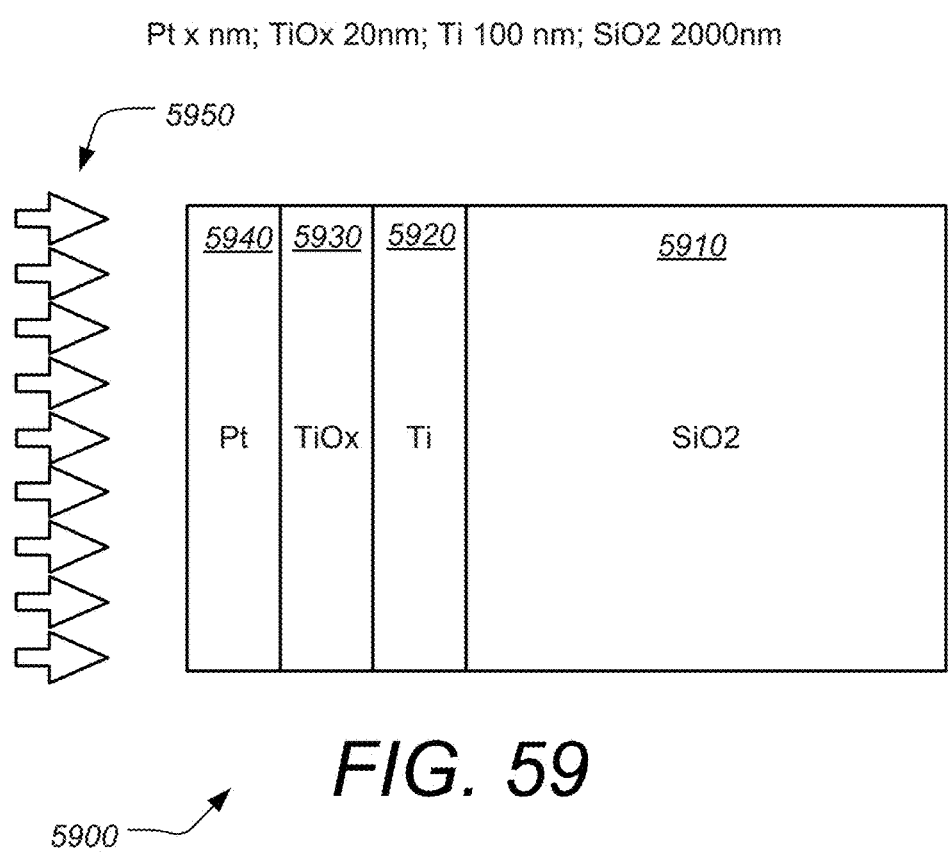
FIG. 59 is a diagram showing structure for RRAM devices used to investigate sensitivity of vacancy concentration in switching layers as a function of top electrode thickness variation due to manufacturing tolerances.

FIG. 59 is a diagram showing structure for RRAM devices this was used to investigate sensitivity of vacancy concentration in switching layers as a function of top electrode thickness variation due to manufacturing. The structure 5900 includes a top electrode 9540 made of Pt which had a variable thickness. For the study, the thickness was varied by 20% from 80, 100, 120 nm. The switching layer 5930 is made of 20 nm of TiOx, the bottom electrode 5920 is made of 100 nm of Ti, the $SiO_2$ layer 5910 is 2000 nm thick. Ar ions were accelerated to an energy of 1600 KeV such that the Ar ion range or peak was outside the switching layer 5930.

Figure 60A:
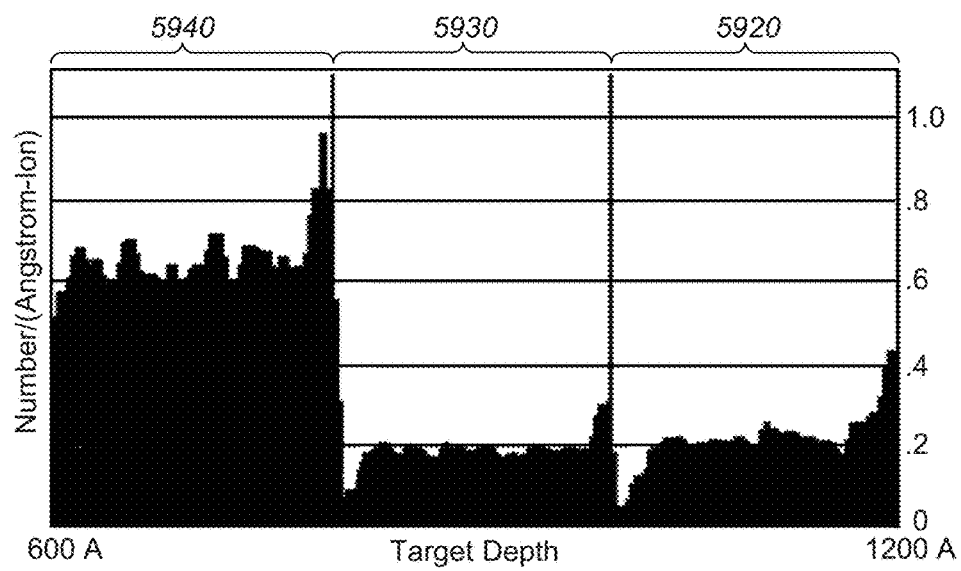
FIGS. 60A-60C are plots illustrating simulation results of Ar ions implanted at 17 1600 KeV into a structure as shown in FIG. 59 having top electrode 5940 thicknesses of 80, 100 and 120 nm, according to some embodiments.
Figure 60B:
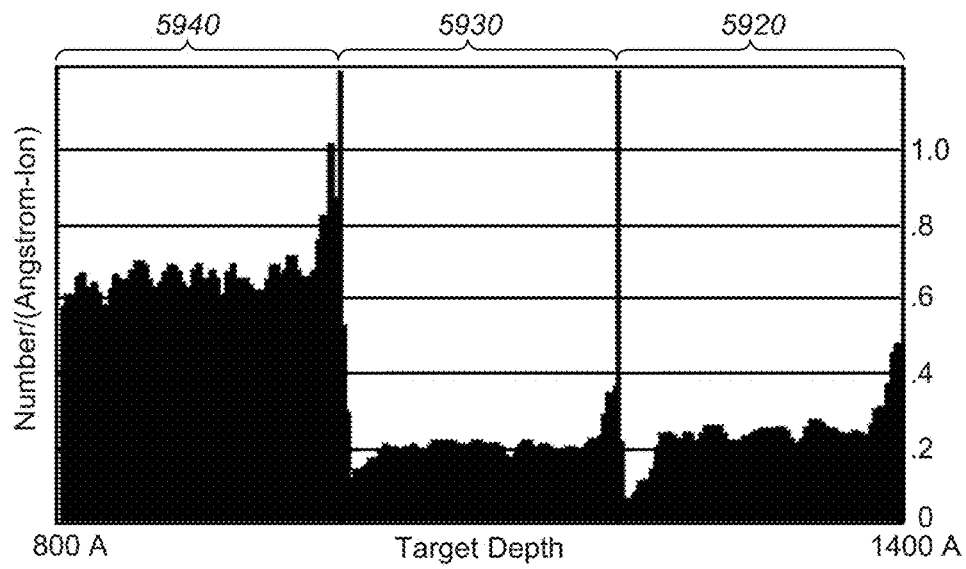
Figure 60C:
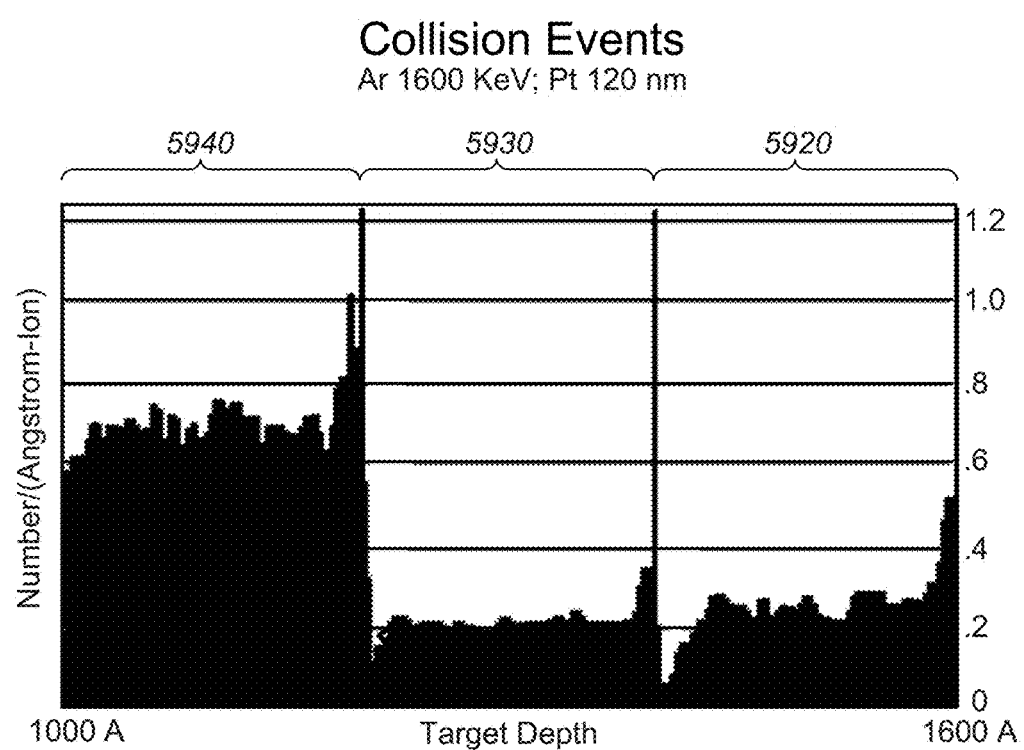

FIGS. 60A-600 are plots illustrating simulation results of Ar ions implanted at 17 1600 KeV into a structure as shown in FIG. 59 having top electrode 5940 thicknesses of 80, 100 and 120 nm, according to some embodiments. In particular, FIGS. 60A, 60B and 60C show the simulation results for the TE (Pt) layer 5940 thickness of 80 nm, 100 nm and 120 nm, respectively. It was found that the variation of the vacancy concentration in the switching layer (5030) due to Pt top electrode (5940) thickness variation was better than 5%. Within each switching layer the vacancy concentration variation was found to be better than 3% with the likely simulation artifacts removed.

Figure 61A:
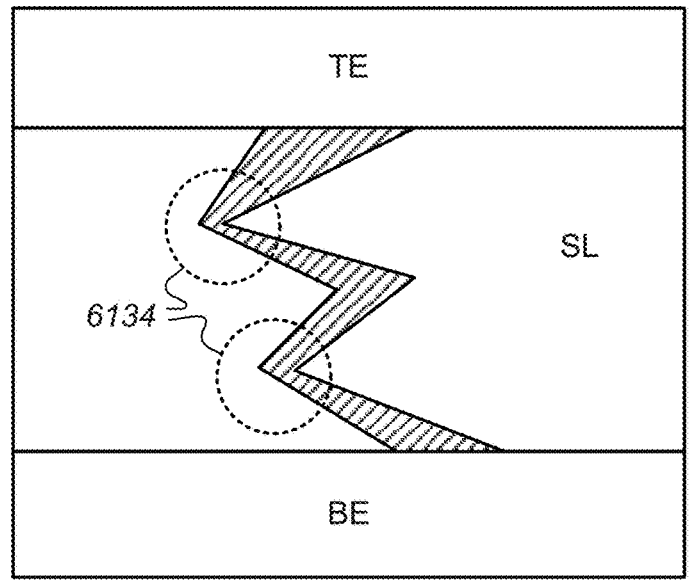
FIGS. 61A and 61B illustrate constrictions in vacancy filaments.
Figure 61B:
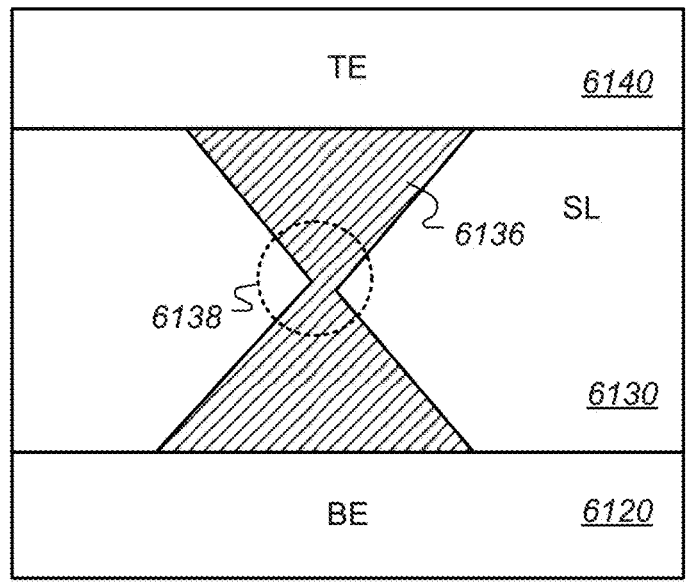

FIGS. 61A and 61B are diagrams illustrating an example of constrictions in vacancy filaments. They are adapted from Chen et al., "Understanding of the Endurance Failure in Scaled HfO2-based 1T1R RRAM through Vacancy Mobility Degradation" IEDM12-482, 2012, which is incorporated herein by reference. That non-uniform distribution of oxygen vacancies in the case of transition metal oxide switching layers can result in constrictions in the vacancy filament. The constrictions 6134 and 6138 can result in degradation of the vacancy mobility leading to degradation of the RRAM. The degradation of the vacancy mobility results in higher resistivity and consequently higher joule heating that can further anneal the defect reducing the number of vacancies resulting in the LRS becoming more resistive. The formation of conductive filaments with oxygen vacancies, metallic defects, oxygen ions, neutralized oxygen vacancies is discussed in Syu et al. "Redox Reaction Switching Mechanism in RRAM Device With Pt/CoSiOTiN Structure," IEEE ELECTRON DEVICE LETTERS, VOL. 32, NO. 4, APRIL 2011 (hereinafter "Syu 2011"), which is incorporated herein by reference.

Non-uniform distribution in the direction of current flow across the switching layer between the electrodes in horizontal and vertical RRAMs can result in constrictions in the filaments which lead to degradation in vacancy mobility. This degradation in mobility of the vacancies then result in the degradation of the LRS which causes degradation in reliability of the RRAM. In addition, the variation of vacancy concentration in the non-uniform distribution of vacancies due to forming process results in variability of all the switching parameters of the RRAM, such as HRS, LRS, Vset and Vreset and V forming. The current associated with Vread (the voltage at which the memory is interrogated weather in the HRS or LRS) can also vary within a single RRAM and/or other RRAM devices on the memory cell which can contain millions to trillions of RRAM cells. This variability is highly undesirable. The filaments formed by a forming process is haphazard and follow a path connecting local defects such as grain boundaries and defects in deposition of the switching layer. See, e.g. Raghavan et al., "Variability model for forming process in oxygen vacancy modulated high-j based resistive switching memory devices," Microelectronics Reliability 54 (2014) 2266-2271, which is incorporated by reference herein. The haphazard length of the filament and the concentration of vacancies which can affect mobility of the vacancies and add to the variability of voltages and current of the RRAM, which in turn affects HRS, LRS, Vset, Vreset, Vread, Vforming. In addition, the variation in length and mobility of the vacancies can also affect the speed of the device, for example the switching time between the memory states of HRS and LRS. Kinks in the filaments where there may be constrictions in the vacancy concentration can result in lower mobility of the vacancies and therefore longer switching time. For a switching layer thickness of 2-20 nm, mobility of approximately $10^2$ cm$^2$/V-s with an applied electric field of 1 V/cm result in a switching time of 2-20 nS (nanoseconds). The filament can be partially non-conducting, resulting in a HRS. In such cases, the non-conducting segment can be 2-4 nm within a switching layer thickness of 20 nm. The mobility can be 10 cm$^2$/V-s with a switching time of tens of nanoseconds. Mobility of the vacancies can also be approximately $10^{-2}$ cm$^2$/V-s or lower which results in microsecond switching times.

Figure 62A:
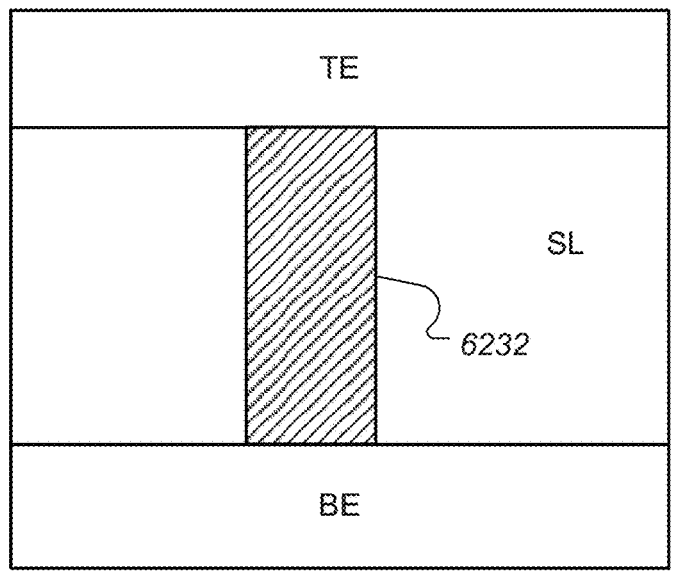
FIG. 62A is a diagram illustrating a uniform distribution of the vacancies within the switching layer, according to many of the embodiments described herein.

FIG. 62A is a diagram illustrating a uniform distribution of the vacancies within the switching layer, according to many of the embodiments described herein. The uniform vacancy distribution 6232 of FIG. 62A can be achieved using, for example, the techniques which were simulated and discussed with respect to FIGS. 34, 35A-D, 36A-D, 37A-D and 38A-D.

Figure 62B:
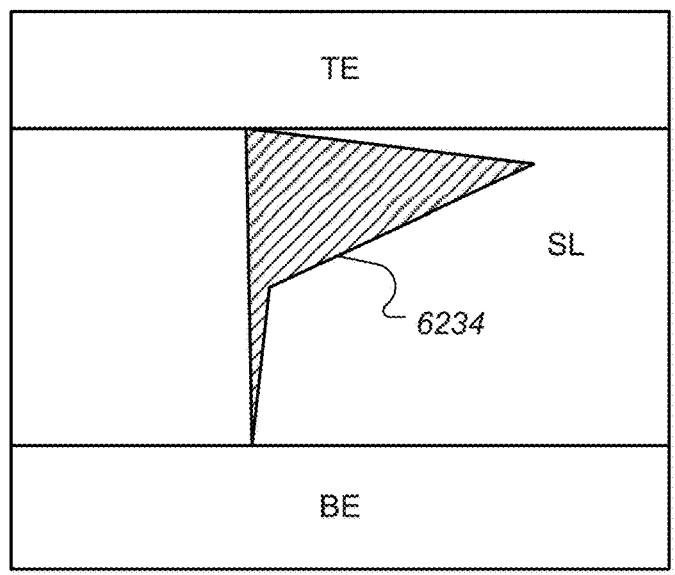
FIG. 62B is a diagram illustrating vacancy distribution resulting from a known technique of ion implanting prior to the formation of the top electrode.

FIG. 62B is a diagram illustrating vacancy distribution resulting from the known technique of ion implanting prior to the formation of the top electrode. The distribution of vacancies 6234 in FIG. 62B can result from known ion implantation techniques such as illustrated FIGS. 33A-D. The vacancies 6234 are non-uniform within the switching layer in the direction of the current path with constrictions that can result in degradation of the vacancy mobility and eventually resulting in the degradation of the reliability of the RRAM. The constriction in the number of vacancies can also result in lower vacancy mobility and therefore can adversely affect the switching time of the RRAM. In addition, there are cases in the known ion implantation schemes where the vacancies and/or defects due to ion implant do not extend all the way to the bottom electrode. In such cases, a forming process is necessary to form the filament. From the simulation results illustrated in FIG. 33A-D it can be seen that the vacancy ranges from 0-2.4 in one case. To convert from the vertical scale to vacancies/cm$^3$, (0-2.4)×dose/angstrom, for example a dose of 1×10$^{12}$ ions/cm$^2$ gives a vacancy concentration from 0 to 2.4×10$^{20}$/cm$^3$ where it is assumed each ion collision give rise to one vacancy. Often this is not the case and every 100 ion collisions result in one vacancy.

Using techniques described herein, variations in the vacancy distribution can be kept to less than 80% and in some cases to less than 20%. Vacancy concentration can be in the range of 2×10$^{17}$/cm$^3$ to 5×10$^{22}$/cm$^3$. In certain cases, a range of 5×10$^{21}$/cm$^3$ to 5×10$^{22}$/cm$^3$ can be achieved. In another case for lower current, 5×10$^{20}$/cm$^3$ to 5×10$^{21}$/cm$^3$ can be achieved. For very low current operation, in the micro amperes and/or sub microamperes range, 5×10$^{19}$/cm$^3$ to 5×10$^{20}$/cm$^3$ can be achieved. In the high nanoamperes range for ultra-low energy RRAM, vacancy concentration can be in the range 1×10$^{17}$/cm$^3$ to 5×10$^{19}$/cm$^3$.

The lower the number of vacancies per unit volume, the higher the voltage. Vacancies can be approximately compared to "holes" in semiconductors, such that the conductivity of a filament is determined by the number of vacancies and the mobility. Thus, higher defect concentrations lead to higher mobility. Note that this is the opposite of conventional semiconductor fabrication techniques where defects are kept low for high mobility. When the defect concentration is large, it is easier for ions and/or electrons to hop from defect to defect. As discussed in Syu 2011, there are oxygen vacancies, oxygen ions, electrons. Non-conducting metallic defects and neutralized vacancies also exist. As can be seen in FIG. 62A, a continuous distribution of vacancy concentration 6232 with concentration variations of less than 80% within the switching layer can be achieved. Variability of the RRAM parameters such as HRS, LRS, Vset, Vreset and Vread are reduced since the vacancy concentration and mobility are uniform and have no constrictions. In some cases, the vacancy concentration can be better than 60% in variation within the switching layer, in some cases better than 40%, in some cases better than 20% and in some cases better than 10%. See FIGS. 35A-D, 36A-D, 37A-D and 38A-D for single switching layer ion implants. The deep heavy ion implants produce the most uniform vacancy concentration within the switching layer. Uniform concentration of vacancies in the switching layer can result in uniform vacancy mobility which not only reduces the variability of the RRAM switching parameters such as HRS, LHS, Vset, Vreset, Vread, but also reduces switching time and improves reliability during cycling between the memory states of HRS and LRS. With vacancy concentrations of 20% or better, uniformity of Vset and Vreset, HRS and LRS, Vread and switching time can be expected to have variability of less than approximately 10% within a single device. With uniform ion implantation and with variations of less than 10% in implant variations of energy and dose, RRAM cell-to-cell variations should also approximately be better than 10%. In some cases RRAM parameter variability can be better than 5% within a single RRAM and cell-to-cell RRAM. In certain cases an RRAM parameter variability of better than 2% can be achieved.

FIGS. 63A-63D are diagrams showing a simplified sequence of processes for manufacturing a portion of RRAM devices, according to some embodiments. In FIG. 63A ions are implanted through the top electrode (TE) 6340. Implant energies are sufficient to penetrate TE 6340 and into the switching layer (SL) or layers 6330 and into the bottom electrode (BE) 6320. Ions can be inert such as Ar, He, Xe, for example. For transition metal switching layer(s) (such as TiOx, HfOx, TaOx, ZrOx, WOx) O ions or transition metal ions can also be used such as Ti, Ni, Hf, W, Zr, Ta. H and N can also be used to generate defects, vacancies, or ions to provide a path for electrical conduction along filaments. Electrons hopping, tunneling, space charge, along the defects/vacancies provides a low resistance state (LRS) and when the vacancies have a gap, provide a high resistance state (HRS) of the RRAM. When ions are implanted through the top electrode, some of the top electrode ions are knocked into the switching layer, forming a more conductive layer at the TE-SL interface. In FIG. 63B, the TE is removed or partially removed typically by etching. In FIG. 63C, a nonlinear layer or layers 6360 is deposited on the SL 6330 to provide nonlinearity in the current voltage characteristics of the RRAM which is useful to minimize sneak current in crossbar RRAM architecture or in any array of RRAM used for memory such as vertical RRAM (VRRAM). The nonlinear layer 6360 can be a diode layer of p and n doping for example in amorphous Si, or a layer of semiconductor material where Schottky barrier junctions can be created with contact to metal or almost metal surfaces. The nonlinear layer 6330 can be a tunnel layer, can consist of multiple layers and/or combinations of diode and tunnel layers with Schottky junctions, metal oxide semiconductor junctions and/or tunnel junctions. In FIG. 63D, the TE 6342 is re-deposited on the diode layer 6360 to complete the RRAM cell.

The role of knocked on metal ions into the SL interface is important to allow a metal-like contact or a layer of higher conductivity next to the diode layer. This could be important, for example, in creating a metal-like interface between the SL and a semiconductor junction such as a Schottky barrier junction and/or when the diode layer is doped with p and n dopants. The metal-like interface at the SL can provide a low resistance contact for example. The TE can be thin (on the order of 2-50 nm for example) or thicker TE of 100-200 nm. The metal-like interface formed at the TE-SL interface can then provide a good semiconductor contact with subsequent non-linear layers such as diode layer. In certain cases, the TE 6340 can be on the order of one nm thick, in which case, after ion implant the TE does not need to be removed in the areas in contact with the SL. The diode layer and/or other non-linear layers can be deposited onto the SL forming Schottly barrier junctions and/or almost ohmic or ohmic junctions depending on the doping of the diode layer or semiconductor layer. Note that the diode layer is a semiconductor layer but with p and n doping, whereas a semiconductor layer can be just doped p or n).

Figure 64A:
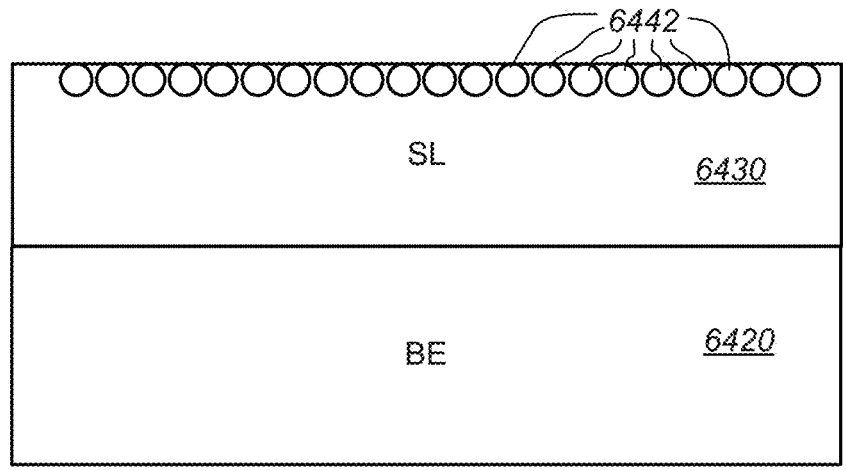
FIG. 64A-64B are diagrams illustrating ions knocked into an SL layer by ion implantation through a TE layer, according to some embodiments.
Figure 64B:
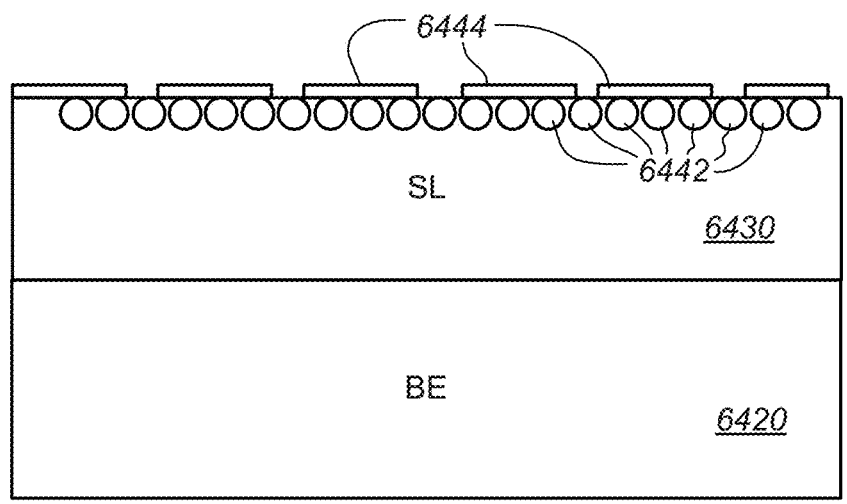

FIG. 64A-64B are diagrams illustrating ions knocked into an SL layer by ion implantation through a TE layer, according to some embodiments. FIG. 64A shows the knocked in ions 6442 in the interface of SL layer 6430 after the TE has been removed. FIG. 64B shows a residual TE 6444 remaining, either by partial removal and or by having a very thin TE prior to implant. For example, the TE layer can be approximately one nanometer, and the TE over the SL is not removed after ion implant. The knocked in ions 6442 are from the TE due to ion implantation through the TE. For example if the TE is composed of W, the knocked in ions will be W ions in the TE-SL interface with some W ions in the SL layer. This can also be thought of in a simplistic way as similar to alloying in semiconductor ohmic contacts where metal ions are driven into the semiconductor by heat and other chemical reactions, whereas in this case, ion implanted through the TE, for example Ar ions implanted through W TE physically knock the W ions into the SL in a ballistic fashion. The Ar ions implanted into the SL 6430 and BE 6420 generate defects and vacancies that are conducive for filament formation, for species of ions such as oxygen, vacancies, and electrons to diffuse, drift, or hop in an electric field. The diffusion, drifting and/or hopping can occur with joule heating due to current flow since power dissipated is proportional to the square of the current times the resistance.

Figure 65A:
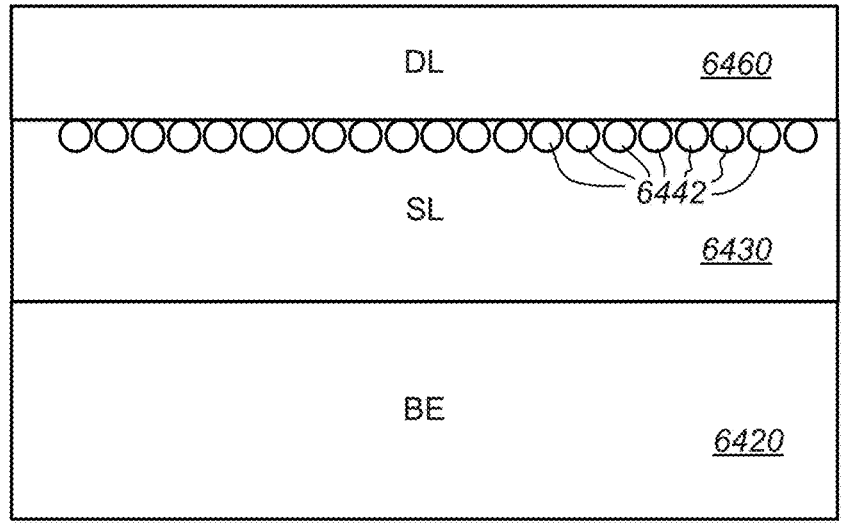
FIGS. 65A-65B are diagrams illustrating ions knocked into an SL layer with a diode, semiconductor, and/or tunnel layer deposited, according to some embodiments.
Figure 65B:
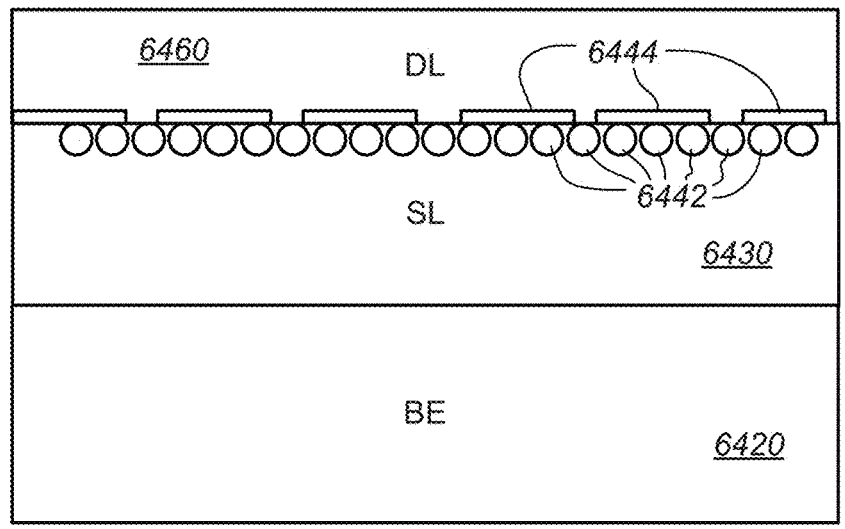

FIGS. 65A-65B are diagrams illustrating ions knocked into an SL layer with a diode, semiconductor, and/or tunnel layer deposited, according to some embodiments. FIG. 65A shows most of the TE removed and with the diode layer 6460 in contact with the SL 6430. In FIG. 65B, a residual TE 6444 is left, approximately one nm, and the DL 6460 is deposited on the residual TE and knocked in metal ions 6442 in the SL 6430. In certain cases, additional metal ions and or oxygen ions can be implanted through the residual TE 6444 prior to deposited the diode or semiconductor layer 6460.

Figure 66A:
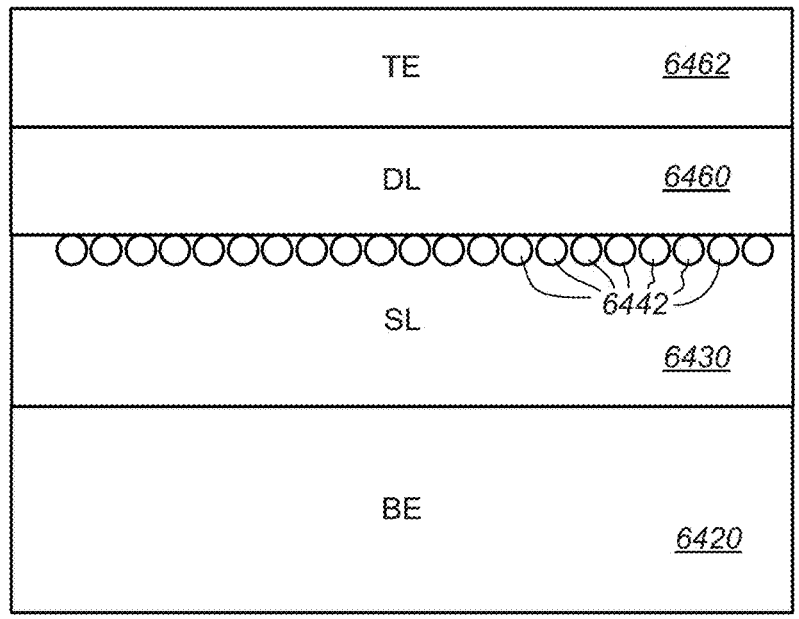
FIGS. 66A-66B are diagrams illustrating ions knocked into an SL layer with a diode, semiconductor, and/or tunnel layer, and TE deposited, according to some embodiments.
Figure 66B:
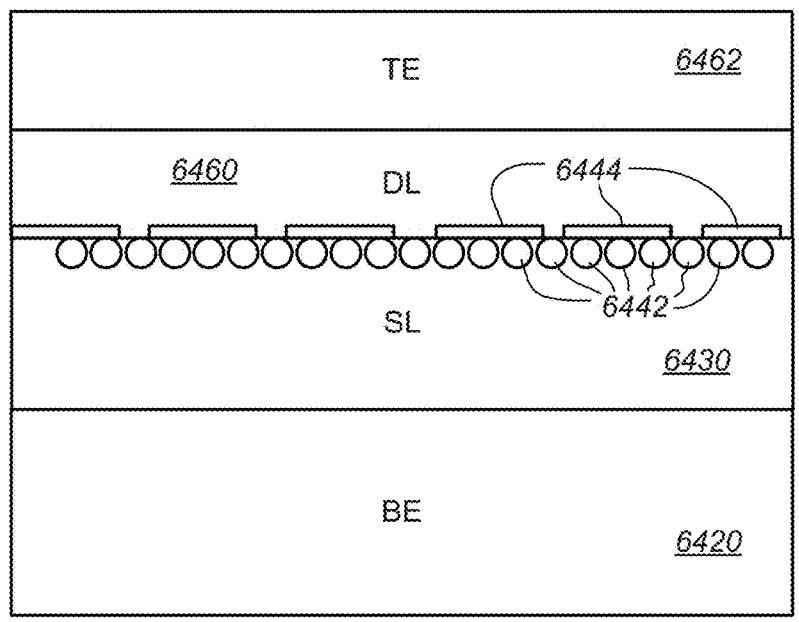

FIGS. 66A-66B are diagrams illustrating ions knocked into an SL layer with a diode, semiconductor, and/or tunnel layer, and TE deposited, according to some embodiments. As in the cases of FIGS. 64A-B and 65A-B, FIG. 66A shows the knocked in ions 6442 in the interface of SL layer 6430 after the TE has been removed, while FIG. 66B shows a residual TE 6444 remaining. In each case, the top electrode 6462 is deposited on the diode and/or semiconductor layer 6460. The diode and/or semiconductor layer 6460 can give a non-linear current voltage characteristics for the RRAM which is beneficial in reducing sneak current between adjacent RRAM cells in a high density array architecture, such as crossbar and 3D VRRAM stacks of RRAM cells. The metal TE 6462 can form a Schottky junction with the diode/semiconductor layer 6460. The metal-like interface between the SL 6430 and DL 6460 can have knocked in metal ions and the residual TE metal can also form a Schottky contact, MOS contact and/or ohmic contact, depending on the doping level of the diode/semiconductor layer.

Figure 67:
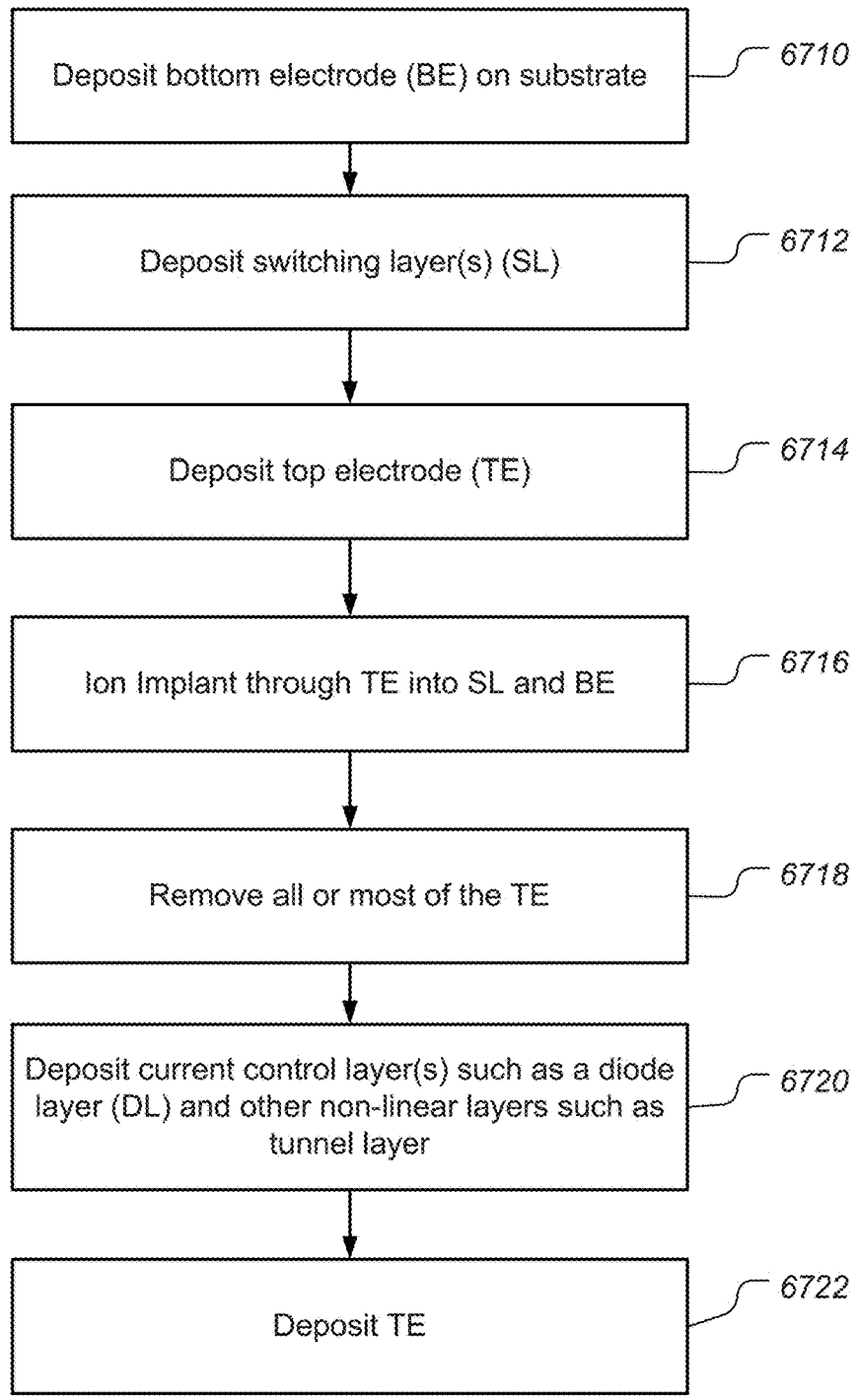
FIG. 67 is a simplified flow chart of the process of implanting through a TE, according to some embodiments.

FIG. 67 is a simple flow chart of the process of implanting through a TE, according to some embodiments. In block 6710 the BE is deposited on the substrate. In Block 6712 the SL(s) are deposited. In block 6714 a first TE is deposited. In block 6716, ions are implanted through the TE. In block 6718, depending on the TE thickness, the TE can either be left in place or it can be removed wholly or in part. In block 6720 the diode/semiconductor layers are deposited. In block 6722 the RRAM cell is completed with the deposition (or re-deposition) of the TE. The metal-like interface between the SL and the DL separates the two functions, the SL providing creation and annihilation of vacancies to generate HRS and LRS and the diode/semiconductor layer(s) for giving a nonlinear current voltage characteristic of the RRAM cell.

According to some embodiments, the knocked-in ion techniques described can be applied to vertical RRAMs. In a VRRAM such as shown in FIG. 53, the vertical electrode 5320 can initially be a thin conformal layer such as W, TiN, Mo, Al, Ni to name a few that can be deposited by sputtering, atomic layer deposition for example. Ion implantation is then performed at a angle off normal with the wafer rotating for example, that can knock in metal ions into the interface of the SL 5330. In the case of very thin initial vertical electrode 5320, for example approximately one nm, the electrode can be left in place while a diode/semiconductor layer are deposited conformal to the SL 5330 and followed by a full version of the electrode 5320.

This patent application refers to certain theories in explaining the nature and operation of devices, but it should be clear that such theories are based on current understanding and do not affect the actual operation of the disclosed devices even if future developments prove the theories incorrect. This patent specification also refers to numerical ranges of parameters, and it should be understood that insubstantial departures from such ranges are still within the spirit of the disclosed advancements.

Although the foregoing has been described in some detail for purposes of clarity, it will be apparent that certain changes and modifications may be made without departing from the principles thereof. It should be noted that there are many alternative ways of implementing both the processes and apparatuses described herein. Accordingly, the present embodiments are to be considered as illustrative and not restrictive, and the body of work described herein is not to be limited to the details given herein, which may be modified within the scope and equivalents of the appended claims.

What it claimed is:
1. A resistive random-access memory device comprising:
   a first electrode;
   a second electrode; and a switching region that is between the first and second electrodes and comprises one or more enhanced mobility pathway structures that extend at respective locations in the switching region and are configured to provide enhanced mobility of charged species and have electrical resistances that vary with a switching voltage applied between the first and second electrodes across the one or more pathway structures;

wherein said enhanced mobility pathway structures comprise intentional damage to the switching region caused by electromagnetic irradiation directed into the switching region; and wherein said switching region has a thickness in a direction from one of the electrodes to the other, and said damage to the switching region is substantially uniformly distributed over the thickness of the switching region.

2. The resistive memory device of claim 1 wherein the electromagnetic irradiation includes Gamma or X-rays having energy ranging from about 3 KeV to about 100 KeV.

3. The resistive memory device of claim 1 wherein the electromagnetic irradiation includes X-rays having energy ranging from about 20 KeV to about 30 KeV.

4. The resistive memory device of claim 1 wherein the electromagnetic irradiation includes X-rays having energy ranging from about 25 KeV to about 27 KeV.

5. The resistive memory device of claim 1 further comprising a plurality of three or more switching layers and electrodes stacked in a direction of the irradiation such that the irradiation has passed through the entire stack.

6. The resistive memory device of claim 1 further including an array of laterally spaced stacks each comprising plural switching regions each flanked by respective first and second electrodes, wherein the stacks are interconnected by electrical lines and form an integrated circuit memory structure.

7. The resistive memory device of claim 1 further comprising a radiation barrier layer formed below the first electrode in the direction of said irradiation, which radiation barrier layer is configured to protect regions below said barrier layer from exposure to the electromagnetic irradiation.

8. The resistive memory device of claim 1 including at least one of (i) a barrier layer formed between the switching region and the first electrode and functionally disrupted by said electromagnetic irradiation and (ii) a barrier layer formed between the switching region and the second electrode and functionally disrupted by said electromagnetic irradiation.

9. The resistive memory device of claim 1 including an underlying substrate having a primary planar surface, wherein a first planar interface between the first electrode and switching region and a second planar interface between the switching region and the second electrode are approximately normal to the primary planar upper surface of the underlying substrate.

10. A resistive random-access memory device comprising:
a first electrode;
a second electrode; and
a switching region that is between the first and second electrodes and comprises one or more enhanced mobility pathway structures that extend at respective locations in the switching region and are configured to provide enhanced mobility of charged species and have electrical resistances that vary with a switching voltage applied between the first and second electrodes across the one or more pathway structures;

wherein said switching region has a thickness in a direction from the first to the second electrode, and said enhanced mobility pathway structures comprise substantially uniform damage over the thickness of the switching region caused by electromagnetic irradiation directed into the switching region.

11. The resistive memory device of claim 10 wherein the electromagnetic irradiation includes radiation of a type selected from a group consisting of: x-rays, gamma rays, UV light, visible light, and IR light.

12. The resistive memory device of claim 10 wherein the electromagnetic irradiation includes Gamma or X-rays having energy ranging from about 3 KeV to about 100 KeV.

13. The resistive memory device of claim 12 wherein the electromagnetic irradiation includes X-rays having energy ranging from about 20 KeV to about 30 KeV.

14. The resistive memory device of claim 13 wherein the electromagnetic irradiation includes X-rays having energy ranging from about 25 KeV to about 27 KeV.

15. The resistive memory device of claim 10 wherein said damage is caused in situ by the irradiation after passage thereof through at least one of the first and second electrodes and the switching layer.

16. The resistive memory device of claim 15 further comprising a plurality of switching layers and electrodes formed in a stack above said second electrode prior to the electromagnetic irradiation.

17. The resistive memory device of claim 16 wherein said damage is formed in at least three switching layers electromagnetically irradiated simultaneously.

18. The resistive memory device of claim 10 further comprising a radiation barrier layer formed below the first electrode in the direction of said irradiation, which radiation barrier layer is configured to protect regions below said barrier layer from exposure to the electromagnetic irradiation.

19. The resistive memory device of claim 18 wherein the radiation barrier layer is made of a material selected from a group consisting of W, Ta, Bi, Au and Pb.

20. The resistive memory device of claim 10 including at least one of (i) a barrier layer formed between the switching region and the first electrode and functionally disrupted by said electromagnetic irradiation and (ii) a barrier layer formed between the switching region and the second electrode and functionally disrupted by said electromagnetic irradiation.

21. The resistive memory device of claim 10 including an underlying substrate having a primary planar surface, wherein a first planar interface between the first electrode and switching region and a second planar interface between the switching region and the second electrode are approximately normal to the primary planar upper surface of the underlying substrate.

22. A resistive random-access memory device comprising:
a first electrode;
a second electrode; and
a switching region that is between the first and second electrodes and comprises one or more enhanced mobility pathway structures formed in the course of fabricating the device that extend at respective locations in the switching region and are configured to provide enhanced mobility of charged species and have respective electrical resistances that vary with a switching voltage applied between the first and second electrodes across the one or more pathway structures;
wherein said enhanced mobility pathway structures comprise substantially uniform damage in the switching region caused by electromagnetic irradiation having energy ranging from about 3 KeV to about 100 KeV directed into the switching region.

* * * * *